(12) United States Patent
Yamazaki et al.

(10) Patent No.: US 10,217,796 B2
(45) Date of Patent: *Feb. 26, 2019

(54) SEMICONDUCTOR DEVICE COMPRISING AN OXIDE LAYER AND AN OXIDE SEMICONDUCTOR LAYER

(71) Applicant: Semiconductor Energy Laboratory Co., Ltd., Atsugi-shi, Kanagawa-ken (JP)

(72) Inventors: Shunpei Yamazaki, Tokyo (JP); Kenichi Okazaki, Tochigi (JP); Mitsuo Mashiyama, Tochigi (JP); Takuya Handa, Tochigi (JP); Masahiro Watanabe, Tochigi (JP); Hajime Tokunaga, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/594,813

(22) Filed: May 15, 2017

(65) Prior Publication Data

US 2017/0250204 A1     Aug. 31, 2017

Related U.S. Application Data

(63) Continuation of application No. 14/047,209, filed on Oct. 7, 2013, now Pat. No. 9,660,093.

(30) Foreign Application Priority Data

Oct. 17, 2012  (JP) ................. 2012-229597

(51) Int. Cl.
*H01L 27/12* (2006.01)
*H01L 27/24* (2006.01)
(Continued)

(52) U.S. Cl.
CPC ........ *H01L 27/2418* (2013.01); *G02F 1/1368* (2013.01); *H01L 21/70* (2013.01);
(Continued)

(58) Field of Classification Search
CPC combination set(s) only.
See application file for complete search history.

(56) References Cited

U.S. PATENT DOCUMENTS 5,528,032 A    6/1996  Uchiyama
5,731,856 A    3/1998  Kim et al.
(Continued)

FOREIGN PATENT DOCUMENTS

CN    101794820 A    8/2010
CN    102403361 A    4/2012
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Hoai V Pham
(74) *Attorney, Agent, or Firm* — Fish & Richardson P.C.

(57) ABSTRACT

Stable electrical characteristics of a transistor including an oxide semiconductor layer are achieved. A highly reliable semiconductor device including the transistor is provided. The semiconductor device includes a multilayer film formed of an oxide layer and an oxide semiconductor layer, a gate insulating film in contact with the oxide layer, and a gate electrode overlapping with the multilayer film with the gate insulating film interposed therebetween. The oxide layer contains a common element to the oxide semiconductor layer and has a large energy gap than the oxide semicon- (Continued)

ductor layer. The composition between the oxide layer and the oxide semiconductor layer gradually changes.

21 Claims, 44 Drawing Sheets

(51) Int. Cl.
| H01L 29/786 | (2006.01) |
| G02F 1/1368 | (2006.01) |
| H01L 21/70 | (2006.01) |
| H01L 27/105 | (2006.01) |
| H01L 29/24 | (2006.01) |
| H01L 51/50 | (2006.01) |

(52) U.S. Cl.
CPC ...... *H01L 27/1052* (2013.01); *H01L 27/1225* (2013.01); *H01L 29/24* (2013.01); *H01L 29/7869* (2013.01); *H01L 29/78648* (2013.01); *H01L 29/78693* (2013.01); *H01L 51/50* (2013.01)

(56) References Cited

U.S. PATENT DOCUMENTS

| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,910,490 | B2 | 3/2011 | Akimoto et al. |
| 7,923,722 | B2 | 4/2011 | Ryu et al. |
| 7,932,521 | B2 | 4/2011 | Akimoto et al. |
| 7,994,500 | B2 | 8/2011 | Kim et al. |
| 8,058,645 | B2 | 11/2011 | Jeong et al. |
| 8,143,678 | B2 | 3/2012 | Kim et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,237,166 | B2 | 8/2012 | Kumomi et al. |
| 8,274,077 | B2 | 9/2012 | Akimoto et al. |
| 8,274,078 | B2 | 9/2012 | Itagaki et al. |
| 8,319,217 | B2 | 11/2012 | Kim et al. |
| 8,431,927 | B2 | 4/2013 | Kim et al. |
| 8,471,256 | B2 | 6/2013 | Yamazaki et al. |
| 8,558,323 | B2 | 10/2013 | Kim et al. |
| 8,692,252 | B2 | 4/2014 | Takata et al. |
| 8,779,478 | B2 | 7/2014 | Moriguchi et al. |
| 8,901,557 | B2 | 12/2014 | Yamazaki |
| 8,952,381 | B2 | 2/2015 | Yamazaki |
| 9,130,049 | B2 | 9/2015 | Sano et al. |
| 9,583,637 | B2 | 2/2017 | Sano et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308797 | A1 | 12/2008 | Akimoto et al. |
| 2008/0308804 | A1 | 12/2008 | Akimoto et al. |
| 2008/0308806 | A1 | 12/2008 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0179199 | A1 | 7/2009 | Sano et al. |
| 2009/0239335 | A1 | 9/2009 | Akimoto et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148170 | A1 | 6/2010 | Ueda et al. |
| 2010/0181565 | A1 | 7/2010 | Sakata et al. |

(56) References Cited

U.S. PATENT DOCUMENTS

| | | | |
|---|---|---|---|
| 2010/0224873 A1 | 9/2010 | Sakata et al. | |
| 2010/0295041 A1 | 11/2010 | Kumomi et al. | |
| 2010/0320458 A1 | 12/2010 | Umeda et al. | |
| 2010/0320459 A1 | 12/2010 | Umeda et al. | |
| 2011/0127524 A1 | 6/2011 | Yamazaki et al. | |
| 2011/0140096 A1 | 6/2011 | Kim et al. | |
| 2011/0140100 A1* | 6/2011 | Takata | H01L 29/7869 257/43 |
| 2011/0175646 A1 | 7/2011 | Takemura et al. | |
| 2011/0193083 A1 | 8/2011 | Kim et al. | |
| 2011/0215328 A1 | 9/2011 | Morosawa et al. | |
| 2011/0240987 A1* | 10/2011 | Lee | H01L 29/78648 257/43 |
| 2011/0240991 A1 | 10/2011 | Yamazaki | |
| 2011/0284845 A1 | 11/2011 | Endo et al. | |
| 2011/0284846 A1 | 11/2011 | Endo et al. | |
| 2011/0309411 A1 | 12/2011 | Takemura | |
| 2012/0032730 A1 | 2/2012 | Koyama | |
| 2012/0061662 A1 | 3/2012 | Yamazaki et al. | |
| 2012/0119205 A1 | 5/2012 | Taniguchi et al. | |
| 2012/0138922 A1 | 6/2012 | Yamazaki et al. | |
| 2012/0223305 A1 | 9/2012 | Sato et al. | |
| 2012/0292610 A1* | 11/2012 | Wang | H01L 29/42384 257/43 |
| 2013/0099229 A1 | 4/2013 | Wakana et al. | |
| 2013/0099237 A1 | 4/2013 | Sasaki et al. | |
| 2013/0153892 A1 | 6/2013 | Sasaki et al. | |
| 2013/0181218 A1 | 7/2013 | Maeda et al. | |
| 2013/0228775 A1 | 9/2013 | Noda et al. | |
| 2013/0248858 A1* | 9/2013 | Morita | C23C 14/086 257/43 |
| 2013/0256653 A1 | 10/2013 | Ahn et al. | |
| 2013/0256666 A1* | 10/2013 | Chang | H01L 29/78693 257/57 |
| 2013/0270550 A1 | 10/2013 | Okazaki et al. | |
| 2013/0299820 A1 | 11/2013 | Miyamoto et al. | |
| 2013/0320330 A1 | 12/2013 | Yamazaki | |
| 2013/0320334 A1 | 12/2013 | Yamazaki et al. | |
| 2013/0334533 A1 | 12/2013 | Yamazaki | |
| 2014/0008647 A1 | 1/2014 | Yamazaki | |
| 2014/0030845 A1 | 1/2014 | Koezuka et al. | |
| 2017/0125605 A1 | 5/2017 | Sano et al. | |

FOREIGN PATENT DOCUMENTS

| | | |
|---|---|---|
| CN | 102934232 A | 2/2013 |
| CN | 103098220 A | 5/2013 |
| EP | 1737044 A | 12/2006 |
| EP | 2197034 A | 6/2010 |
| EP | 2226847 A | 9/2010 |
| EP | 2423966 A | 2/2012 |
| EP | 2453480 A | 5/2012 |
| EP | 2453481 A | 5/2012 |
| EP | 2455975 A | 5/2012 |
| EP | 2579316 A | 4/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2008-199005 A | 8/2008 |
| JP | 2009-231613 A | 10/2009 |
| JP | 2010-016347 A | 1/2010 |
| JP | 2010-040552 A | 2/2010 |
| JP | 4415062 | 2/2010 |
| JP | 2010-067954 A | 3/2010 |
| JP | 2010-073881 A | 4/2010 |
| JP | 2010-161339 A | 7/2010 |
| JP | 2010-177431 A | 8/2010 |
| JP | 2010-186994 A | 8/2010 |
| JP | 4571221 | 10/2010 |
| JP | 2011-124360 A | 6/2011 |
| JP | 2011-129923 A | 6/2011 |
| JP | 2011-129926 A | 6/2011 |
| JP | 2011-135061 A | 7/2011 |
| JP | 2011-243745 A | 12/2011 |
| JP | 2011-256108 A | 12/2011 |
| JP | 2012-023352 A | 2/2012 |
| JP | 2012-059860 A | 3/2012 |
| JP | 2012-084858 A | 4/2012 |
| JP | 2012-094853 A | 5/2012 |
| JP | 2012-160679 A | 8/2012 |
| KR | 2010-0084466 A | 7/2010 |
| KR | 2012-0026005 A | 3/2012 |
| KR | 2013-0051468 A | 5/2013 |
| KR | 2013-0064116 A | 6/2013 |
| TW | 201114040 | 4/2011 |
| TW | 201222823 | 6/2012 |
| TW | 201232739 | 8/2012 |
| WO | WO-2004/114391 | 12/2004 |
| WO | WO-2006/051993 | 5/2006 |
| WO | WO-2008/133345 | 11/2008 |
| WO | WO-2011/065208 | 6/2011 |
| WO | WO-2011/132769 | 10/2011 |
| WO | WO-2011/151990 | 12/2011 |
| WO | WO-2011/158888 | 12/2011 |
| WO | WO-2012/043806 | 4/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2: Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1: Invited Paper: Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2: Invited Paper: Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. JP2013/077541) dated Nov. 26, 2013.
Written Opinion (Application No. JP2013/077541) dated Nov. 26, 2013.
Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.
Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

\* cited by examiner

FIG. 19A1
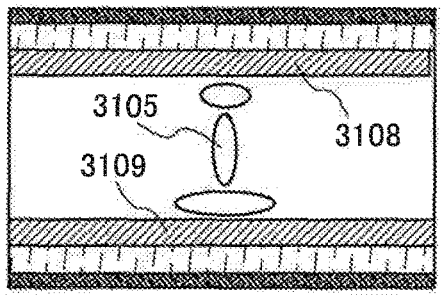
FIG. 19A2
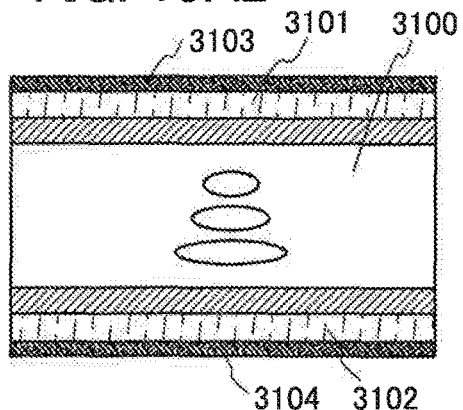
FIG. 19B1
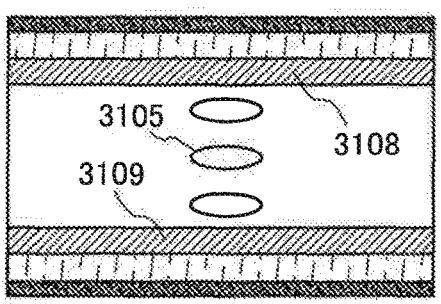
FIG. 19B2
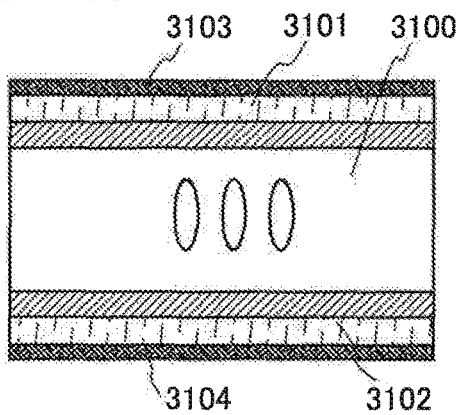
FIG. 19C1
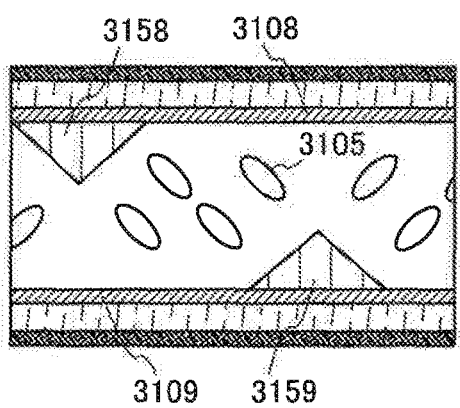
FIG. 19C2
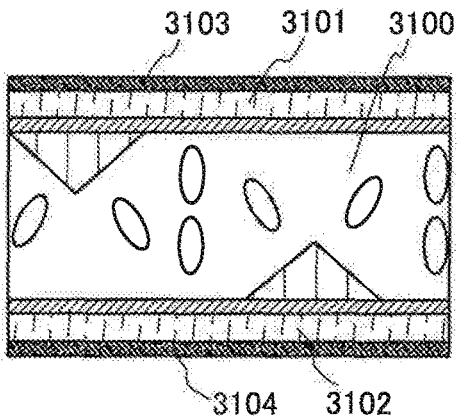

FIG. 20A1
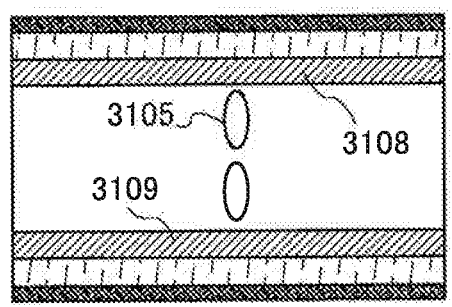
FIG. 20A2
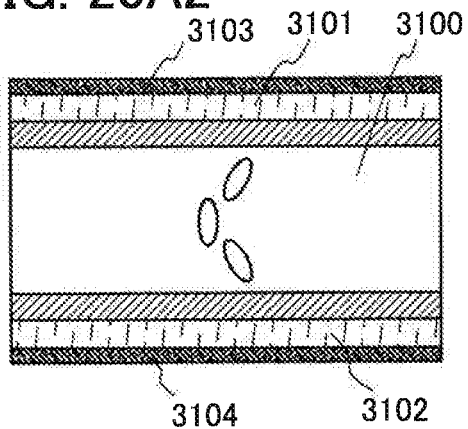
FIG. 20B1
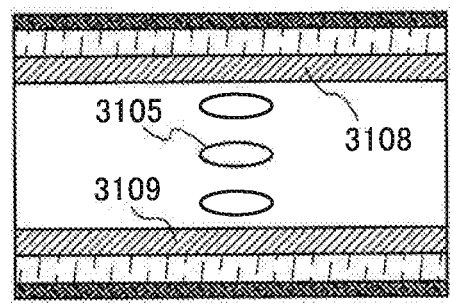
FIG. 20B2
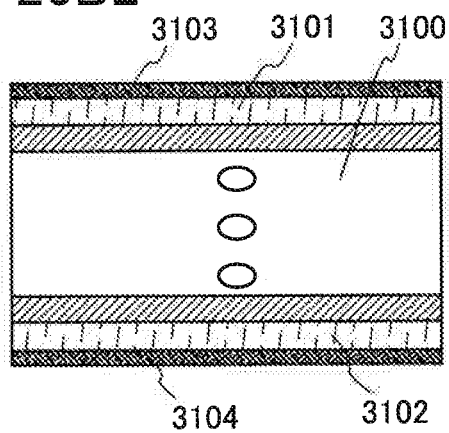

FIG. 21A1
FIG. 21A2
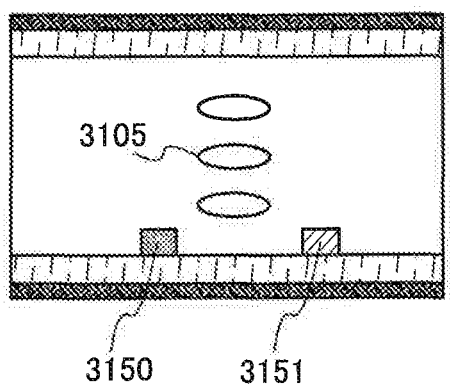
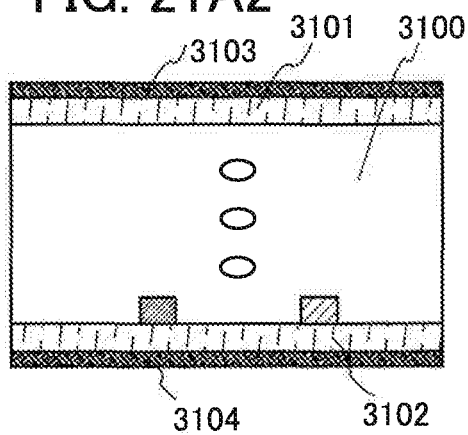
FIG. 21B1
FIG. 21B2
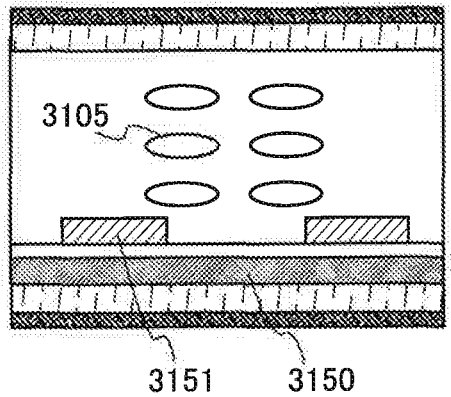
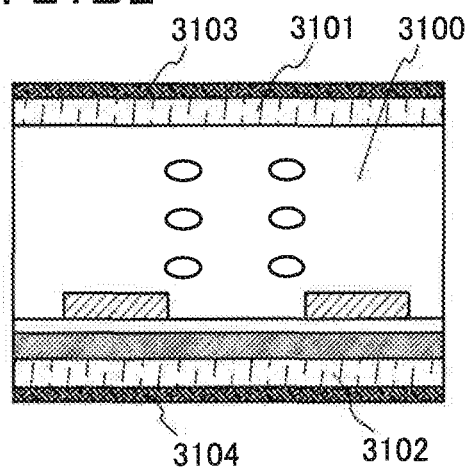

SEMICONDUCTOR DEVICE COMPRISING AN OXIDE LAYER AND AN OXIDE SEMICONDUCTOR LAYER

CROSS-REFERENCE TO RELATED APPLICATIONS

This application is a continuation of U.S. application Ser. No. 14/047,209, filed Oct. 7, 2013, now allowed, which claims the benefit of a foreign priority application filed in Japan as Serial No. 2012-229597 on Oct. 17, 2012, both of which are incorporated by reference.

TECHNICAL FIELD

The present invention relates to a semiconductor device and a method for manufacturing the semiconductor device.

Note that in this specification, a semiconductor device refers to any device that can function by utilizing semiconductor characteristics, and an electro-optical device, a semiconductor circuit, an electronic appliance, and the like are all semiconductor devices.

BACKGROUND ART

A technique for forming a transistor by using a semiconductor layer formed over a substrate having an insulating surface has attracted attention. The transistor has been widely used for semiconductor devices such as integrated circuits and display devices. A silicon-based semiconductor layer is known as a semiconductor layer applicable to a transistor.

Whether an amorphous silicon layer or a polycrystalline silicon layer is used as a semiconductor layer in a transistor depends on the purpose. For example, in the case of a transistor included in a large display device, an amorphous silicon layer, which can be formed using an established technique for forming a film over a large substrate, is preferably used. On the other hand, in the case of a transistor included in a high-performance display device where driver circuits are formed over the same substrate, a polycrystalline silicon layer, which can form a transistor having a high field-effect mobility, is preferably used. As a method for forming a polycrystalline silicon layer, high-temperature heat treatment or a laser light treatment which is performed on an amorphous silicon layer has been known.

Further, in recent years, an oxide semiconductor layer has attracted attention. For example, a transistor which includes an oxide semiconductor layer containing indium, gallium, and zinc and having a carrier density lower than $10^{18}/cm^3$ is disclosed (see Patent Document 1).

An oxide semiconductor layer can be formed by a sputtering method, and thus can be used for a transistor in a large display device. A transistor including an oxide semiconductor layer has a high field-effect mobility; therefore, a high-performance display device where driver circuits are formed over the same substrate can be obtained. Moreover, there is an advantage that capital investment can be reduced because part of production equipment for a transistor including an amorphous silicon film can be retrofitted and utilized.

A transistor including an oxide semiconductor layer is known to have extremely low leakage current (also called off-state current) in an off state. For example, a low-power-consumption CPU utilizing such a low leakage current characteristic of a transistor including an oxide semiconductor layer is disclosed (see Patent Document 2).

REFERENCE

[Patent Document 1] Japanese Published Patent Application No. 2006-165528
[Patent Document 2] United States Patent Application Publication No. 2012/0032730

DISCLOSURE OF INVENTION

As application of a transistor including an oxide semiconductor layer has expanded, reliability has been required from various aspects. In view of the above, it is an object of one embodiment of the present invention to achieve stable electrical characteristics of a transistor including an oxide semiconductor layer. It is another object to provide a highly reliable semiconductor device including the transistor.

One embodiment of the present invention is a semiconductor device which includes a multilayer film including an oxide layer and an oxide semiconductor layer, a gate insulating film in contact with the oxide layer, and a gate electrode overlapping with the multilayer film with the gate insulating film interposed therebetween. The oxide layer contains a common element to the oxide semiconductor layer and has a larger energy gap than the oxide semiconductor layer. The composition between the oxide layer and the oxide semiconductor layer gradually changes. Note that "the composition between the oxide layer and the oxide semiconductor layer gradually changes" means that an oxide layer or an oxide semiconductor layer between the oxide layer and the oxide semiconductor layer has a composition that is intermediate between the composition of the oxide layer and the composition of the oxide semiconductor layer.

Another embodiment of the present invention is a semiconductor device which includes a multilayer film including an oxide layer and an oxide semiconductor layer, a gate insulating film in contact with the oxide layer, and a gate electrode overlapping with the multilayer film with the gate insulating film interposed therebetween. The oxide layer contains a common element to the oxide semiconductor layer. The energy of the bottom of the conduction band of the oxide layer is closer to the vacuum level than the energy of the oxide semiconductor layer is. The composition between the oxide layer and the oxide semiconductor layer gradually changes.

The oxide layer (also called a barrier layer) is provided on the opposite side of the gate insulating film (also called the back channel side of the oxide semiconductor layer) and has energy of the bottom of the conduction band which is closer to the vacuum level than the energy of the oxide semiconductor layer is to the vacuum level by 0.05 eV or more, 0.07 eV or more, 0.1 eV or more, or 0.15 eV or more, and 2 eV or less, 1 eV or less, 0.5 eV or less, or 0.4 eV or less. At this time, a channel is formed in the oxide semiconductor layer, while a channel is not formed in the oxide layer. In addition, since the oxide layer contains the same element as the oxide semiconductor layer, the composition between the oxide layer and the oxide semiconductor layer gradually changes. Thus, there is no clear interface between the oxide layer and the oxide semiconductor layer, and an interface state is less likely to be formed. When an interface state is formed at an interface between the oxide layer and the oxide semiconductor layer, a second transistor in which the interface serves as a channel formation region and which has different threshold voltage is formed and the apparent threshold voltage of the transistor varies in some cases. Thus, the oxide layer provided on the back channel side of the oxide semiconductor layer can reduce variations in the electrical characteristics of the transistor such as threshold voltage.

In order to achieve stable electrical characteristics of a transistor in which a channel is formed in an oxide semiconductor layer, it is effective to reduce the concentration of impurities in the oxide semiconductor layer so that the oxide semiconductor layer is highly purified to be intrinsic. The expression the oxide semiconductor layer is highly purified to be "intrinsic" includes the case where the oxide semiconductor layer is highly purified to be "substantially intrinsic". Note that in the case of a substantially intrinsic oxide semiconductor layer, the carrier density of the oxide semiconductor layer is lower than $1 \times 10^{17}/cm^3$, lower than $1 \times 10^{15}/cm^3$, or lower than $1 \times 10^{13}/cm^3$. In the oxide semiconductor layer, a light element, a semimetal element, a metal element, and the like (lower than 1 atomic %) other than main components serve as impurities. For example, hydrogen, nitrogen, carbon, silicon, germanium, titanium, and hafnium serve as impurities in the oxide semiconductor layer. In order to reduce the concentration of impurities in the oxide semiconductor layer, it is preferable that the concentration of impurities in a gate insulating film and an oxide layer which are adjacent to the oxide semiconductor layer be also reduced.

For example, silicon in an oxide semiconductor layer forms an impurity state. The impurity state becomes a trap center in some cases. Specifically, the concentration of silicon in the oxide semiconductor layer is set to lower than $1 \times 10^{19}$ atoms/cm$^3$, preferably lower than $5 \times 10^{18}$ atoms/cm$^3$, more preferably lower than $2 \times 10^{18}$ s atoms/cm$^3$. Thus, it is preferable that an insulating film containing silicon (e.g., silicon oxide, silicon oxynitride, silicon nitride, and silicon nitride oxide) be not provided on the back channel side of the oxide semiconductor layer.

Hydrogen and nitrogen in an oxide semiconductor layer form donor levels and increase the carrier density.

For example, the oxide layer preferably contains aluminum, silicon, gallium, germanium, yttrium, zirconium, lanthanum, cerium, neodymium, or hafnium (especially aluminum or gallium) at proportion higher than in the oxide semiconductor layer. Specifically, as the oxide layer, an oxide layer containing the above element at proportion 1.5 times or more, preferably twice or more, more preferably 3 times or more that in the oxide semiconductor layer is used. The above element is strongly bonded to oxygen, and thus has a function of suppressing generation of an oxygen vacancy in the oxide layer. In other words, an oxygen vacancy is likely to be generated in the oxide layer than in the oxide semiconductor layer.

In the case where the oxide semiconductor layer is an In-M-Zn-based oxide having an atomic ratio of In to M and Zn of $x_1:y_1:z_1$ and the oxide layer is also an In-M-Zn-based oxide having an atomic ratio of In to M and Zn of $x_2:y_2:z_2$, the oxide semiconductor layer and the oxide layer which satisfy the following conditions are selected: $y_2/x_2$ is larger than $y_1/x_1$, preferably $y_2/x_2$ is 1.5 times or more as large as $y_1/x_1$, more preferably $y_2/x_2$ is twice or more as large as $y_1/x_1$, still more preferably $y_2/x_2$ is 3 times or more as large as $y_1/x_1$. Note that the element M is a metal element which has higher bonding strength to oxygen than In. Examples of the element M include Al, Si, Ga, Ge, Y, Zr, La, Ce, Nd, and Hf (especially Al or Ga). At this time, $y_1$ is preferably greater than or equal to $x_1$ in the oxide semiconductor layer, in which case stable electrical characteristics of a transistor can be achieved. However, when $y_1$ is 3 times or more $x_1$, the field-effect mobility of the transistor decreases; for this reason, $y_1$ is preferably less than 3 times $x_1$.

The thickness of the oxide layer is greater than or equal to 3 nm and less than or equal to 100 nm, preferably greater than or equal to 3 nm and less than or equal to 50 nm.

A source electrode and a drain electrode of a transistor are provided in contact with the oxide layer. That is, current flowing between the source electrode and the drain electrode (also called drain current) of the transistor flows in the oxide semiconductor layer through the oxide layer.

As a semiconductor device is increased in size or miniaturized, influence of wiring resistance on the semiconductor device increases. For this reason, a multilayer film including a layer containing copper which has low resistance is preferably used as a wiring. However, copper serves as an impurity in an oxide semiconductor layer as described above. Even when a multilayer film including a layer containing copper is used as a wiring in a semiconductor device of one embodiment of the present invention, the oxide layer provided can reduce the concentration of copper in the oxide semiconductor layer. Note that part of the wiring preferably functions as a source electrode and a drain electrode, in which case manufacture of a semiconductor device can be simplified.

According to one embodiment of the present invention, a transistor can have stable electrical characteristics by using a multilayer film including an oxide layer and an oxide semiconductor layer. In addition, a highly reliable semiconductor device including the transistor can be provided.

BRIEF DESCRIPTION OF DRAWINGS

FIGS. 19A1, 19A2, 19B1, 19B2, 19C1, and 19C2 are cross-sectional views each illustrating an example of a pixel of a liquid crystal device of one embodiment of the present invention.

FIGS. 20A1, 20A2, 20B1, and 20B2 are cross-sectional views each illustrating an example of a pixel of a liquid crystal device of one embodiment of the present invention.

FIGS. 21A1, 21A2, 21B1, and 21B2 are cross-sectional views each illustrating an example of a pixel of a liquid crystal device of one embodiment of the present invention.

BEST MODE FOR CARRYING OUT THE INVENTION

Figure 1A:
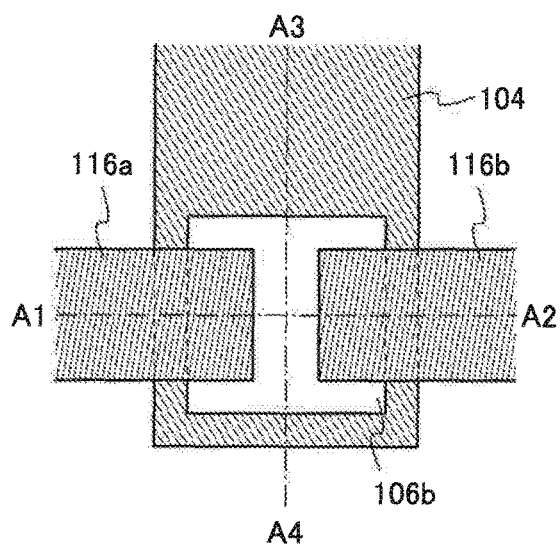
FIGS. 1A to 1D are a top view and cross-sectional views illustrating a semiconductor device of one embodiment of the present invention.

Hereinafter, embodiments of the present invention are described in detail with reference to the accompanying drawings. However, the present invention is not limited to the following description, and it is easily understood by those skilled in the art that modes and details disclosed herein can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

The ordinal numbers such as "first" and "second" in this specification are used for convenience and do not denote the order of steps or the stacking order of layers. In addition, the ordinal numbers in this specification do not denote particular names which specify the present invention.

Note that voltage refers to a potential difference between a certain potential and a reference potential (e.g., a ground potential (GND) or a source potential) in many cases. Accordingly, voltage can also be called a potential.

Even when the expression "to be electrically connected" is used in this specification, there is a case in which no physical connection is made and a wiring is just extended in an actual circuit.

Functions of a "source" and a "drain" in the present invention are sometimes replaced with each other when the direction of current flowing is changed in circuit operation, for example. Therefore, in this specification, the terms "source" and "drain" can be used to denote the drain and the source, respectively.

Note that the structures described in this embodiment can be combined as appropriate.

<1. Transistor>

A transistor including a multilayer film 106 is described below.

<1-1. Transistor Structure (1)>

Here, a bottom gate transistor is described. In this section, a bottom-gate top-contact (BGTC) transistor which is one kind of a bottom gate transistor is described with reference to FIGS. 1A to 1C.

Figure 1C:
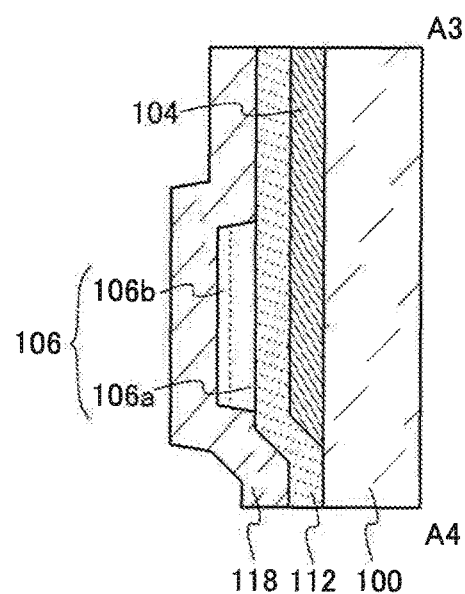
Figure 1B:
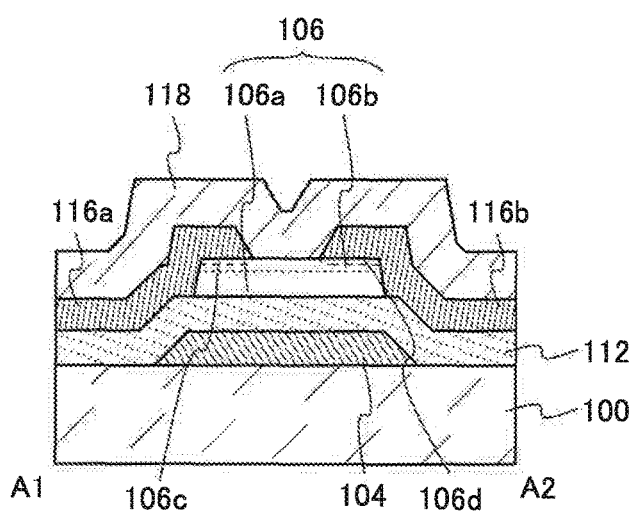

FIGS. 1A to 1C are a top view and cross-sectional views illustrating a BGTC transistor. FIG. 1A is a top view of the transistor. FIG. 1B is a cross-sectional view taken along dashed-dotted line A1-A2 in FIG. 1A. FIG. 1C is a cross-sectional view taken along dashed-dotted line A3-A4 in FIG. 1A.

The transistor illustrated in FIG. 1B includes a gate electrode 104 provided over a substrate 100, a gate insulating film 112 provided over the gate electrode 104, a multilayer film 106 which includes an oxide semiconductor layer 106a provided over the gate insulating film 112 and an oxide layer 106b provided over the oxide semiconductor layer 106a, a source electrode 116a and a drain electrode 116b provided over the gate insulating film 112 and the multilayer film 106, and a protective insulating film 118 provided over the multilayer film 106, the source electrode 116a, and the drain electrode 116b.

Note that a conductive film used for the source electrode 116a and the drain electrode 116b takes oxygen from part of the oxide layer 106b or forms a mixed layer depending on its kind, which results in formation of a source region 106c and a drain region 106d in the oxide layer 106b.

In FIG. 1A, the distance between the source electrode 116a and the drain electrode 116b in a region overlapping with the gate electrode 104 is called channel length. Note that in the case where the transistor includes the source region 106c and the drain region 106d, the distance between the source region 106c and the drain region 106d in a region overlapping with the gate electrode 104 may be called channel length.

Note that a channel formation region refers to a region, which overlaps with the gate electrode 104 and is interposed between the source electrode 116a and the drain electrode 116b, in the multilayer film 106 (see FIG. 1B). In addition, a channel region refers to a region where current mainly flows in the channel formation region. Here, the channel region is the channel formation region in the oxide semiconductor layer 106a.

Note that as illustrated in FIG. 1A, the gate electrode 104 is provided such that the edge of the multilayer film 106 is located on the inner side of the edge of the gate electrode 104. This can suppress generation of carriers in the multilayer film 106 due to light entering from the substrate 100 side. In other words, the gate electrode 104 functions as a light-blocking film. Note that the edge of the multilayer film 106 may be located on the outer side of the edge of the gate electrode 104.

<1-1-1. Multilayer Film>

The multilayer film 106 and the oxide semiconductor layer 106a and the oxide layer 106b which are included in the multilayer film 106 are described below.

The oxide layer 106b is formed of one or more kinds of elements, other than oxygen, forming the oxide semiconductor layer 106a. The energy of the oxide layer 106b at the bottom of the conduction band is closer to the vacuum level than the energy of the oxide semiconductor layer 106a is to the vacuum level by 0.05 eV or more, 0.07 eV or more, 0.1 eV or more, or 0.15 eV or more, and 2 eV or less, 1 eV or less, 0.5 eV or less, or 0.4 eV or less. Under the above condition, when an electric field is applied to the gate electrode 104, a channel is formed in the oxide semiconductor layer 106a of the multilayer film 106 whose energy of the bottom of the conduction band is low. That is, forming the oxide layer 106b between the oxide semiconductor layer 106a and the protective insulating film 118 enables the channel of the transistor to be formed in the oxide semiconductor layer 106a which is not in contact with the protective insulating film 118. In addition, since the oxide layer 106b is formed of one or more kinds of elements, other than oxygen, forming the oxide semiconductor layer 106a, interface scattering is less likely to occur between the oxide semiconductor layer 106a and the oxide layer 106b. Thus, movement of carriers is not inhibited between the oxide semiconductor layer 106a and the oxide layer 106b, which results in an increase in the field-effect mobility of the transistor. Moreover, an interface state is less likely to be formed between the oxide semiconductor layer 106a and the oxide layer 106b. When an interface state is formed between the oxide semiconductor layer 106a and the oxide layer 106b, a second transistor in which the interface between the oxide semiconductor layer 106a and the oxide layer 106b serves as a channel and which has different threshold voltage from the transistor is formed and the apparent threshold voltage of the transistor varies in some cases. Thus, the oxide layer 106b provided can reduce variations in the electrical characteristics of the transistor such as threshold voltage.

The oxide layer 106b may be an oxide layer containing, for example, aluminum, silicon, gallium, germanium, yttrium, zirconium, lanthanum, cerium, neodymium, or hafnium (especially aluminum or gallium) at proportion higher than that in the oxide semiconductor layer 106a. Specifically, as the oxide layer 106b, an oxide layer containing the above element at proportion 1.5 times or more, preferably twice or more, more preferably 3 times or more that in the oxide semiconductor layer 106a is used. The above element is strongly bonded to oxygen, and thus has a function of suppressing generation of an oxygen vacancy in the oxide layer. In other words, the oxide layer 106b is an oxide layer in which oxygen vacancy is less likely to be generated than in the oxide semiconductor layer 106a.

In the case where the oxide semiconductor layer 106a is an In-M-Zn-based oxide having an atomic ratio of In to M and Zn of $x_1:y_1:z_1$ and the oxide layer 106b is also an In-M-Zn-based oxide having an atomic ratio of In to M and Zn of $x_2:y_2:z_2$, the oxide semiconductor layer 106a and the oxide layer 106b which satisfy the following conditions are selected: $y_1/x_1$ is larger than $y_2/x_2$, preferably $y_1/x_1$ is 1.5 times or more as large as $y_2/x_2$, more preferably $y_1/x_1$ is twice or more as large as $y_2/x_2$, still more preferably $y_1/x_1$ is 3 times or more as large as $y_2/x_2$. Note that the element M is a metal element which has higher bonding strength to oxygen than In. Examples of the element M include Al, Si, Ga, Ge, Y, Zr, La, Ce, Nd, and Hf (especially Al and Ga). At this time, $y_1$ is preferably greater than or equal to $x_1$ in the oxide semiconductor layer 106a, in which case stable electrical characteristics of a transistor can be achieved. However, when $y_1$ is 3 times or more $x_1$, the field-effect mobility of the transistor decreases; for this reason, $y_1$ is preferably less than 3 times $x_1$.

Figure 43A:
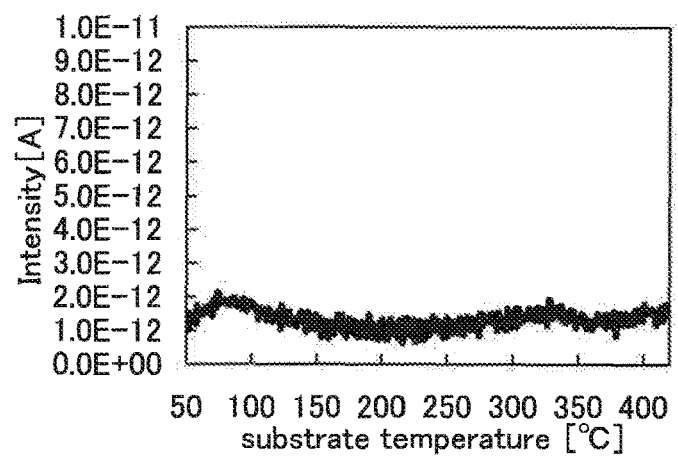
FIGS. 43A to 43C show TDS analysis results of oxide layers.
Figure 43B:
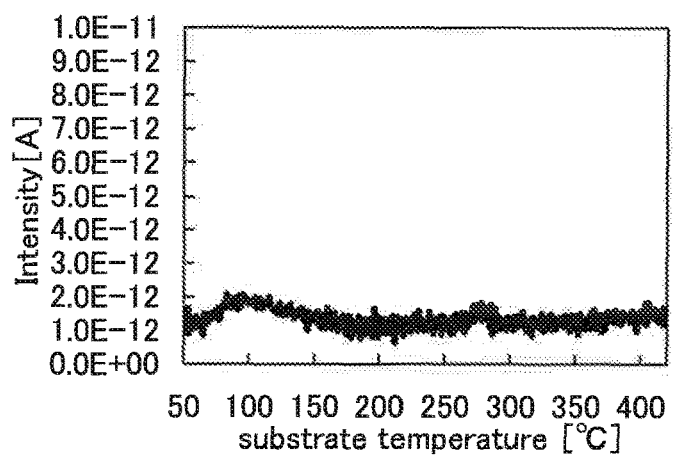
Figure 43C:
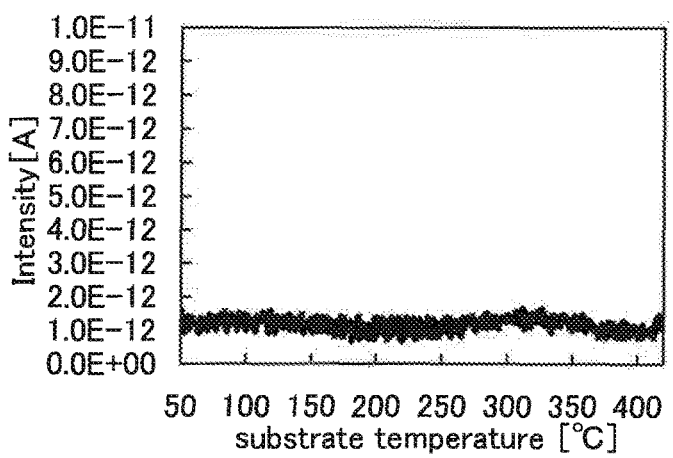

As described above, an oxygen vacancy is less likely to be generated in the oxide layer 106b. FIGS. 43A to 43C show the amount of gas molecules having a mass-to-charge ratio (m/z) of 32 released from the oxide layer 106b, which was measured by thermal desorption spectroscopy (TDS). Note that the results shown in FIGS. 43A to 43C are obtained from the measurement performed at a substrate temperature of from 50° C. to 420° C.

The oxide layer 106b was formed over a silicon wafer to a thickness of 35 nm by a sputtering method using an In—Ga—Zn-based oxide (the atomic ratio of In to Ga and Zn is 1:3:2) target. Note that the oxide layer 106b was formed under the following conditions: the deposition gas was a mixture of an argon gas and an oxygen gas, the pressure was 0.6 Pa, the substrate temperature was 170° C., and the AC power was 5 kW.

FIG. 43A shows results of the TDS measurement of the oxide layer 106b in which the proportion of oxygen was 10% (argon gas: oxygen gas=9:1). FIG. 43B shows results of the TDS measurement of the oxide layer 106b in which the proportion of oxygen was 50% (argon gas:oxygen gas=1:1). FIG. 43C shows results of the TDS measurement of the oxide layer 106b in which the proportion of oxygen was 100% (argon gas:oxygen gas=0:1).

According to FIGS. 43A to 43C, release of oxygen molecules was hardly observed in each oxide layer 106b in the range of 50° C. to 420° C. This indicates that an oxygen vacancy is less likely to be generated in the oxide layer 106b.

Next, the density of the oxide layer 106b is described. When the oxide layer 106b is dense, damage due to plasma in manufacture is less likely to be caused, which leads to manufacture of a transistor having stable electrical characteristics.

The film density of the oxide layer 106b was measured by X-ray reflection (XRR) analysis. The oxide layer 106b which was an object to be measured was formed over a quartz substrate to a thickness of 35 nm by a sputtering method using an In—Ga—Zn-based oxide (the atomic ratio of In to Ga and Zn is 1:3:2) target. Note that the oxide layer 106b was formed under the following conditions: the deposition gas was a mixture of an argon gas and an oxygen gas, the pressure was 0.3 Pa or 0.6 Pa, the substrate temperature was room temperature (about 25° C.), and the AC power was 5 kW.

The results indicate that the average film density of the oxide layer 106b was as high as 5.75 g/cm3 to 5.95 g/cm$^3$.

Next, the crystallinity of the oxide layer 106b was observed. X-ray diffraction was employed for the observation of the crystallinity.

The oxide layer 106b was formed over a quartz substrate to a thickness of 100 nm by a sputtering method using an In—Ga—Zn-based oxide (the atomic ratio of In to Ga and Zn was 1:3:2) target. Note that the oxide layer 106b was formed under the following conditions: the deposition gas was a mixture of an argon gas and an oxygen gas, the pressure was 0.6 Pa, and the AC power was 5 kW.

The proportion of oxygen at the time of the formation of the oxide layer 106b was set to 10% (argon gas: oxygen gas=9:1), 50% (argon gas: oxygen gas=1:1), and 100% (argon gas: oxygen gas=0:1). The temperature at the time of the formation of the oxide layer 106b was room temperature (about 25° C.), 100° C., and 200° C. The results are shown in FIG. 44.

Figure 44:
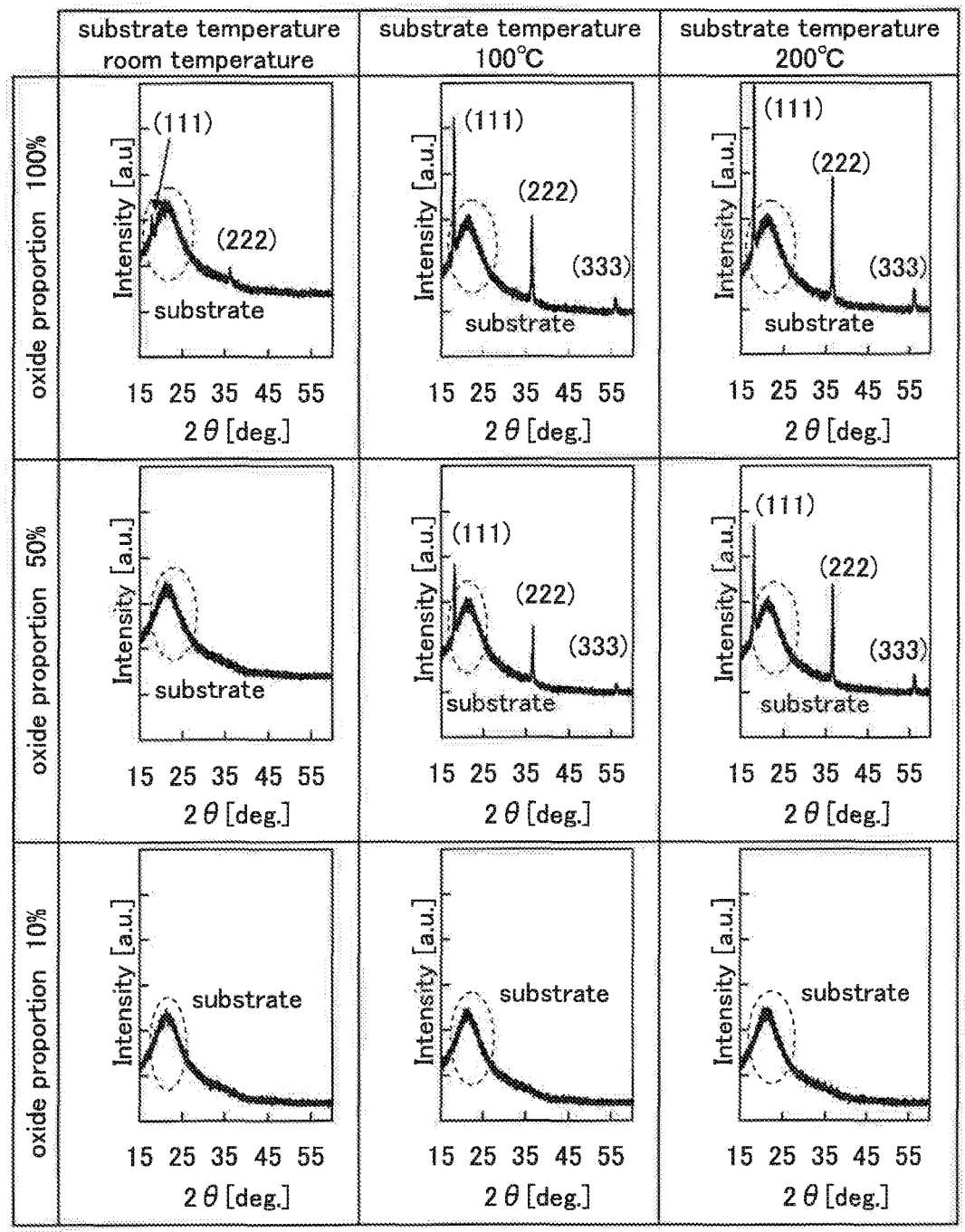
FIG. 44 shows XRD analysis results of oxide layers.

According to FIG. 44, high crystal orientations were not observed in the oxide layers 106b formed under the condition that the proportion of oxygen was 10% and the oxide layer 106b formed under the conditions that the proportion of oxygen was 50% and the substrate temperature was room temperature. In contrast, sharp peaks were observed by XRD in the oxide layers 106b, other than the above oxide layers 106b, which were formed under the conditions that the proportions of oxygen were 50% and 100%. Thus, the oxide layers 106b formed under the conditions that the proportion of oxygen was 50% and 100% include a crystal structure belonging to the space group Fd-3m (e.g., a spinel crystal structure). For example, the peak around 18°, the peak around 36°, and the peak around 56° probably belong to the (111) plane, the (222) plane, and the (333) plane, respectively.

The thickness of the oxide layer 106b is greater than or equal to 3 nm and less than or equal to 100 nm, preferably greater than or equal to 3 nm and less than or equal to 50 nm. The thickness of the oxide semiconductor layer 106a is greater than or equal to 3 nm and less than or equal to 200 nm, preferably greater than or equal to 3 nm and less than or equal to 100 nm, more preferably greater than or equal to 3 nm and less than or equal to 50 nm.

The concentration of silicon in each of the oxide semiconductor layer 106a and the oxide layer 106b is described below. In order to obtain stable electrical characteristics of a transistor, it is effective to reduce the concentration of impurities in the oxide semiconductor layer 106a so that the oxide semiconductor layer 106a is highly purified to be intrinsic. The carrier density of the oxide semiconductor layer 106a is set to lower than $1\times10^{17}/\text{cm}^3$, lower than $1\times10^{15}/\text{cm}^3$, or lower than $1\times10^{13}/\text{cm}^3$. In the oxide semiconductor layer 106a, a light element, a semimetal element, a metal element, and the like (lower than 1 atomic %), other than main components serve as impurities. For example, hydrogen, nitrogen, carbon, silicon, germanium, titanium, and hafnium serve as impurities in the oxide semiconductor layer 106a. Thus, the concentrations of impurities in the gate insulating film 112 and the oxide layer 106b which are adjacent to the oxide semiconductor layer 106a are preferably reduced.

For example, when silicon is contained in the oxide semiconductor layer 106a, an impurity state is formed. In particular, when silicon exists between the oxide semiconductor layer 106a and the oxide layer 106b, the impurity state becomes a trap center. For this reason, the concentration of silicon in a region between the oxide semiconductor layer 106a and the oxide layer 106b is set to lower than $1\times10^{19}$ atoms/cm$^3$, preferably lower than $5\times10^{18}$ atoms/cm$^3$, more preferably lower than $2\times10^{18}$ atoms/cm$^3$.

Further, hydrogen and nitrogen in the oxide semiconductor layer 106a form donor levels, which increase carrier density. The concentration of hydrogen in the oxide semiconductor layer 106a, which is measured by secondary ion mass spectrometry (SIMS), is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen, which is measured by SIMS, is set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentrations of hydrogen and nitrogen in the oxide layer 106b in order to reduce the concentrations of hydrogen and nitrogen in the oxide semiconductor layer 106a. The concentration of hydrogen in the oxide layer 106b, which is measured by SIMS, is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen, which is measured by SIMS, is set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that the oxide semiconductor layer 106a and the oxide layer 106b each have an amorphous structure or a crystalline structure. It is preferable that the oxide semiconductor layer 106a have a crystalline structure and the oxide layer 106b have an amorphous structure or a crystalline structure. When the oxide semiconductor layer 106a in which a channel is formed has a crystalline structure, stable electrical characteristics of a transistor can be achieved. Note that the oxide semiconductor layer 106a having a crystalline structure is preferably a CAAC-OS (c-axis aligned crystalline oxide semiconductor) layer.

A structure of an oxide semiconductor layer (oxide layer) is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a CAAC-OS layer, and the like.

The amorphous oxide semiconductor layer has disordered atomic arrangement and no crystalline component. A typical example thereof is an oxide semiconductor layer in which no crystal part exists even in a microscopic region, and the whole of the film is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fit inside a cube whose one side is less than 100 nm. Thus, there is a case where a crystal part included in the CAAC-OS layer fits inside a cube whose one side is less than 10 nm, less than 5 nm, or less than 3 nm. The density of defect states of the CAAC-OS layer is lower than that of the microcrystalline oxide semiconductor layer. The CAAC-OS layer is described in detail below.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

A CAAC-OS layer is subjected to structural analysis with an X-ray diffraction (XRD) apparatus. For example, when the CAAC-OS layer including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Further, when an impurity is added to the CAAC-OS layer, the crystallinity in a region to which the impurity is added is changed, and the degree of crystallinity in the CAAC-OS layer varies depends on regions.

With use of the CAAC-OS layer in a transistor, change in electrical characteristics of the transistor due to irradiation with visible light or ultraviolet light can be reduced. Thus, the transistor has high reliability.

Note that an oxide semiconductor layer may be a stacked film including two or more layers of an amorphous oxide semiconductor layer, a microcrystalline oxide semiconductor layer, and a CAAC-OS layer, for example.

Note that when silicon and carbon are contained in the oxide semiconductor layer 106a at a high concentration, the crystallinity of the oxide semiconductor layer 106a is lowered in some cases. In order not to lower the crystallinity of the oxide semiconductor layer 106a, the concentration of silicon in the oxide semiconductor layer 106a is preferably set to lower than $1 \times 10^{19}$ atoms/cm³, preferably lower than $5\times10^{18}$ atoms/cm$^3$, more preferably lower than $2\times10^{18}$ atoms/cm$^3$. Moreover, in order not to lower the crystallinity of the oxide semiconductor layer 106a, the concentration of carbon in the oxide semiconductor layer 106a is set to be lower than $1\times10^{19}$ atoms/cm$^3$, preferably lower than $5\times10^{18}$ atoms/cm$^3$, more preferably lower than $2\times10^{18}$ atoms/cm$^3$.

As described above, in the case where the oxide semiconductor layer 106a in which a channel is formed has high crystallinity and the density of states due to an impurity or a defect is low, a transistor including the multilayer film 106 has stable electrical characteristics.

Localized states of the multilayer film 106 are described below. By reducing the density of localized states of the multilayer film 106, a transistor including the multilayer film 106 can have stable electrical characteristics. The localized states of the multilayer film 106 can be measured by a constant photocurrent method (CPM).

In order that the transistor has stable electrical characteristics, the absorption coefficient due to the localized states of the multilayer film 106 measured by CPM is preferably lower than $1\times10^{-3}$ cm$^{-1}$, more preferably lower than $3\times10^{-4}$ cm$^{-1}$. Further, when the absorption coefficient due to the localized states of the multilayer film 106 measured by CPM is lower than $1\times10^{-3}$ cm$^{-1}$, preferably lower than $3\times10^{-4}$ cm$^{-1}$, the field-effect mobility of the transistor can be increased. In order that the absorption coefficient due to the localized states of the multilayer film 106 measured by CPM is lower than $1\times10^{-3}$ cm$^{-1}$, preferably lower than $3\times10^{-4}$ cm$^{-1}$, the concentration of silicon, germanium, carbon, hafnium, titanium, and the like in the oxide semiconductor layer 106a which form localized states is preferably lower than $2\times10^{18}$ atoms/cm$^3$, more preferably lower than $2\times10^{17}$ atoms/cm$^3$.

In the CPM measurement, the amount of light with which a surface of the sample between terminals is irradiated is adjusted so that a photocurrent value is kept constant in the state where voltage is applied between electrodes provided in contact with the multilayer film 106 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

The localized states measured by CPM probably result from an impurity or a defect. In other words, a transistor which includes the multilayer film 106 having a small absorption coefficient due to the localized states measured by CPM has stable electrical characteristics.

Next, diffusion of oxygen in the multilayer film 106 through heat treatment at 450° C. is described with reference to FIGS. 2A and 2B.

Figure 2A:
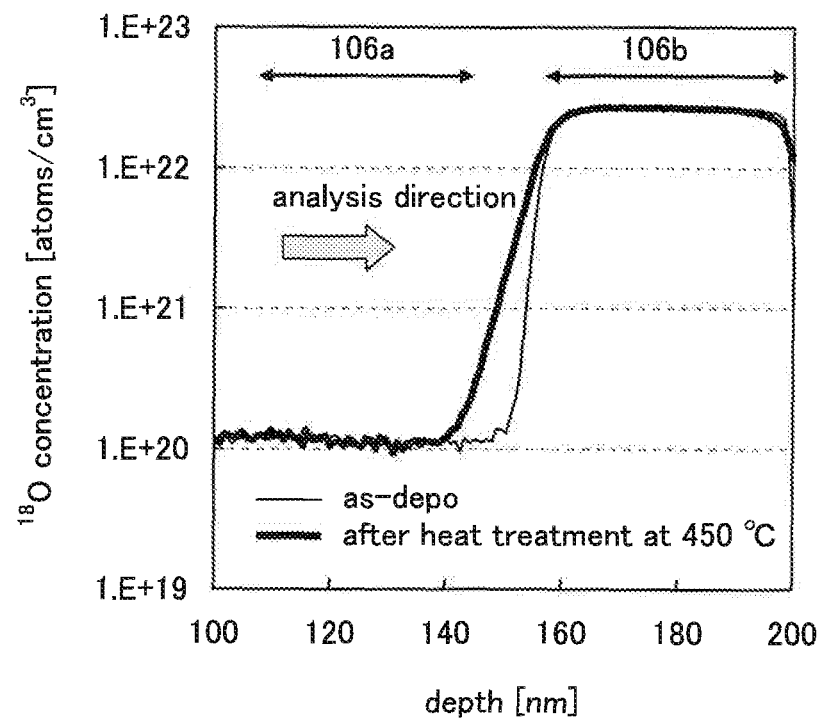
FIGS. 2A and 2B each show diffusion of oxygen in a multilayer film of one embodiment of the present invention.
Figure 2B:
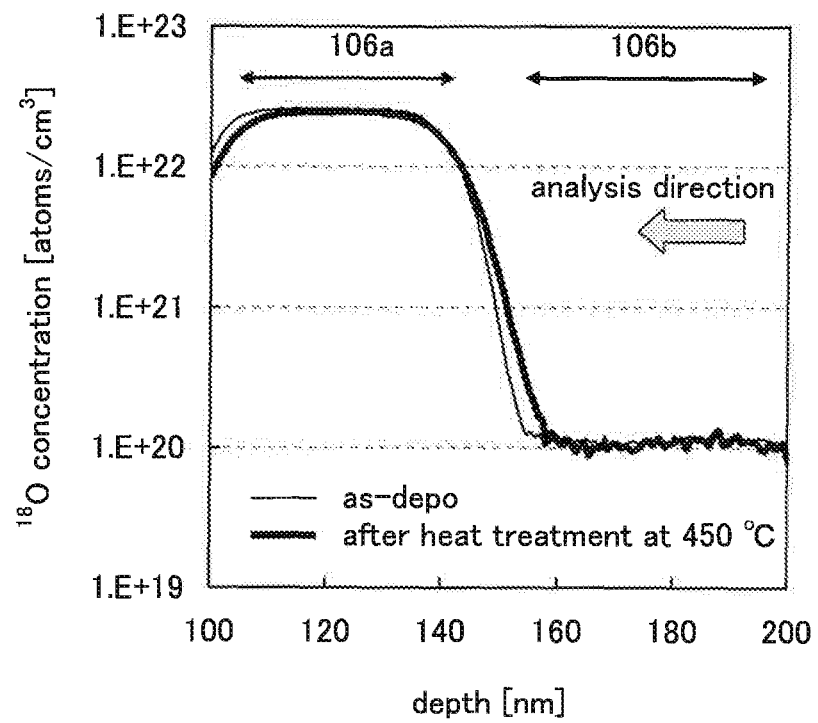

FIGS. 2A and 2B each show SIMS measurement results of concentration distribution of $^{18}$O in a depth direction in samples in which any of the layers of the multilayer film 106 is formed using an $^{18}O_2$ gas.

Here, the oxide semiconductor layer 106a is an oxide semiconductor layer formed by a sputtering method using an In—Ga—Zn-based oxide (the atomic ratio of In to Ga and Zn is 3:1:2) target.

The oxide layer 106b is an oxide layer formed by a sputtering method using an In—Ga—Zn-based oxide (the atomic ratio of In to Ga and Zn is 1:1:1) target.

FIG. 2A shows $^{18}$O concentration distributions in a depth direction of the oxide semiconductor layer 106a, the oxide layer 106b, and the interface therebetween of samples in each of which an $^{18}O_2$ gas was used for forming the oxide layer 106b but an $^{18}O_2$ gas was not used for forming the oxide semiconductor layer 106a. FIG. 2A indicates that $^{18}$O is more diffused from the oxide layer 106b to the oxide semiconductor layer 106a in a sample subjected to heat treatment at 450° C. (shown as "after heat treatment at 450° C." with a thick solid line) than in a sample not subjected to heat treatment (shown as "as-depo" with a thin solid line).

FIG. 2B shows $^{18}$O concentration distributions in a depth direction of the oxide semiconductor layer 106a, the oxide layer 106b, and the interface therebetween of samples in each of which an $^{18}O_2$ gas was used for forming the oxide semiconductor layer 106a but an $^{18}O_2$ gas was not used for forming the oxide layer 106b. FIG. 2B indicates that $^{18}$O is more diffused from the oxide semiconductor layer 106a to the oxide layer 106b in a sample subjected to heat treatment at 450° C. (shown as "after heat treatment at 450° C." with a thick solid line) than in a sample not subjected to heat treatment (shown as "as-depo" with a thin solid line).

According to FIGS. 2A and 2B, it is found that oxygen moves between one layer and the other layer in the multilayer film 106. In other words, a mixed layer of the oxide semiconductor layer 106a and the oxide layer 106b is formed between the oxide semiconductor layer 106a and the oxide layer 106b.

The band structure of the multilayer film 106 is described below with reference to FIG. 3.

Note that the oxide semiconductor layer 106a was formed using an In—Ga—Zn-based oxide having an energy gap of 3.15 eV, and the oxide layer 106b was formed using an In—Ga—Zn-based oxide having an energy gap of 3.5 eV. The energy gaps were measured with a spectroscopic ellipsometer (UT-300 manufactured by HORIBA JOBIN YVON S.A.S.).

The energy gap between the vacuum level and the top of the valence band (also called ionization potential) of the oxide semiconductor layer 106a and the energy gap therebetween of the oxide layer 106b were 8 eV and 8.2 eV, respectively. Note that the energy gap between the vacuum level and the top of the valence band was measured with an ultraviolet photoelectron spectroscopy (UPS) device (VersaProbe manufactured by ULVAC-PHI, Inc.).

Thus, the energy gap between the vacuum level and the bottom of the conduction band (also called electron affinity) of the oxide semiconductor layer 106a and the energy gap therebetween of the oxide layer 1061b were 4.85 eV and 4.7 eV, respectively.

Figure 3:
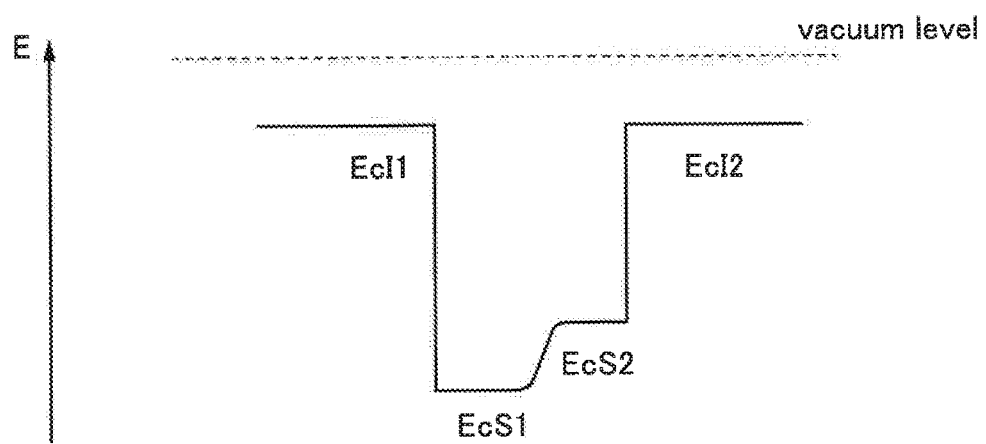
FIG. 3 shows a band structure of a multilayer film of one embodiment of the present invention.

FIG. 3 schematically shows part of the band structure of the multilayer film. With reference to FIG. 3, a case where a silicon oxide layer which is in contact with both the oxide semiconductor layer 106a and the oxide layer 106b is provided is described. Here, EcI1 represents the energy of the bottom of the conduction band of the silicon oxide layer, EcS1 represents the energy of the bottom of the conduction band of the oxide semiconductor layer 106a, EcS2 represents the energy of the bottom of the conduction band of the oxide layer 106b, and EcI2 represents the energy of the bottom of the conduction band of the silicon oxide layer.

As shown in FIG. 3, the energies of the bottoms of the conduction bands of the oxide semiconductor layer 106a and the oxide layer 106b gradually change. This can be understood also from the results in FIGS. 2A and 2B showing that oxygen moves between the oxide semiconductor layer 106a and the oxide layer 106b to form the mixed layer.

According to FIG. 3, the oxide semiconductor layer 106a of the multilayer film 106 serves as a well and a channel of a transistor including the multilayer film 106 is formed in the oxide semiconductor layer 106a. Note that since the energy of the bottom of the conduction band of the multilayer film 106 gradually changes, it can be said that the oxide semiconductor layer 106a and the oxide layer 106b are continuous.

Figure 4:
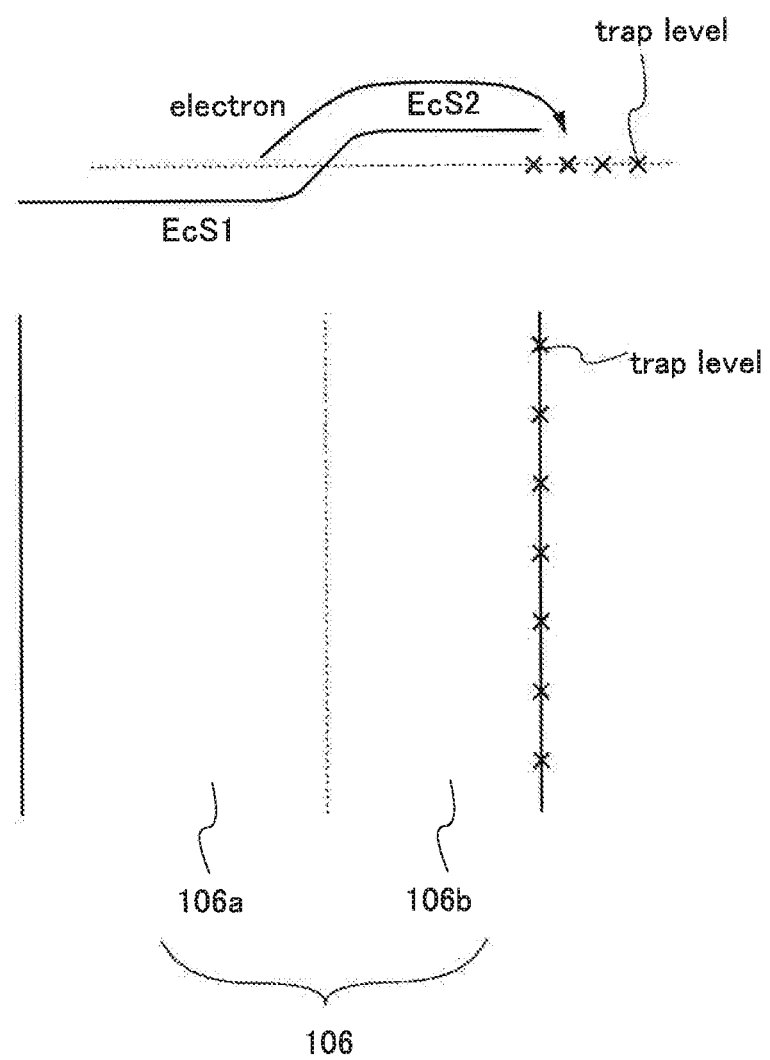
FIG. 4 shows a band structure of a multilayer film of one embodiment of the present invention.

Note that although a trap center due to an impurity or a defect might be formed in the vicinity of the interface between the oxide layer 106b and the protective insulating film 118 as shown in FIG. 4, the oxide semiconductor layer 106a can be away from the trap center owing to the existence of the oxide layer 106b. However, when the energy gap between EcS1 and EcS2 is small, electrons in the oxide semiconductor layer 106a might pass over the energy gap to reach the trap center. When the electrons are trapped in the trap center, a negative fixed charge is generated at the interface the insulating film, causing positive shift of the threshold voltage of the transistor.

Thus, the energy gap between EcS1 and EcS2 is preferably greater than or equal to 0.1 eV, more preferably greater than or equal to 0.15 eV, in which case variations in the threshold voltage of the transistor can be reduced and stable electrical characteristics of the transistor can be achieved.

<1-1-2. Source Electrode and Drain Electrode>

The source electrode 116a and the drain electrode 116b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten. The source electrode 116a and the drain electrode 116b are each preferably a multilayer film including a layer containing copper. The source electrode 116a and the drain electrode 116b are each a multilayer film including a layer containing copper, whereby wiring resistance can be reduced in the case where a wiring is formed in the same layer as the source electrode 116a and the drain electrode 116b. Note that the source electrode 116a and the drain electrode 116b may have the same composition or different compositions.

In the case where a multilayer film including a layer containing copper is used for the source electrode 116a and the drain electrode 116b, a trap center shown in FIG. 4 might be formed at the interface between the oxide layer 106b and the protective insulating film 118 due to copper. Also in this case, the oxide layer 106b can prevent electrons from being trapped in the trap center. Thus, stable electrical characteristics of a transistor can be achieved and wiring resistance can be reduced.

<1-1-3. Protective Insulating Film>

The protective insulating film 118 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 118 may be, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon nitride layer, a silicon nitride layer from which a hydrogen gas and an ammonia gas are less likely to be released is used. The amount of released hydrogen gas or ammonia gas may be measured by TDS. Further, as the silicon nitride layer, a silicon nitride layer which does not transmit or hardly transmits hydrogen, water, and oxygen is used.

Figure 1D:
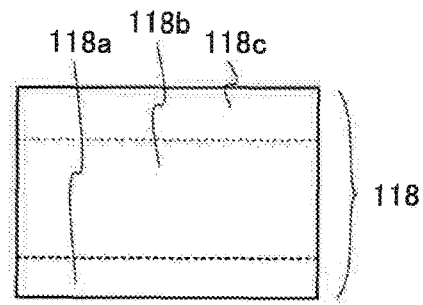

Alternatively, the protective insulating film 118 may be, for example, a multilayer film including a first silicon oxide layer 118a as a first layer, a second silicon oxide layer 118b as a second layer, and a silicon nitride layer 118c as a third layer (see FIG. 1D). In that case, the first silicon oxide layer 118a and/or the second silicon oxide layer 118b may be a silicon oxynitride layer. In addition, the silicon nitride layer may be a silicon nitride oxide layer. As the first silicon oxide layer 118a, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer 118b, a silicon oxide layer containing excess oxygen is used. As the silicon nitride layer 118c, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The silicon oxide layer having excess oxygen means a silicon oxide layer from which oxygen can be released by heat treatment or the like. An insulating film having excess oxygen means an insulating film from which oxygen is released by heat treatment.

The insulating film containing excess oxygen is capable of reducing oxygen vacancies in the oxide semiconductor layer 106a. Oxygen vacancies in the oxide semiconductor layer 106a form defect levels, and some of the defect levels become donor levels. Thus, by a reduction in the oxygen vacancies in the oxide semiconductor layer 106a, the transistor can have stable electrical characteristics.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis (converted into the number of oxygen atoms).

Here, the method of measuring the amount of released oxygen using TDS analysis is described below.

The total amount of released gas from a measurement sample in TDS is proportional to the integral value of the ion intensity of the released gas. Then, a comparison with a reference sample is made, whereby the total amount of released gas can be calculated.

For example, the number of released oxygen molecules ($N_{O2}$) from a measurement sample can be calculated according to Formula 1 using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having a mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[FORMULA 1]}$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is expressed as $N_{H2}/S_{H2}$. Further, $S_{O2}$ is the integral value of ion intensity in the TDS analysis of the measurement sample, and α is a coefficient affecting the ion intensity in the TDS analysis. For details of Formula 1, Japanese Published Patent Application No. H6-275697 is referred to. The amount of released oxygen was measured with a thermal desorption spectroscopy apparatus produced by ESCO Ltd., EMD-WA1000S/W using a silicon wafer containing hydrogen atoms at $1\times10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

Further, the film from which oxygen is released by heat treatment may contain a peroxide radical. Specifically, the spin density attributed to a peroxide radical is greater than or equal to $5\times10^{17}$ spins/cm$^3$. Note that the film containing a peroxide radical may have an asymmetric signal at a g-factor of around 2.01 generated in ESR.

The insulating film containing excess oxygen may be oxygen-excess silicon oxide ($SiO_x(X>2)$). In the oxygen-excess silicon oxide ($SiO_x(X>2)$), the number of oxygen atoms per unit volume is more than twice the number of silicon atoms per unit volume. The number of silicon atoms and the number of oxygen atoms per unit volume are measured by Rutherford backscattering spectrometry (RBS).

<1-1-4. Gate Insulating Film>

The gate insulating film 112 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 112 may be, for example, a multi-layer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon oxide layer, a silicon oxide layer containing excess oxygen is preferably used. As the silicon nitride layer, a silicon nitride layer from which a hydrogen gas and an ammonia gas are less likely to be released is used. The amount of released hydrogen gas or ammonia gas may be measured by TDS.

In the case where at least one of the gate insulating film 112 and the protective insulating film 118 includes an insulating layer containing excess oxygen, oxygen vacancies in the oxide semiconductor layer 106a are reduced, so that stable electrical characteristics of a transistor can be achieved.

<1-1-5. Gate Electrode>

The gate electrode 104 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten.

<1-1-6. Substrate>

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 100, minute processing is sometimes difficult due to shrinkage of the substrate 100 caused by heat treatment or the like in a manufacturing process of a semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment which is performed for an hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 100. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

In the transistor manufactured as described above, a channel is formed in the oxide semiconductor layer 106a; thus, the transistor has stable electrical characteristics and a high field-effect mobility. Even when the source electrode 116a and the drain electrode 116b are formed of a multilayer film including a layer containing copper, stable electrical characteristics can be obtained.

<1-2. Method for Manufacturing Transistor Structure (1)>

A method for manufacturing a transistor is described here with reference to FIGS. 5A to 5C and FIGS. 6A and 6B.

First, the substrate 100 is prepared.

Then, a conductive film to be the gate electrode 104 is formed. The conductive film to be the gate electrode 104 may be formed using any of the conductive films given as examples of the gate electrode 104 by a sputtering method, a chemical vapor deposition (CVD) method, a molecular beam epitaxy (MBE) method, an atomic layer deposition (ALD) method, or a pulsed laser deposition (PLD) method.

Figure 5A:
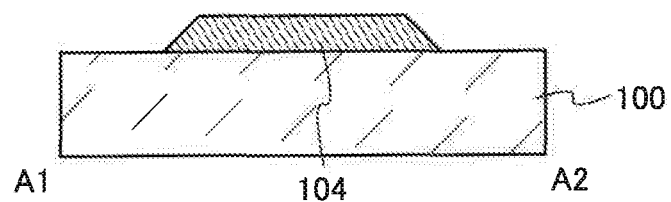
FIGS. 5A to 5C are cross-sectional views illustrating a method for manufacturing a semiconductor device of one embodiment of the present invention.

Next, the conductive film to be the gate electrode 104 is partly etched to form the gate electrode 104 (see FIG. 5A).

Figure 5B:
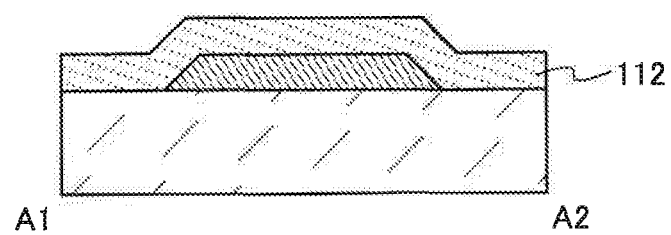

Next, the gate insulating film 112 is fanned (see FIG. 5B). The gate insulating film 112 may be formed in such a manner that any of the insulating films given above as examples of the gate insulating film 112 is formed by a sputtering method, a CVD method, an MBE method, an ALD method, or a PLD method.

Next, an oxide semiconductor film to be the oxide semiconductor layer 106a is formed. A method for forming the oxide semiconductor layer 106a is described later.

Next, an oxide layer to be the oxide layer 106b is formed. The oxide layer 106b may be formed in such a manner that any of the oxide layers given above as examples of the oxide layer 106b is formed by a sputtering method, a CVD method, an MBE method, an ALD method, or a PLD method.

The oxide semiconductor layer to be the oxide semiconductor layer 106a and the oxide layer to be the oxide layer 106b are preferably formed successively without being exposed to the air, in which case impurities are less likely to be taken into an interface between the layers.

An oxide layer applicable to the oxide layer 106b was formed by a sputtering method, and the number of particles with a size of 1 µm or more was measured.

The measurement was performed on the following samples: a sample formed using a gallium oxide target; a sample formed using a Ga—Zn-based oxide (the atomic ratio of Ga to Zn is 2:5) target; a sample formed using an In—Ga—Zn-based oxide (the atomic ratio of In to Ga and Zn is 3:1:2) target; a sample formed using an In—Ga—Zn-based oxide (the atomic ratio of In to Ga and Zn is 1:1:1) target; and a sample formed using an In—Ga—Zn-based oxide (the atomic ratio of In to Ga and Zn is 1:3:2) target.

Figure 7:
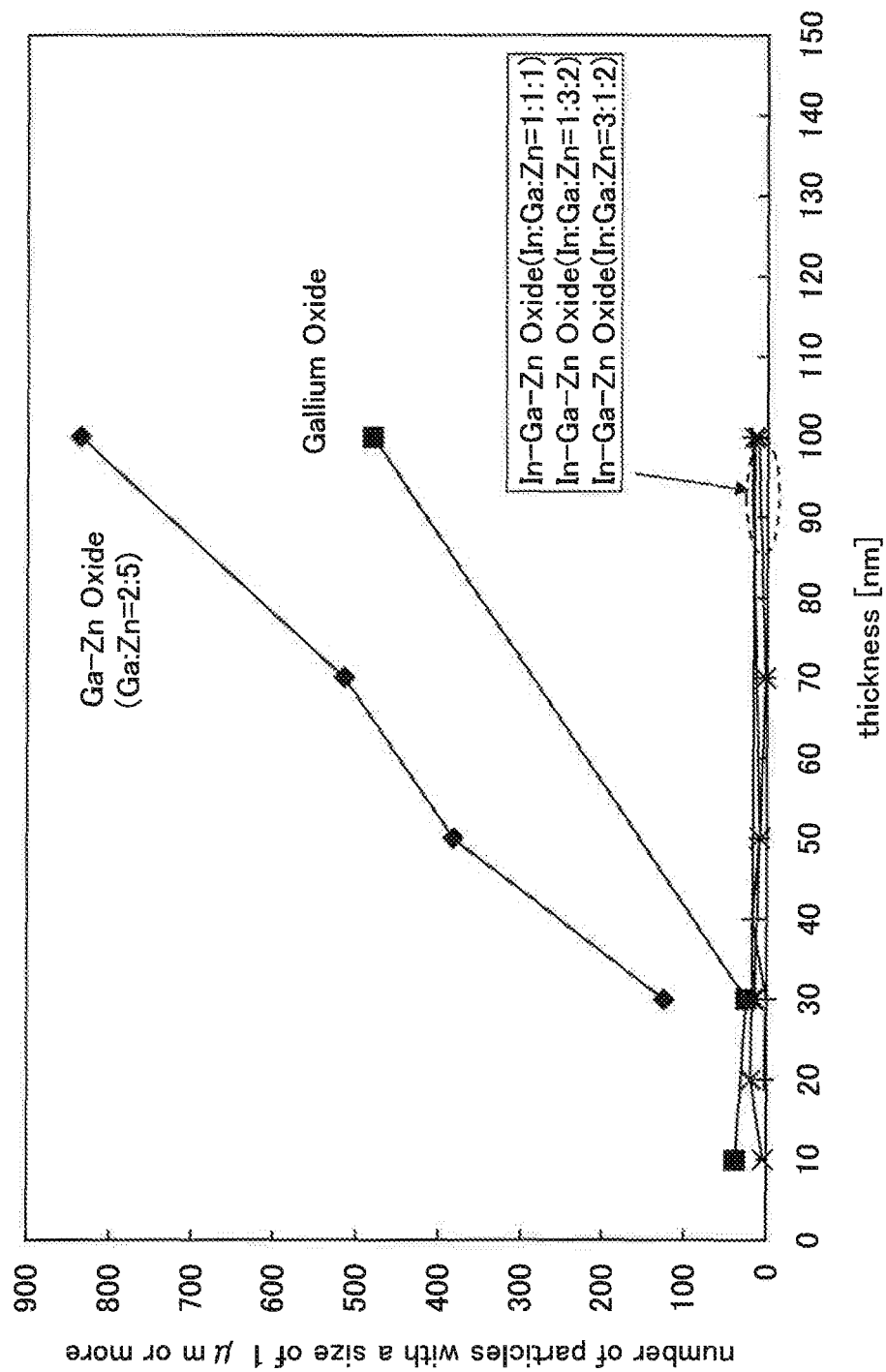
FIG. 7 shows the number of particles in an oxide layer of one embodiment of the present invention.

According to FIG. 7, in the sample formed using the gallium oxide target and the sample formed using the Ga—Zn-based oxide target, the number of particles with a size of 1 µm or more rapidly increases as the thickness of the oxide layer increases. On the other hand, in the samples formed using the In—Ga—Zn-based oxide targets, the number of particles with a size of 1 µm or more is unlikely to increase even when the thickness of the oxide layer increases.

Thus, in the case where the oxide layer 106b is formed by a sputtering method, a target containing indium is preferably used in order not to increase the number of particles. Moreover, it is preferable to use an oxide target in which the proportion of gallium is relatively small. Particularly in the case where a target containing indium is used, the conductivity of the target can be increased and DC discharge and AC discharge are facilitated; thus, film formation over a large substrate can be easily performed. Thus, semiconductor devices can be manufactured with improved productivity.

Figure 5C:
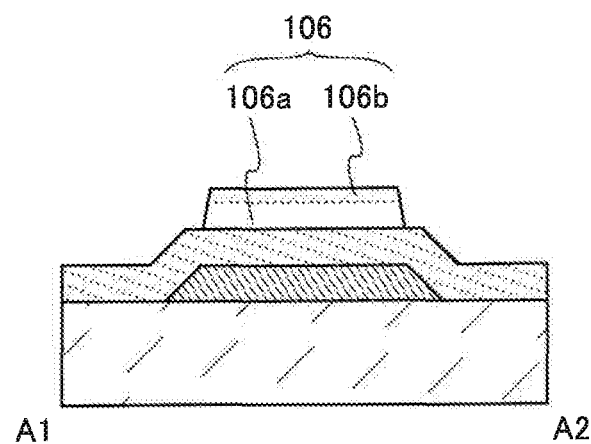

Next, the oxide semiconductor layer to be the oxide semiconductor layer 106a and the oxide layer to be the oxide layer 106b are partly etched to form the multilayer film 106 including the oxide semiconductor layer 106a and the oxide layer 106b (see FIG. 5C).

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment enables the crystallinity of the oxide semiconductor layer 106a to be improved, and in addition, impurities such as hydrogen and water to be removed from the gate insulating film 112 and/or the multilayer film 106.

Then, a conductive film to be the source electrode 116a and the drain electrode 116b is formed. The conductive film to be the source electrode 116a and the drain electrode 116b may be formed in such a manner that any of the conductive films given above as examples of the source electrode 116a and the drain electrode 116b is formed by a sputtering method, a CVD method, an MBE method, an ALD method, or a PLD method.

For example, a multilayer film including a tungsten layer and a copper layer over the tungsten layer may be formed as the conductive film to be the source electrode 116a and the drain electrode 116b.

Figure 6A:
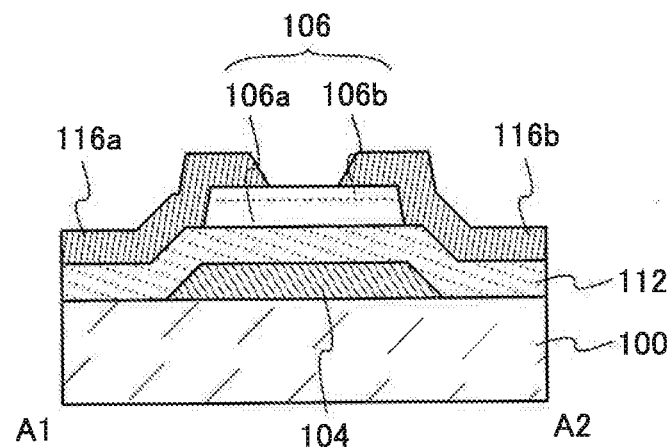
FIGS. 6A and 6B are cross-sectional views illustrating a method for manufacturing a semiconductor device of one embodiment of the present invention.

Next, the conductive film to be the source electrode 116a and the drain electrode 116b is partly etched to form the source electrode 116a and the drain electrode 116b (see FIG. 6A). In the case where a multilayer film including a tungsten layer and a copper layer over the tungsten layer is used as the conductive film to be the source electrode 116a and the drain electrode 116b, the multilayer film can be etched with the use of an etching mask. Even when the tungsten layer and the copper layer are etched at once, the concentration of copper in a region between the oxide semiconductor layer 106a and the oxide layer 106b can be lower than $1 \times 10^{19}$ atoms/cm$^3$, lower than $2 \times 10^{18}$ atoms/cm$^3$, or lower than $2 \times 10^{17}$ atoms/cm$^3$ owing to the oxide layer 106b provided over the oxide semiconductor layer 106a; thus, deterioration of electrical characteristics due to copper is not caused. Thus, the degree of freedom of the process is increased, so that transistors can be manufactured with improved productivity.

Next, second heat treatment is preferably performed. The description of the first heat treatment can be referred to for the second heat treatment. The second heat treatment can remove impurities such as hydrogen and water from the multilayer film 106. Hydrogen easily moves especially in the multilayer film 106; thus, reducing hydrogen by the second heat treatment enables a transistor to have stable electrical characteristics. Note that water is a compound containing hydrogen and thus might serve as an impurity in the oxide semiconductor layer 106a.

Figure 6B:
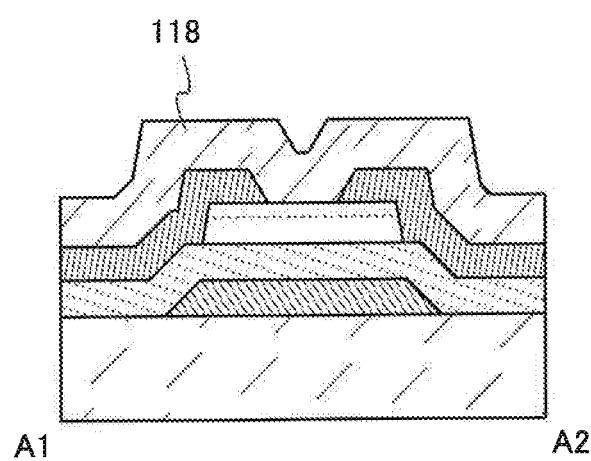

Next, the protective insulating film 118 is formed (see FIG. 6B). The protective insulating film 118 may be formed in such a manner that any of the insulating films given above as examples of the protective insulating film 118 is formed by a sputtering method, a CVD method, an MBE method, an ALD method, or a PLD method.

Here, the case where the protective insulating film 118 has a three-layer structure as illustrated in FIG. 1D is described. First, the first silicon oxide layer 118a is formed, and then the second silicon oxide layer 118b is formed. Next, treatment for adding oxygen ions to the second silicon oxide layer 118b may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, the silicon nitride layer 118c is formed. The protective insulating film 118 may be formed in the above manner.

The first silicon oxide layer 118a is preferably formed by a plasma CVD method which is one type of CVD method. Specifically, the first silicon oxide layer 118a may be formed by supplying high-frequency power to an electrode under the following conditions: the substrate temperature is higher than or equal to 180° C. and lower than or equal to 400° C., preferably higher than or equal to 200° C. and lower than or equal to 370° C., a deposition gas containing silicon and an oxidizing gas are used, and the pressure is higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content in the first silicon oxide layer 118a can be reduced and dangling bonds can be reduced.

In the above manner, the first silicon oxide layer 118a with low defect density is formed. That is, the spin density of the first silicon oxide layer 118a, which is attributed to a signal with a g factor of 2.001 in ESR, can be lower than or equal to $3 \times 10^{17}$ spins/cm$^3$ or lower than or equal to $5 \times 10^{16}$ spins/cm$^3$.

The second silicon oxide layer 118b is preferably formed by a plasma CVD method. Specifically, the second silicon oxide layer 118b may be formed by supplying high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$, to an electrode under the following conditions: the substrate temperature is higher than or equal to 160° C. and lower than or equal to 350° C., preferably higher than or equal to 180° C. and lower than or equal to 260° C., a deposition gas containing silicon and an oxidizing gas are used, and the pressure is higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the second silicon oxide layer 118b containing excess oxygen can be formed.

The silicon nitride layer 118c is preferably formed by a plasma CVD method. Specifically, the silicon nitride layer 118c may be formed by supplying high-frequency power under the following conditions: the substrate temperature is higher than or equal to 180° C. and lower than or equal to 400° C., preferably higher than or equal to 200° C. and lower than or equal to 370° C., a deposition gas containing silicon, a nitrogen gas, and an ammonia gas are used, and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of ammonia gas can promote decomposition of the deposition gas containing silicon and the nitrogen gas. This is because the ammonia gas is dissociated by plasma energy or heat energy, and energy generated by the dissociation contributes to decomposition of a bond of the deposition gas containing silicon and a bond of the nitrogen gas.

Through the above method, the silicon nitride layer 118c from which the hydrogen gas and the ammonia gas are less likely to be released can be formed. The silicon nitride layer 118c has low hydrogen content, and thus is dense and does not transmit or hardly transmit hydrogen, water, and oxygen.

Next, third heat treatment is preferably performed. The description of the first heat treatment can be referred to for the third heat treatment. By the third heat treatment, excess oxygen is released from the gate insulating film 112 and/or the protective insulating film 118; thus, oxygen vacancies in the multilayer film 106 can be reduced. Note that in the multilayer film 106, an oxygen vacancy captures an adjacent oxygen atom, so that the oxygen vacancy seems to move.

In the above manner, the BGTC transistor can be manufactured.

This transistor has stable electrical characteristics because oxygen vacancies in the oxide semiconductor layer 106a of the multilayer film 106 are reduced.

<1-2-1. Manufacturing Apparatus>

When the concentration of impurities in the oxide semiconductor layer 106a is low, electrical characteristics of a transistor are stable. Moreover, the oxide semiconductor layer 106a with high crystallinity has electrical characteristics more stable than those of the oxide semiconductor layer 106a with an amorphous structure. A film formation apparatus for forming the oxide semiconductor layer 106a with low impurity concentration and high crystallinity is described below.

First, a structure of a film formation apparatus which allows the entry of few impurities during film formation is described with reference to FIGS. 8A and 8B.

Figure 8A:
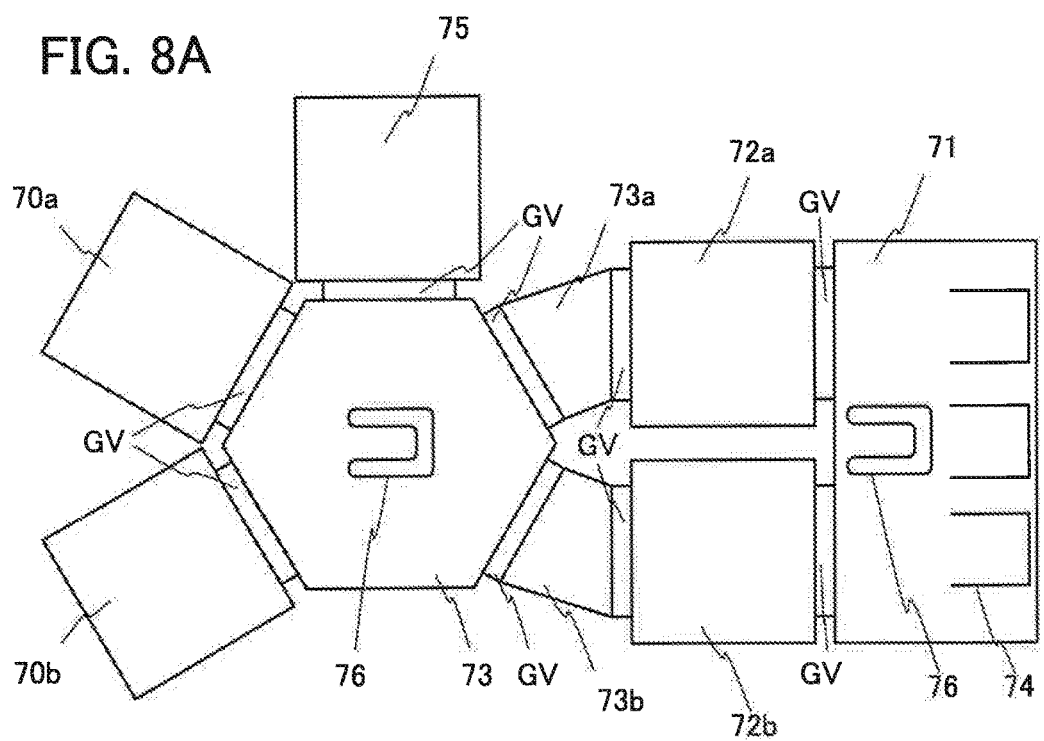
FIGS. 8A and 8B are top views illustrating examples of film formation apparatuses.

FIG. 8A is a top view of a multi-chamber film formation apparatus. The film formation apparatus includes an atmosphere-side substrate supply chamber 71 provided with three cassette ports 74 for holding substrates, a load lock chamber 72a, an unload lock chamber 72b, a transfer chamber 73, a transfer chamber 73a, a transfer chamber 73b, a substrate heating chamber 75, a film formation chamber 70a, and a film formation chamber 70b. The atmosphere-side substrate supply chamber 71 is connected to the load lock chamber 72a and the unload lock chamber 72b. The load lock chamber 72a and the unload lock chamber 72b are connected to the transfer chamber 73 through the transfer chambers 73a and 73b. The substrate heating chamber 75 and the film formation chambers 70a and 70b are connected to only the transfer chamber 73. Gate valves (GV) are provided for connecting portions between the chambers so that each chamber except the atmosphere-side substrate supply chamber 71 can be independently kept under vacuum. Moreover, the atmosphere-side substrate transfer chamber 71 and the transfer chamber 73 each include one or more substrate transfer robots 76, with which a substrate can be transferred. Here, it is preferable that the substrate heating chamber 75 also serve as a plasma treatment chamber, With a multi-chamber film formation apparatus, it is possible to transfer a substrate without exposure to the air between treatments, resulting in a reduction in adsorption of impurities to a substrate. In addition, the order of film formation, heat treatment, or the like can be freely determined. Note that the numbers of transfer chambers, film formation chambers, load lock chambers, unload lock chambers, and substrate heating chambers are not limited to the above, and can be determined as appropriate depending on the space for placement or the process.

Figure 8B:
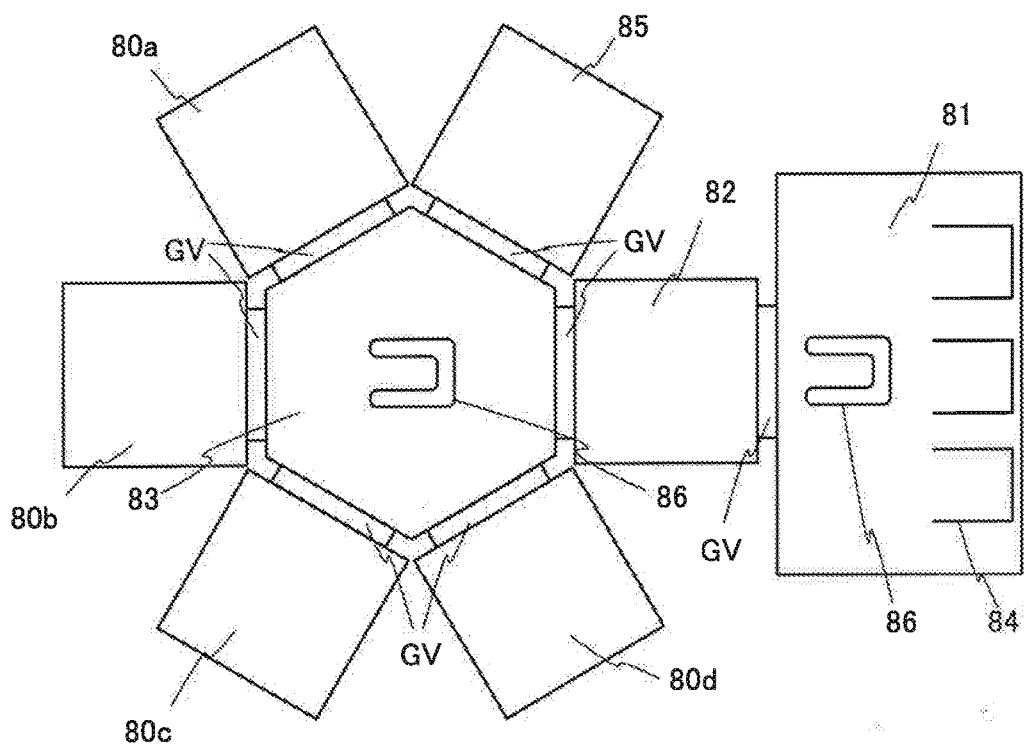

FIG. 8B is a top view of a multi-chamber film formation apparatus having a different structure from that illustrated in FIG. 8A. The film formation apparatus includes an atmosphere-side substrate supply chamber 81 provided with cassette ports 84, a load/unload lock chamber 82, a transfer chamber 83, a substrate heating chamber 85, and film formation chambers 80a, 80b, 80c, and 80d. The atmosphere-side substrate supply chamber 81, the substrate heating chamber 85, and the film formation chambers 80a, 80b, 80c, and 80d are connected to one another through the transfer chamber 83.

Gate valves (GV) are provided for connecting portions between the chambers so that each chamber except the atmosphere-side substrate supply chamber 81 can be independently kept under vacuum. Moreover, the atmosphere-side substrate transfer chamber 81 and the transfer chamber 83 each include one or more substrate transfer robots 86, with which a glass substrate can be transferred.

Here, the details of the film formation chamber (sputtering chamber) illustrated in FIG. 8B are described with reference to FIG. 9A. The film formation chamber 80b includes a target 87, an attachment protection plate 88, and a substrate stage 90. Note that here, a glass substrate 89 is placed on the substrate stage 90. Although not illustrated, the substrate stage 90 may include a substrate holding mechanism which holds the glass substrate 89, a rear heater which heats the glass substrate 89 from the back surface, or the like. The attachment protection plate 88 can suppress deposition of a particle which is sputtered from the target 87 on a region where deposition is not needed.

Figure 9A:
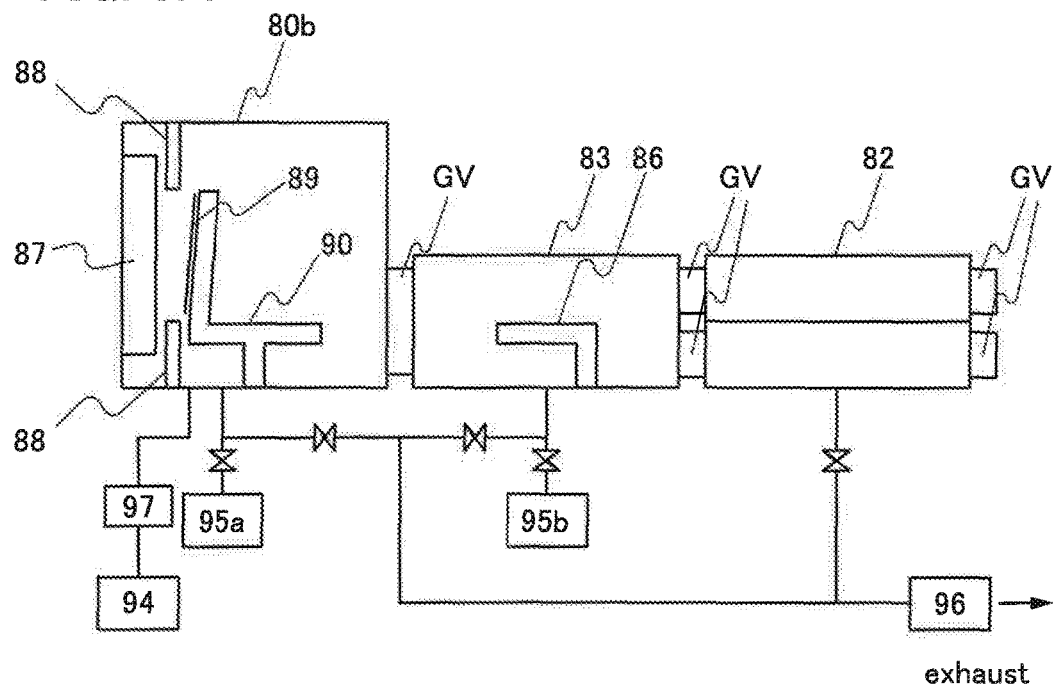
FIGS. 9A and 9B are cross-sectional views illustrating examples of film formation chambers.

The film formation chamber 80b illustrated in FIG. 9A is connected to the transfer chamber 83 through a gate valve, and the transfer chamber 83 is connected to the load/unload lock chamber 82 through a gate valve. The transfer chamber 83 provided with a substrate transfer robot 86 can deliver a glass substrate between the film formation chamber 80b and the load/unload lock chamber 82. The load/unload lock chamber 82 is divided into an upper part and a lower part in one vacuum chamber. One of the parts can be used as a load lock chamber and the other can be used as an unload lock chamber. This structure is preferably employed, in which case the installation area of a sputtering apparatus can be reduced.

The film formation chamber 80b illustrated in FIG. 9A is connected to a refiner 94 through a mass flow controller 97. Note that although the refiner 94 and the mass flow controller 97 are provided in accordance with the number of kinds of gases, only one refiner 94 and one mass flow controller 97 are illustrated for simplicity. As a gas introduced to the film formation chamber 80b or the like, a gas whose dew point is lower than or equal to −80° C., preferably lower than or equal to −100° C. is used. With the use of an oxygen gas, a rare gas (e.g., an argon gas), or the like whose dew point is low, moisture entering a film at the time of film formation can be reduced.

Moreover, the film formation chamber 80b illustrated in FIG. 9A is connected to a cryopump 95a through a valve. The transfer chamber 83 is connected to a cryopump 95b through a gate valve. The load/unload lock chamber 82 is connected to a vacuum pump 96 through a gate valve. The load lock chamber and the unload lock chamber of the load/unload lock chamber 82 may be individually connected to the vacuum pump 96. The film formation chamber 80b and the transfer chamber 83 are each connected to the vacuum pump 96 through the gate valve.

Note that the vacuum pump 96 may be, for example, a pump in which a dry pump and a mechanical booster pump are connected in series. With such a structure, the film formation chamber 80b and the transfer chamber 83 are evacuated from atmospheric pressure to a low vacuum (about 0.1 Pa to 10 Pa) by the vacuum pump 96, and then evacuated from the low vacuum to a high vacuum ($1 \times 10^{-4}$ Pa to $1 \times 10^{-7}$ Pa) by the cryopump 95a or 95b after the valves are switched.

Next, another example of the film formation chamber illustrated in FIG. 8B is described with reference to FIG. 9B.

Figure 9B:
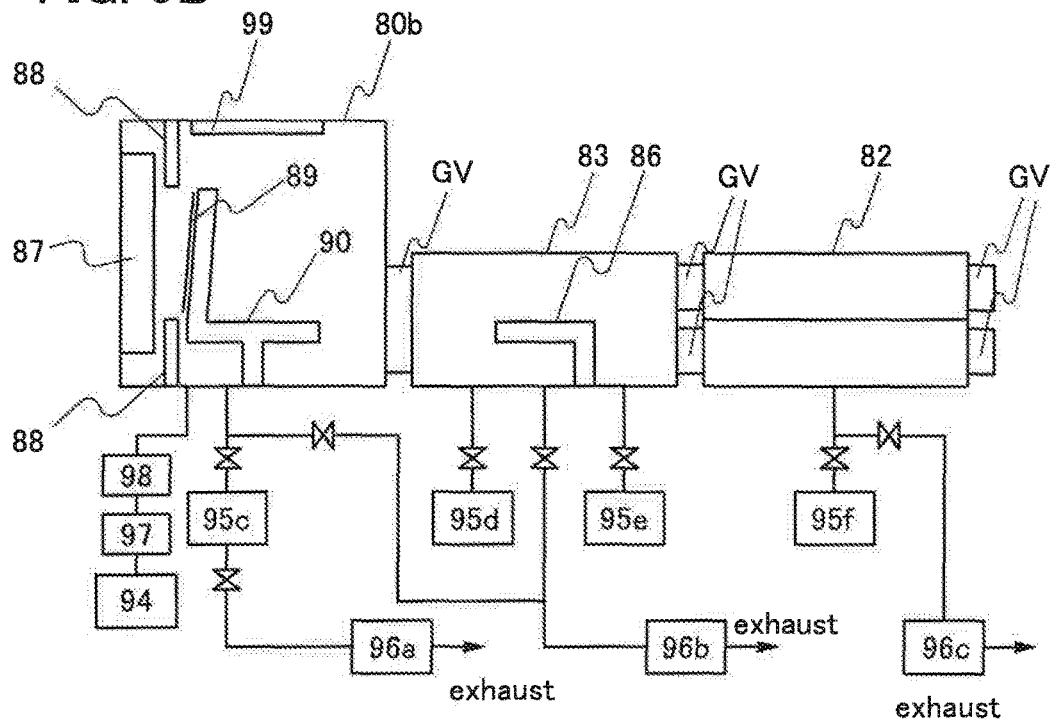

The film formation chamber 80b illustrated in FIG. 9B is connected to the transfer chamber 83 through the gate valve, and the transfer chamber 83 is connected to the load/unload lock chamber 82 through the gate valves.

The film formation chamber 80b in FIG. 9B is connected to the mass flow controller 97 through a gas heating system 98, and the gas heating system 98 is connected to the refiner 94 through the mass flow controller 97. With the gas heating system 98, a gas used in the film formation chamber 80b can be heated to higher than or equal to 40° C. and lower than or equal to 400° C., preferably higher than or equal to 50° C. and lower than or equal to 200° C. Note that although the gas heating systems 98, the refiner 94, and the mass flow controller 97 can be provided in accordance with the number of kinds of gases, only one gas heating system 98, one refiner 94, and one mass flow controller 97 are provided for simplicity.

The film formation chamber 80b illustrated in FIG. 9B is connected to a turbo molecular pump 95c and a vacuum pump 96b through valves. Note that as an auxiliary pump, a vacuum pump 96a is provided for the turbo molecular pump 95c through a valve. The vacuum pumps 96a and 96b may have structures similar to that of the vacuum pump 96.

In addition, the film formation chamber 80b illustrated in FIG. 9B is provided with a cryotrap 99.

It is known that the turbo molecular pump 95c is capable of stably evacuating a large-sized molecule (atom), needs low frequency of maintenance, and thus enables high productivity, whereas it has a low capability in evacuating hydrogen and water. Hence, the cryotrap 99 having a high capability in evacuating a molecule (atom) having a relatively high melting point, such as water, is connected to the film formation chamber 80b. The temperature of a refrigerator of the cryotrap 99 is set to lower than or equal to 100 K, preferably lower than or equal to 80 K. When the cryotrap 99 includes a plurality of refrigerators, the refrigerators preferably have different temperatures, in which case efficient evacuation can be performed. For example, the temperatures of a first-stage refrigerator and a second-stage refrigerator may be set to lower than or equal to 100 K and lower than or equal to 20 K, respectively.

The transfer chamber 83 illustrated in FIG. 9B is connected to the vacuum pump 96b and cryopumps 95d and 95e through valves. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules (atoms) entrapped in the cryopump. When molecules (atoms) are entrapped too much in a cryopump, the evacuation capability of the cryopump is lowered; therefore, regeneration is performed regularly.

The load/unload lock chamber 82 illustrated in FIG. 9B is connected to a cryopump 95f and a vacuum pump 96c through valves. Note that the vacuum pump 96c may have a structure similar to that of the vacuum pump 96.

In the film formation chamber 80b, a target-facing-type sputtering apparatus may be employed.

Note that a parallel-plate-type sputtering device or an ion beam sputtering apparatus may be provided in the film formation chamber 80b.

Next, an evacuation example of the substrate heating chamber illustrated in FIG. 8B is described with reference to FIG. 10.

Figure 10:
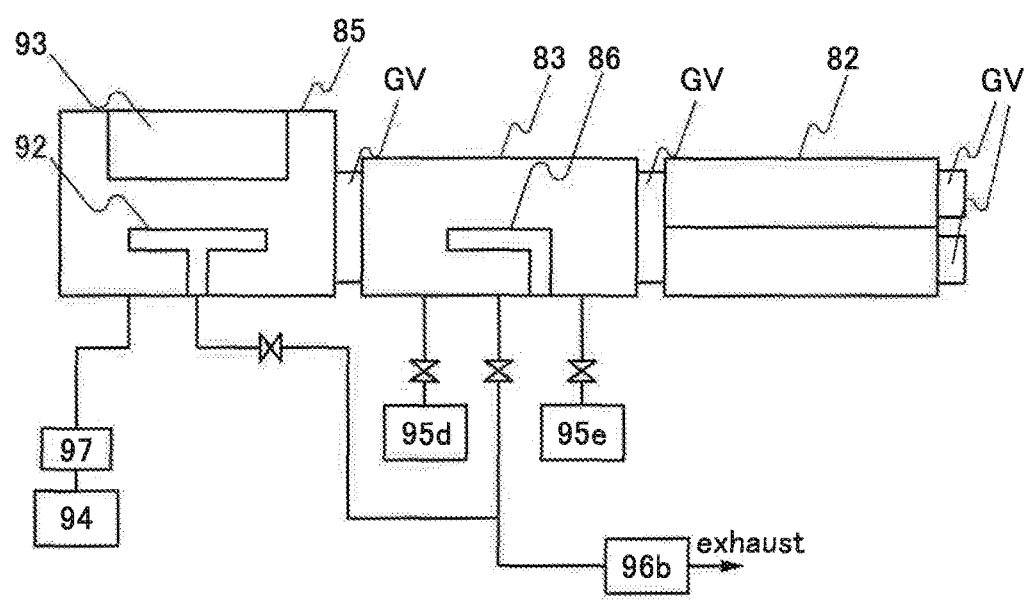
FIG. 10 is a cross-sectional view illustrating an example of a heat treatment chamber.

The substrate heating chamber 85 illustrated in FIG. 10 is connected to the transfer chamber 83 through a gate valve. The transfer chamber 83 is connected to the load/unload lock chamber 82 through a gate valve. Note that the load/unload lock chamber 82 has a structure similar to that illustrated in. FIG. 9A or 9B.

The substrate heating chamber 85 illustrated in FIG. 10 is connected to the refiner 94 through the mass flow controller 97. Note that although the refiner 94 and the mass flow controller 97 are provided in accordance with the number of kinds of gases, only one refiner 94 and one mass flow controller 97 are illustrated for simplicity. In addition, the substrate heating chamber 85 is connected to the vacuum pump 96b through a valve.

Moreover, the substrate heating chamber 85 includes a substrate stage 92. It is only necessary that the substrate stage 92 is capable of placement of at least one substrate. The substrate stage 92 may be one capable of placement of a plurality of substrates. The substrate heating chamber 85 also includes a heating mechanism 93. The heating mechanism 93 may be, for example, a heating mechanism using a resistance heater or the like for heating. Alternatively, a heating mechanism in which heating is performed by heat conduction or heat radiation from a medium such as a heated gas may be employed. For example, a rapid thermal annealing (RTA) apparatus such as a gas rapid thermal annealing (GRTA) apparatus or a lamp rapid thermal annealing (LRTA) apparatus can be employed. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as the gas.

Note that the back pressure of each of the film formation chamber 80b and the substrate heating chamber 85 is lower than or equal to $1\times10^{-4}$ Pa, preferably lower than or equal to $3\times10^{-5}$ Pa, more preferably lower than or equal to $1\times10^{-5}$ Pa.

In each of the film formation chamber 80b and the substrate heating chamber 85, the partial pressure of a gas molecule (atom) having a mass-to-charge ratio (m/z) of 18 is lower than or equal to $3\times10^{-5}$ Pa, preferably lower than or equal to $1\times10^{-5}$ Pa, more preferably lower than or equal to $3\times10^{-6}$ Pa.

Moreover, in each of the film formation chamber 80b and the substrate heating chamber 85, the partial pressure of a gas molecule (atom) having a mass-to-charge ratio (m/z) of 28 is lower than or equal to $3\times10^{-5}$ Pa, preferably lower than or equal to $1\times10^{-5}$ Pa, more preferably lower than or equal to $3\times10^{-6}$ Pa.

Moreover in each of the film formation chamber 80b and the substrate heating chamber 85, the partial pressure of a gas molecule (atom) having a mass-to-charge ratio (m/z) of 44 is lower than or equal to $3\times10^{-5}$ Pa, preferably lower than or equal to $1\times10^{-5}$ Pa, more preferably lower than or equal to $3\times10^{-6}$ Pa.

Further, in each of the film formation chamber 80b and the substrate heating chamber 85, the leakage rate is less than or equal to $3\times10^{-6}$ Pa·m³/s, preferably less than or equal to $1\times10^{-6}$ Pa·m³/s.

In each of the film formation chamber 80b and the substrate heating chamber 85, the leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s.

In each of the film formation chamber 80b and the substrate heating chamber 85, the leakage rate of a gas molecule (atom) having a mass-to-charge ratio (m/z) of 28 is less than or equal to $1\times10^{-5}$ Pa·m³/s, preferably less than or equal to $1\times10^{-6}$ Pa·m³/s.

Moreover, in each of the film formation chamber 80b and the substrate heating chamber 85, the leakage rate of a gas molecule (atom) having a mass-to-charge ratio (m/z) of 44 is less than or equal to $3\times10^{-6}$ Pa·m³/s, preferably less than or equal to $1\times10^{-6}$ Pa·m³/s.

Note that the total pressure and the partial pressure in the vacuum chambers such as the film formation chamber, the substrate heating chamber, and the transfer chamber can be measured using a mass analyzer. For example, Qulee CGM-051, a quadrupole mass analyzer (also referred to as Q-mass) manufactured by ULVAC, Inc. can be used. Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be less than or equal to the above value.

For example, an open/close portion of the film formation chamber is preferably sealed with a metal gasket. For the metal gasket, metal covered with an iron fluoride, an aluminum oxide, or a chromium oxide is preferably used. The metal gasket realizes higher adhesion than an O-ring, and can reduce the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the deposition apparatus, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the released gas can be reduced.

Alternatively, the above-mentioned member of the film formation apparatus may be covered with iron fluoride, aluminum oxide, chromium oxide, or the like.

The member of the film formation apparatus is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

In the case where the refiner is provided just before a deposition gas is introduced, the length of a pipe between the refiner and the film formation chamber is less than or equal to 10 m, preferably less than or equal to 5 m, further preferably less than or equal to 1 m. When the length of the pipe is less than or equal to 10 m, less than or equal to 5m, or less than or equal to 1 m, the effect of the release of gas from the pipe can be reduced accordingly.

Furthermore, as the pipe for the film formation gas, a metal pipe the inside of which is covered with iron fluoride, aluminum oxide, chromium oxide, or the like is preferably used. With the above pipe, the amount of released gas containing impurities is made small and the entry of impurities into the deposition gas can be reduced as compared with a SUS316L-EP pipe, for example. Further, a high-performance ultra-compact metal gasket joint (a UPG joint) is preferably used as a joint of the pipe. A structure where all the materials of the pipe are metal is preferably employed, in which case the effect of the generated released gas or the external leakage can be reduced compared with a structure where resin or the like is used.

When an adsorbate is present in the film formation chamber, the adsorbate does not affect the pressure in the film formation chamber because it is adsorbed onto an inner wall or the like; however, the adsorbate causes gas to be released when the inside of the film formation chamber is evacuated. Therefore, although there is no correlation between the leakage rate and the evacuation rate, it is important that the adsorbate present in the film formation chamber be desorbed as much as possible and evacuation be performed in advance with the use of a pump with high evacuation capability. Note that the film formation chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced to the film formation chamber, the film formation rate of water or the like, which is difficult to be desorbed simply by evacuation, can be further increased. Note that the rate of desorption of the adsorbate can be further increased by heating of the inert gas at substantially the same temperature as the temperature of the baking. Here, a rare gas is preferably used as the inert gas. Depending on the kind of a film to be formed, oxygen or the like may be used instead of an inert gas. For example, in the case of forming an oxide semiconductor layer, using oxygen, which is the main component of the oxide, is preferable in some cases.

Alternatively, treatment for evacuating the inside of the film formation chamber is preferably performed a certain period of time after heated oxygen, a heated inert gas such as a heated rare gas, or the like is introduced to increase a pressure in the film formation chamber. The introduction of the heated gas can desorb the adsorbate in the film formation chamber, and the impurities present in the film formation chamber can be reduced. Note that an advantageous effect can be achieved when this treatment is repeated greater than or equal to twice and less than or equal to 30 times, preferably greater than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the film formation chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the film formation chamber is evacuated for longer than or equal to 5 minutes and shorter than or equal to 300 minutes, preferably longer than or equal to 10 minutes and shorter than or equal to 120 minutes.

The rate of desorption of the adsorbate can be further increased also by dummy film formation. Here, the dummy film formation refers to film formation on a dummy substrate by sputtering or the like, in which a film is formed on the dummy substrate and the inner wall of the film formation chamber so that impurities in the film formation chamber and an adsorbate on the inner wall of the film formation chamber are confined in the film. As the dummy substrate, a substrate which releases a smaller amount of gas is preferably used, and for example, a substrate similar to the substrate 100 described later may be used. By performing dummy film formation, the concentration of impurities in a film to be formed later can be reduced. Note that the dummy film formation may be performed at the same time as the baking of the film formation chamber.

An oxide semiconductor layer is formed with the use of the above film formation apparatus, so that the entry of impurities into the oxide semiconductor layer can be suppressed. Further, a film in contact with the oxide semiconductor layer is formed with the use of the above film formation apparatus, so that the entry of impurities into the oxide semiconductor layer from the film in contact therewith can be suppressed.

Next, a method for forming the oxide semiconductor layer 106a and the oxide layer 106b with the use of the above film formation apparatus is described.

The surface temperature of the target is set to lower than or equal to 100° C., preferably lower than or equal to 50° C., more preferably about room temperature (typically, 20° C. or 25° C.). In a sputtering apparatus for a large substrate, a large target is often used. However, it is difficult to form a target for a large substrate without a juncture. In fact, a plurality of targets are arranged with as few spaces as possible to obtain a large shape; however, a tiny space is inevitably generated. When the surface temperature of the target increases, in some cases, Zn or the like is volatilized from such a tiny space, and the space might expand gradually. When the space expands, a metal of a backing plate or a metal used for adhesion might be sputtered and cause an increase in impurity concentration. Thus, it is preferable that the target be cooled sufficiently.

Specifically, for the hacking plate, a metal having high conductivity and a high heat dissipation property (specifically Cu) is used. The target can be cooled efficiently by making a sufficient amount of cooling water flow through a water channel which is formed in the backing plate. Here, the sufficient amount of cooling water, which depends on the size of the target, is set to greater than or equal to 3 L/min, greater than or equal to 5 L/min, or greater than or equal to 10 L/min in the case of, for example, a circular target whose diameter is 300 mm.

The oxide semiconductor layer 106a is formed in an oxygen gas atmosphere at a substrate heating temperature higher than or equal to 100° C. and lower than or equal to 600° C., preferably higher than or equal to 150° C. and lower than or equal to 550° C., more preferably higher than or equal to 200° C. and lower than or equal to 500° C. The concentration of impurities in the oxide semiconductor layer 106a decreases as the substrate heating temperature in film formation increases. Further, migration of sputtered particles on a deposition surface is likely to occur; thus, the atomic arrangement is ordered and the density is increased, so that the oxide semiconductor layer 106a with high crystallinity is formed. Furthermore, when the film formation is performed in the oxygen gas atmosphere, plasma damage is alleviated and a surplus atom such as a rare gas atom is not contained in the oxide semiconductor layer 106a, whereby the oxide semiconductor layer 106a with high crystallinity is formed. Note that the film formation may be performed in a mixed atmosphere containing an oxygen gas and a rare gas. In that case, the percentage of an oxygen gas is set to greater than or equal to 30 vol. %, preferably greater than or equal to 50 vol. %, more preferably greater than or equal to 80 vol. %.

Note that in the case where the target includes Zn, plasma damage is alleviated by the film formation in an oxygen gas atmosphere; thus, the oxide semiconductor layer 106a in which Zn is unlikely to be volatilized can be obtained.

The substrate is transferred to the film formation chamber, a deposition gas is introduced to the film formation chamber, the film formation pressure is set to lower than or equal to 0.8 Pa, preferably lower than or equal to 0.4 Pa, and the substrate is held under the pressure for longer than or equal to 10 seconds and shorter than or equal to 1000 seconds, preferably longer than or equal to 15 seconds and shorter than or equal to 720 seconds in order to stabilize the pressure, and then the formation of the oxide semiconductor layer 106a is performed. The substrate is held for the above period of time in order to stabilize the pressure, whereby the amount of impurities entering the oxide semiconductor layer 106a during the formation can be reduced. At this time, the distance between the target and the substrate is set to less than or equal to 40 mm, preferably less than or equal to 25 mm. When the oxide semiconductor layer 106a is formed under the above conditions, the frequency of the collision between a sputtered particle and another sputtered particle, a gas molecule, or an ion can be reduced. That is, depending on the film formation pressure, the distance between the target and the substrate is made shorter than the mean free path of a sputtered particle, a gas molecule, or an ion, so that the concentration of impurities entering the film can be reduced.

For example, when the pressure is 0.4 Pa and the temperature is 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, an methane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm. Note that doubling of the pressure halves a mean free path and doubling of the absolute temperature doubles a mean free path.

The mean free path depends on pressure, temperature, and the diameter of a molecule (atom). In the case where pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter and the crystallinity is lowered due to the large diameter of the molecule (atom) when the molecule (atom) enters the film. For this reason, it can be said that, for example, a molecule (atom) whose diameter is larger than that of Ar is likely to behave as an impurity which decreases the crystallinity.

Next, the oxide layer 106b is formed. The oxide layer 106b is formed in an oxygen atmosphere with a substrate heating temperature higher than or equal to room temperature (25° C.) and lower than or equal to 600° C., preferably higher than or equal to 70° C. and lower than or equal to 550° C., more preferably higher than or equal to 100° C. and lower than or equal to 500° C. As the heating temperature during the formation is higher, the concentration of impurities in the oxide layer 106b is lower. Further, migration of sputtered particles on a deposition surface is likely to occur; thus, the atomic arrangement is ordered and the density is increased, so that the crystallinity of the oxide layer 106b becomes high. Furthermore, when the film formation is performed in an oxygen gas atmosphere, plasma damage is alleviated and a surplus atom such as a rare gas atom is not contained in the oxide layer 106b, whereby the oxide layer 106b with high crystallinity is formed. Note that the film formation may be performed in a mixed atmosphere containing an oxygen gas and a rare gas. In that case, the percentage of an oxygen gas is set to greater than or equal to 30 vol. %, preferably greater than or equal to 50 vol. %, further preferably greater than or equal to 80 vol. %. The substrate is transferred to the film formation chamber, the deposition gas is introduced to the film formation chamber, the film formation pressure is set to lower than or equal to 0.8 Pa, preferably lower than or equal to 0.4 Pa, the substrate is held under the pressure for longer than or equal to 10 seconds and shorter than or equal to 1000 seconds, preferably longer than or equal to 15 seconds and shorter than or equal to 720 seconds in order to stabilize the pressure, and then the formation of the oxide layer 106b is performed. The pressure is held for the above period of time in order to stabilize the pressure, whereby the amount of impurities entering the oxide layer 106b during the formation can be reduced.

Next, heat treatment is performed. The heat treatment is performed under reduced pressure or in an inert atmosphere or an oxidation atmosphere. By the heat treatment, the concentration of impurities in the oxide semiconductor layer 106a can be reduced.

The heat treatment is preferably performed in such a manner that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the concentration of impurities in the oxide semiconductor layer 106a can be reduced; however, oxygen vacancies are caused at the same time. By the heat treatment in an oxidation atmosphere, the caused oxygen vacancies can be reduced.

When heat treatment is performed on the oxide semiconductor layer 106a in addition to the substrate heating at the time of the formation, the concentration of impurities in the layer can be reduced.

Specifically, the concentration of hydrogen in the oxide semiconductor layer 106a, which is measured by SIMS, can be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

The concentration of nitrogen in the oxide semiconductor layer 106a, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in the oxide semiconductor layer 106a, which is measured by SIMS, can be lower than $5\times10^{19}$ atoms/cm$^3$, preferably lower than or equal to $5\times10^{18}$ atoms/cm$^3$, more preferably lower than or equal to $2\times10^{18}$ atoms/cm$^3$, still more preferably lower than or equal to $5\times10^{17}$ atoms/cm$^3$.

The amount of each of the following gas molecules (atoms) released from the oxide semiconductor layer 106a can be less than or equal to $1\times10^{19}$/cm$^3$, preferably less than or equal to $1\times10^{18}$/cm$^3$, which is measured by TDS analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

A measurement method of the amount of released oxygen atoms, which is described later, is referred to for a measurement method of the release amount using TDS analysis.

The oxide semiconductor layer 106a and the oxide layer 106b are formed as described above, whereby the crystallinity of the oxide semiconductor layer 106a can be increased, and the concentrations of impurities in the oxide semiconductor layer 106a and the oxide layer 106b and at the interface between the oxide semiconductor layer 106a and the oxide layer 106b can be reduced.

<1-3. Transistor Structure (2)>

In this section, a top-gate transistor is described. Here, a top-gate top-contact (TGTC) transistor, which is one kind of top-gate transistor, is described with reference to FIGS. 11A to 11C.

Figure 11A:
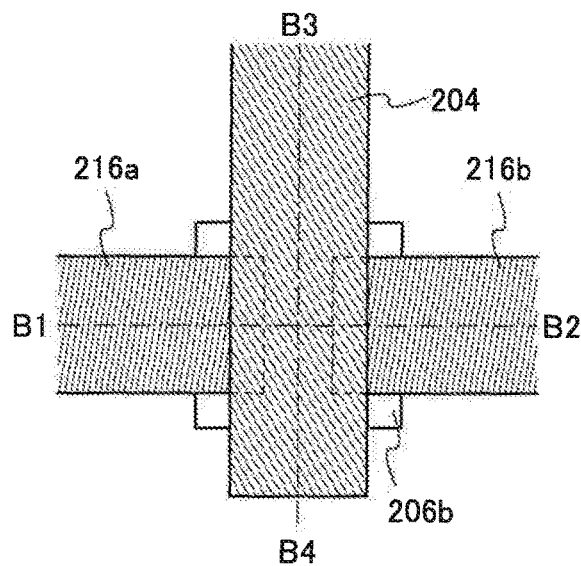
FIGS. 11A to 11C are a top view and cross-sectional views illustrating a semiconductor device of one embodiment of the present invention.
Figure 11C:
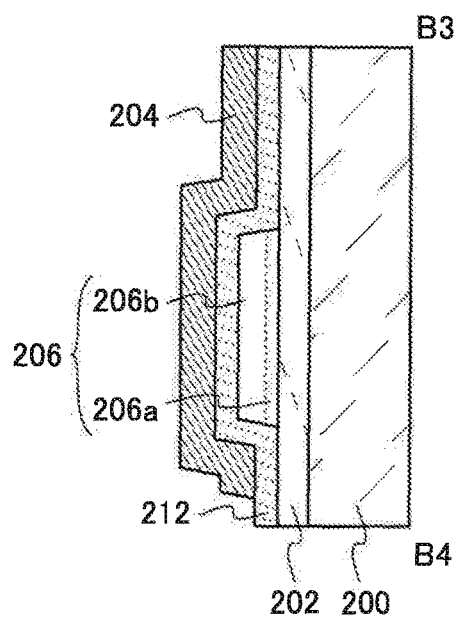
Figure 11B:
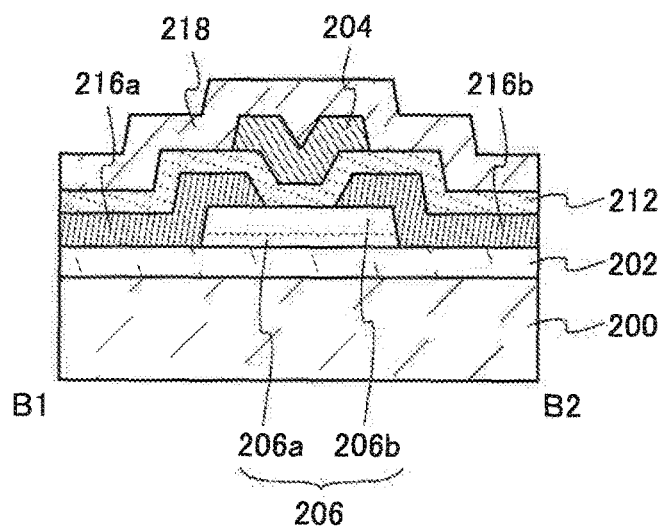

FIGS. 11A to 11C are a top view and cross-sectional views of the TGTC transistor. FIG. 11A is the top view of the transistor. FIG. 11B is the cross-sectional view taken along dashed-dotted line B1-B2 in FIG. 11A. FIG. 11C is the cross-sectional view taken along dashed-dotted line B3-B4 in FIG. 11A.

The transistor illustrated in FIG. 11B includes a base insulating film 202 over a substrate 200; a multilayer film 206 including an oxide layer 206a over the base insulating film 202 and an oxide semiconductor layer 206b over the oxide layer 206a; a source electrode 216a and a drain electrode 216b over the base insulating film 202 and the multilayer film 206; a gate insulating film 212 over the multilayer film 206, the source electrode 216a, and the drain electrode 216b; a gate electrode 204 over the gate insulating film 212; and a protective insulating film 218 over the gate insulating film 212 and the gate electrode 204. Note that the transistor does not necessarily include the base insulating film 202 and/or the protective insulating film 218.

Depending on the kind of conductive film used for the source electrode 216a and the drain electrode 216b, oxygen is taken away from part of the oxide semiconductor layer 206b, or a mixed layer is formed, so that a source region and a drain region are formed in the oxide semiconductor layer 2.06b.

In FIG. 11A, the distance between the source electrode 216a and the drain electrode 216b in a region overlapping with the gate electrode 204 is referred to as a channel length. Note that in the case where the transistor includes the source region and the drain region, the distance between the source region and the drain region in the region overlapping with the gate electrode 204 may be referred to as a channel length.

Note that a channel formation region refers to a region which overlaps with the gate electrode 204 and is located between the source electrode 216a and the drain electrode 216b when seen from above in the multilayer film 206. Further, a channel region refers to a region through which current mainly flows in the channel formation region. Here, the channel region is a portion of the oxide semiconductor layer 206b in the channel formation region.

For the multilayer film 206, the description of the multilayer film 106 is referred to. Specifically, for the oxide layer 206a, the description of the oxide layer 106b is referred to, and for the oxide semiconductor layer 206b, the description of the oxide semiconductor layer 106a is referred to.

For the substrate 200, the description of the substrate 100 is referred to. For the source electrode 216a and the drain electrode 216b, description of the source electrode 116a and the drain electrode 116b is referred. For the gate insulating film 212, the description of the gate insulating film 112 is referred to. For the gate electrode 204, the description of the gate electrode 104 is referred to. For the protective insulating film 218, the description of the protective insulating film 118 is referred to.

Although the edge of the multilayer film 206 is located on the outer side than the edge of the gate electrode 204 in FIG. 11A, the edge of the multilayer film 206 may be located on the inner side than the edge of the gate electrode 204 in order to suppress generation of carriers in the multilayer film 206 due to light.

The base insulating film 202 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 202 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits hydrogen, water, and oxygen is used.

The base insulating film 202 may be, for example, a multilayer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits hydrogen, water, and oxygen is used.

In the case where at least one of the gate insulating film 212 and the base insulating film 202 contains excess oxygen, oxygen vacancies in the oxide semiconductor layer 206b can be reduced.

In the above transistor, the channel is formed in the oxide semiconductor layer 206b of the multilayer film 206; thus, the transistor has stable electrical characteristics and high field-effect mobility.

<1-4. Method for Manufacturing Transistor with Structure (2)>

A method for manufacturing the transistor is described here with reference to FIGS. 12A to 12C and FIGS. 13A and 13B.

First, the substrate 200 is prepared.

Next, an oxide layer to be the oxide layer 206a is formed. For the method for forming the oxide layer to be the oxide layer 206a, the description of the method for forming the oxide layer to be the oxide layer 106b is referred to. Note that the oxide layer 206a is formed so as to be a CAAC-OS layer or an amorphous oxide semiconductor layer. When the oxide layer 206a is a CAAC-OS layer or an amorphous oxide semiconductor layer, an oxide semiconductor layer to be the oxide semiconductor layer 206b easily becomes a CAAC-OS layer.

Next, an oxide semiconductor layer to be the oxide semiconductor layer 206b is formed. For the method for forming the oxide semiconductor layer to be the oxide semiconductor layer 206b, the description of the method for forming the oxide semiconductor layer 106a is referred to.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, further preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate desorbed oxygen. By the first heat treatment, the crystallinity of the oxide semiconductor layer to be the oxide semiconductor layer 206b can be improved, and in addition, impurities such as hydrogen and water can be removed from the base insulating film 202, the oxide layer to be the oxide layer 206a and/or the oxide semiconductor layer to be the oxide semiconductor layer 206b.

Figure 12A:
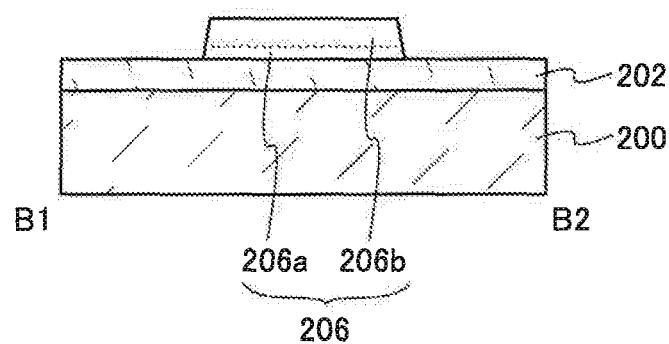
FIGS. 12A to 12C are cross-sectional views illustrating a method for manufacturing a semiconductor device of one embodiment of the present invention.

Next, the oxide layer to the oxide layer 206a and the oxide semiconductor layer to be the oxide semiconductor layer 206b are partly etched to form the multilayer film 206 including the oxide layer 206a and the oxide semiconductor layer 206b (see FIG. 12A).

Next, a conductive film to be the source electrode 216a and the drain electrode 216b is formed. For the method for forming the conductive film to be the source electrode 216a and the drain electrode 216b, the description of the method for forming the conductive film to be the source electrode 116a and the drain electrode 116b is referred to.

Figure 12B:
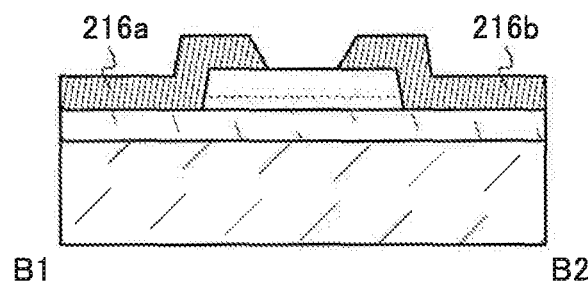

Next, the conductive film to be the source electrode 216a and the drain electrode 216b is partly etched to form the source electrode 216a and the drain electrode 216b (see FIG. 12B).

Next, second heat treatment is preferably performed. For the second heat treatment, the description of the first heat treatment can be referred to. By the second heat treatment, impurities such as hydrogen and water can be removed from the multilayer film 206.

Figure 12C:
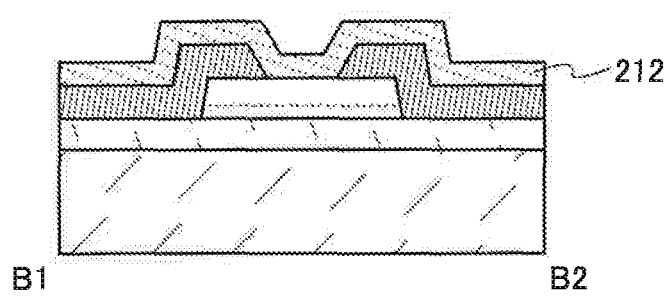

Next, the gate insulating film 212 is formed (see FIG. 12C). For the method for forming the gate insulating film 212, the description of the method for forming the gate insulating film 112 is referred to.

Next, a conductive film to be the gate electrode 204 is formed. For the method for forming the conductive film to be the gate electrode 204, the description of the method for forming the conductive film to be the gate electrode 104 is referred to.

Figure 13A:
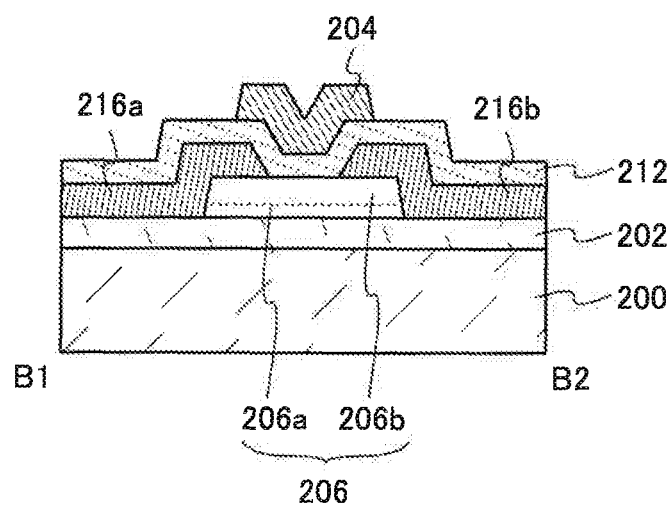
FIGS. 13A and 13B are cross-sectional views illustrating a method for manufacturing a semiconductor device of one embodiment of the present invention.

Next, the conductive film to be the gate electrode 204 is partly etched to form the gate electrode 204 (see FIG. 13A).

Figure 13B:
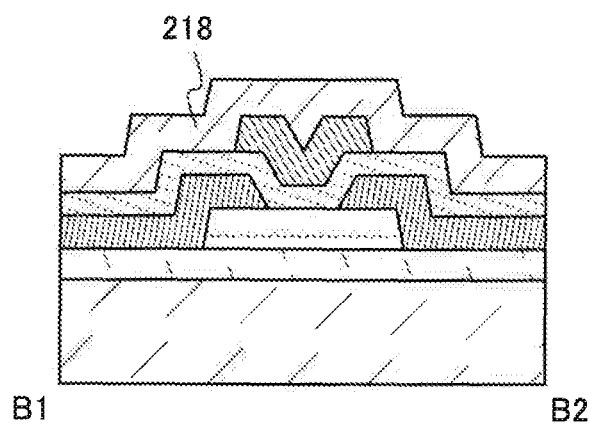

Next, the protective insulating film 218 is formed (see FIG. 13B). For the method for forming the protective insulating film 218, the description of the method for forming the protective insulating film 118 is referred to.

In the above manner, the transistor can be manufactured.

This transistor has stable electrical characteristics because oxygen vacancies in the oxide semiconductor layer 206b of the multilayer film 206 are reduced.

<2. Application Product>

Application products using the above transistor are described below.

<2-1. Display Device>

In this section, a display device to which the above transistor is applied is described.

As a display element provided in the display device, a liquid crystal element (also referred to as a liquid crystal display element), a light-emitting element (also referred to as a light-emitting display element) or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. A display device including an EL element and a display device including a liquid crystal element are described below as examples of the display device.

The display device described below includes, in its category, a panel in which a display element is sealed and a module in which an IC such as a controller is mounted on the panel.

The display device described below refers to an image display device or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

<2-1-1. EL display device>

First, a display device including an EL element (also called an EL display device) is described.

Figure 14:
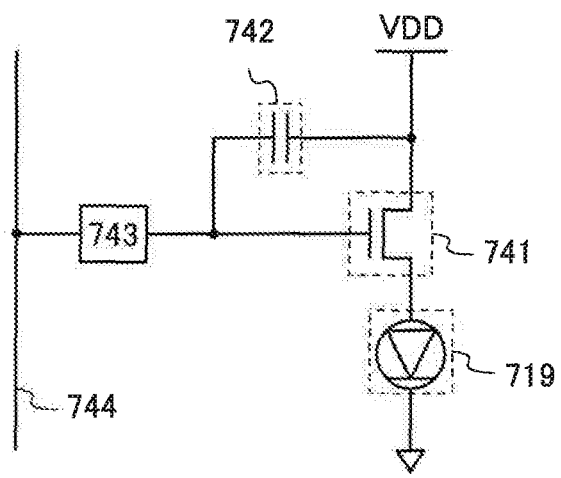
FIG. 14 is a circuit diagram illustrating an example of an EL display device of one embodiment of the present invention.

FIG. 14 is an example of a circuit diagram of a pixel in the EL display device.

The EL display device illustrated in FIG. 14 includes a switching element 743, a transistor 741, a capacitor 742, and a light-emitting element 719.

A gate of the transistor 741 is electrically connected to one terminal of the switching element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switching element 743 is electrically connected to a signal line 744. The other terminal of the light-emitting element 719 is supplied with a fixed potential. Note that the fixed potential is a ground potential GND or lower.

Note that as the transistor 741, any of the above transistors each of which includes the multilayer film including the oxide semiconductor layer is used. The transistor has stable electrical characteristics. Thus, the EL display device can have high display quality.

As the switching element 743, a transistor is preferably used. When the transistor is used as the switching element, the area of a pixel can be reduced, so that the EL display device can have high resolution. Alternatively, any of the above transistors each of which includes the multilayer film including the oxide semiconductor layer may be used as the switching element 743. When any of the above transistors is used as the switching element 743, the switching element 743 can be formed in the same process as the transistor 741, so that the productivity of the EL display device can be improved.

Figure 15A:
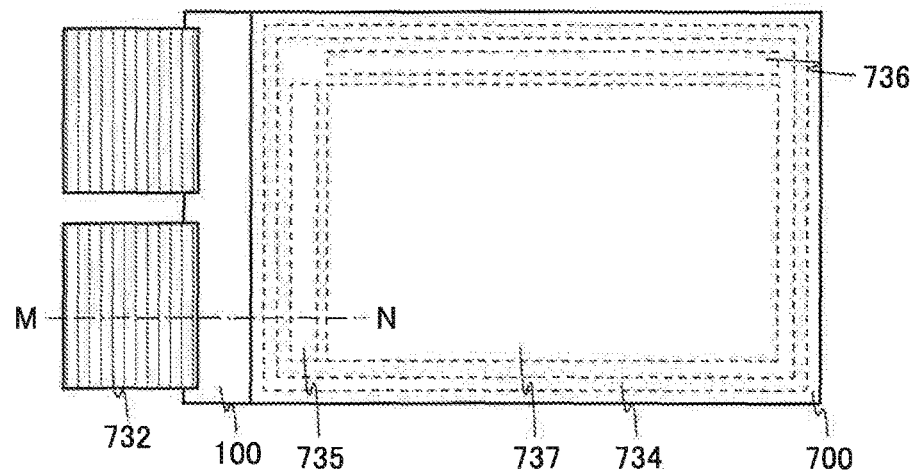
FIGS. 15A to 15C are a top view and cross-sectional views illustrating an example of an EL display device of one embodiment of the present invention.

FIG. 15A is a top view of an EL display device. The EL display device includes a substrate 100, a substrate 700, a sealant 734, a driver circuit 735, a driver circuit 736, a pixel 737, and an FPC 732. The sealant 734 is provided between the substrate 100 and the substrate 700 so as to surround the pixel 737, the driver circuit 735 and the driver circuit 736. Note that the driver circuit 735 and/or the driver circuit 736 may be provided outside the sealant 734.

Figure 15B:
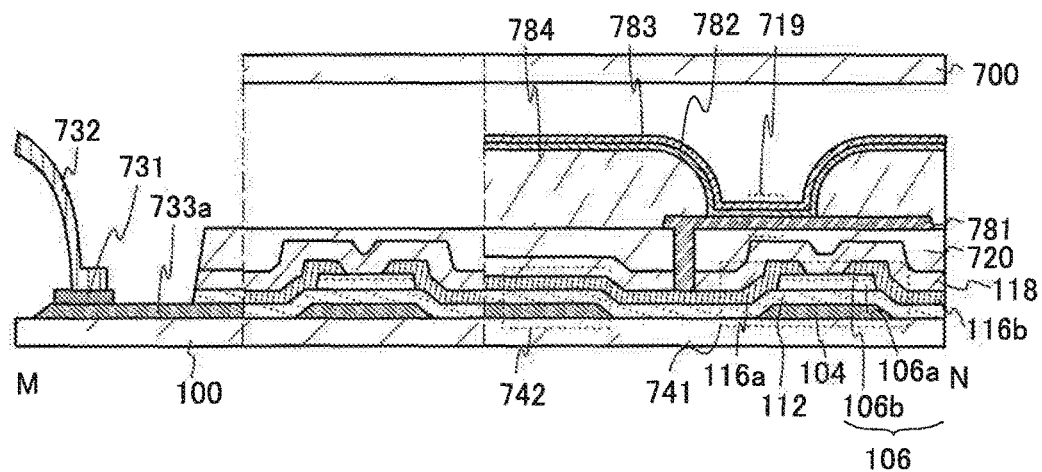

FIG. 15B is a cross-sectional view of the EL display device taken along dashed-dotted line M-N in FIG. 15A. The FPC 732 is connected to a wiring 733a via a terminal 731. Note that the wiring 733a is formed in the same layer as the gate electrode 104.

Note that FIG. 15B shows an example in which a transistor 741 and a capacitor 742 are provided in the same plane. With such a structure, the capacitor 742 can be formed in the same plane as a gate electrode, a gate insulating film, and a source electrode (drain electrode), which are included in the transistor 741. When the transistor 741 and the capacitor 742 are provided in the same plane in this manner, the number of manufacturing steps of the EL display device can be reduced; thus the productivity can be improved.

FIG. 15B illustrates an example in which the transistor illustrated in FIGS. 1A to 1C is used as the transistor 741. Therefore, for components of the transistor 741 which are not particularly described below, the description on FIGS. 1A to 1C is referred to.

An insulating film 720 is provided over the transistor 741 and the capacitor 742.

Here, an opening reaching the source electrode 116a of the transistor 741 is provided in the insulating film 720 and the protective insulating film 118.

An electrode 781 is provided over the insulating film 720. The electrode 781 is connected to the source electrode 116a of the transistor 741 through the opening provided in the insulating film 720 and the protective insulating film 118.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that for the insulating film 720, the description of the protective insulating film 118 is referred to. Alternatively, a resin film of a polyimide resin, an acrylic resin, an epoxy resin, a silicone resin, or the like may be used.

Figure 15C:
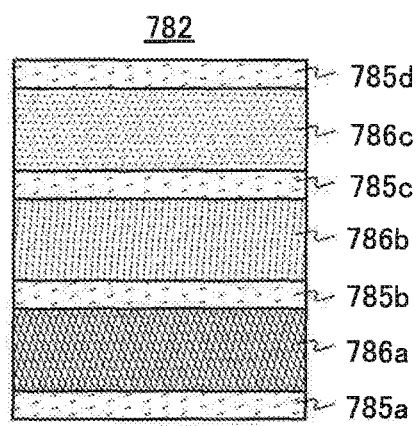

The light-emitting layer 782 is not limited to a single layer, and may be a stack of plural kinds of light-emitting layers and the like. For example, a structure illustrated in FIG. 15C may be employed. FIG. 15C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 719 with a high color rendering property or higher emission efficiency can be formed.

Plural kinds of light-emitting materials may be stacked to obtain white light. Although not illustrated in FIG. 15B, white light may be extracted through coloring layers.

Although the structure in which three light-emitting layers and four intermediate layers are provided is shown here, the structure is not limited thereto. The number of light-emitting layers and the number of intermediate layers can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Further, the intermediate layer may have a stacked-layer structure including a hole-injection layer, a hole-transport layer, an electron-transport layer, an electron-injection layer, or the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 can be formed using a conductive film having visible light permeability. Having visible light permeability means to have an average transmittance of 70% or more, particularly 80% or more in the visible light region (e.g., the range of wavelength of from 400 nm to 800 nm).

As the electrode 781, for example, an oxide film such as an In—Zn—W-based oxide film, an In—Sn-based oxide film, an In—Zn-based oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used. For example, an Ag film, an Mg film, or an Ag-Mg alloy film with a thickness of 5 nm may be used.

The electrode 781 is preferably a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has visible light permeability, it is preferable that the electrode 783 efficiently reflects visible light. When the electrode 781 efficiently reflects visible light, it is preferable that the electrode 783 have visible light permeability.

Positions of the electrode 781 and the electrode 783 are not limited to the structure illustrated in FIG. 15B, and the electrode 781 and the electrode 783 may be replaced with each other. It is preferable to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions, For the partition 784, the description of the protective insulating film 118 is referred to. Alternatively, a resin film of a polyimide resin, an acrylic resin, an epoxy resin, a silicone resin, or the like may be used.

The transistor 741 connected to the light-emitting element 719 has stable electrical characteristics. Thus, an EL display device having high display quality can be provided.

Figure 16A:
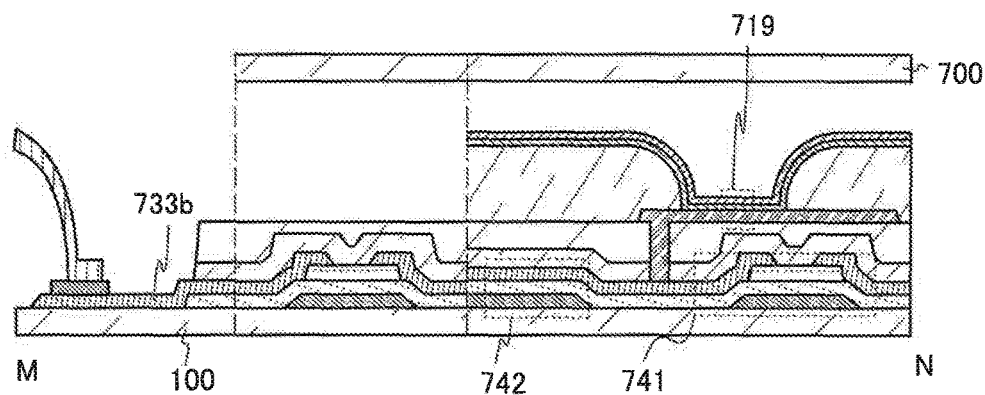
FIGS. 16A and 16B are cross-sectional views illustrating examples of EL display devices.
Figure 16B:
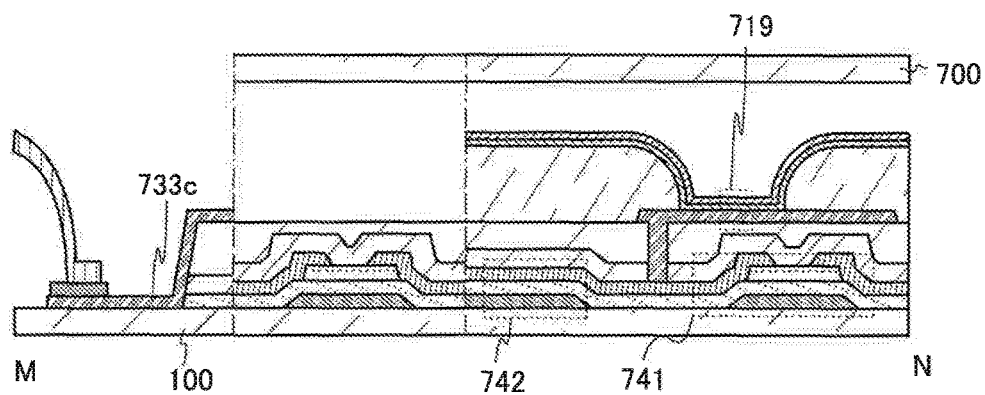

FIG. 16A and 16B each illustrate an example of a cross section of an EL display device which is partly different from that in. FIG. 15B. Specifically, the difference lies in a wiring connected to the FPC 732. In FIG. 16A, a wiring 733b is connected to the FPC 732 via the terminal 731. The wiring 733b is formed in the same layer as the source electrode 116a and the drain electrode 116b. In FIG. 16B, a wiring 733c is connected to the FPC 732 via the terminal 731. The wiring 733c is formed in the same layer as the electrode 781.

<2-1-2. Liquid Crystal Display Device>

Next, a display device including a liquid crystal element (also called a liquid crystal display device) is described.

Figure 17:
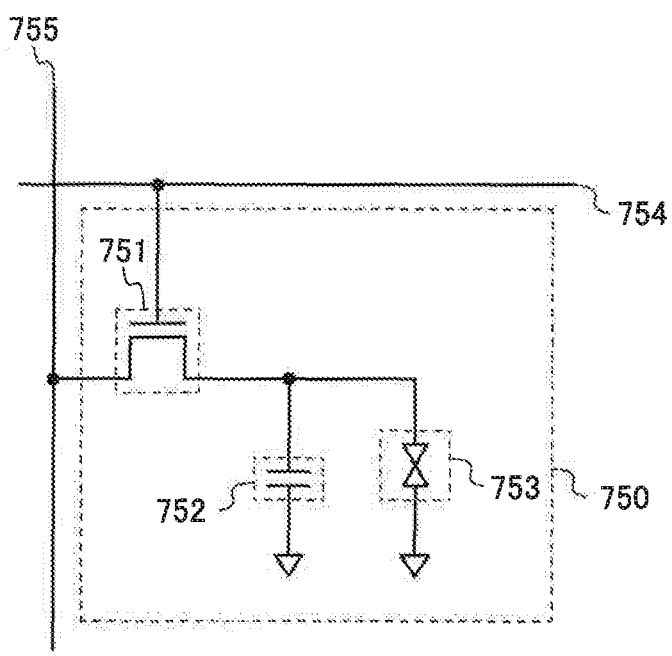
FIG. 17 is a circuit diagram illustrating an example of a liquid crystal display device of one embodiment of the present invention.

FIG. 17 is a circuit diagram showing a structural example of a pixel of the liquid crystal display device. A pixel 750 illustrated in FIG. 17 includes a transistor 751, a capacitor 752, and an element in which liquid crystal is injected between a pair of electrodes (hereinafter also referred to as liquid crystal element) 753.

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring to which the other of the electrodes of the capacitor 752 is electrically connected.

Figure 18A:
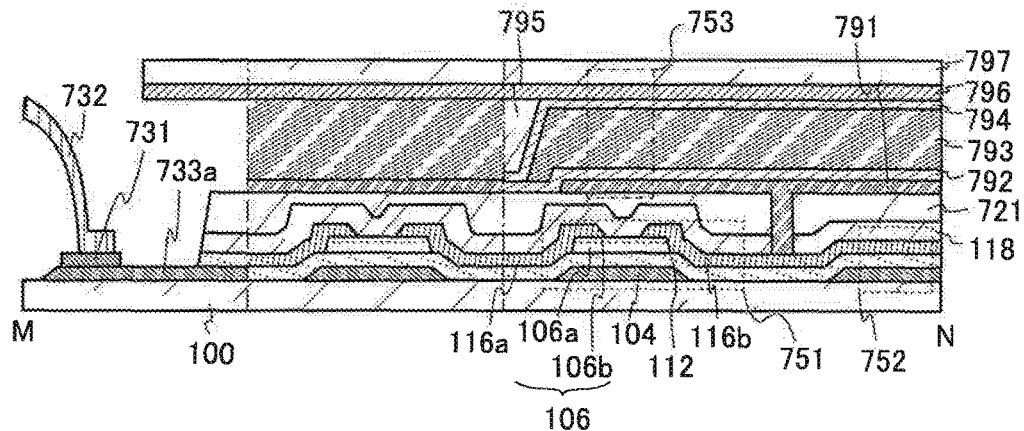
FIGS. 18A to 18C are cross-sectional views illustrating examples of liquid crystal display devices of one embodiment of the present invention.

Note that a top view of the liquid crystal display device is roughly similar to that of the EL display device, FIG. 18A is a cross-sectional view of the liquid crystal display device taken along dashed-dotted line M-N in FIG. 15A. In FIG. 18A, the FPC 732 is connected to the wiring 733a via the terminal 731. Note that the wiring 733a is formed in the same layer as the gate electrode 104.

Note that FIG. 18A illustrates an example in which the transistor 751 and the capacitor 752 are provided in the same plane. With such a structure, the capacitor 752 can be formed in the same plane as a gate electrode, a gate insulating film, and a source electrode (drain electrode), which are included in the transistor 751. When the transistor 751 and the capacitor 752 are provided in the same plane in this manner, the number of manufacturing steps of the liquid crystal display device can be reduced; thus, the productivity can be improved.

As the transistor 751, any of the above transistors can be used. In FIG. 18A, the transistor illustrated in FIGS. 1A to 1C is used as the transistor 751. Therefore, for components of the transistor 751 which are not particularly described below, the description of FIGS. 1A to 1D is referred to.

Note that the transistor 751 can be a transistor having extremely low off-state current. Thus, the charge held in the capacitor 752 is unlikely to be leaked and voltage applied to the liquid crystal element 753 can be retained for a long time. Thus, by turning off the transistor 751 when an image with little motion or a still image is displayed, power for the operation of the transistor 751 is not needed. As a result, the power consumption of the liquid crystal display device can be low.

An insulating film 721 is provided over the transistor 751 and the capacitor 752.

Here, an opening reaching the drain electrode 116b of the transistor 751 is provided in the insulating film 721 and the protective insulating film 118.

An electrode 791 is provided over the insulating film 721. The electrode 791 is in contact with the drain electrode 116b of the transistor 751 through the opening provided in the insulating film 721 and the protective insulating film 118.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

For the insulating film 721, the description of the protective insulating film 118 is referred to. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Note that as the liquid crystal layer 793, a liquid crystal exhibiting a blue phase may be used. In that case, the insulating films 792 and 794 serving as an alignment film are not necessarily provided.

The electrode 791 can be formed using a conductive film having a transmitting property with respect to visible light.

As the electrode 791, for example, an oxide film such as an In—Zn—W-based oxide film, an In—Sn-based oxide film, an In—Zn-based oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used.

The electrode 791 is preferably a film which efficiently reflects visible light. For example, a film containing aluminum, titanium, chromium, copper, molybdenum, silver, tantalum, or tungsten can be used as the electrode 791.

The electrode 796 can be formed using any of the films for the electrode 791. Note that when the electrode 791 has visible light permeability, it is preferable that the electrode 796 efficiently reflects visible light. When the electrode 791 efficiently reflects visible light, it is preferable that the electrode 796 have visible light permeability.

Positions of the electrode 791 and the electrode 796 are not limited to the structure illustrated in FIG. 18A, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another functions as the liquid crystal element 753.

As the substrate 797, a glass substrate, a resin substrate, a metal substrate, or the like can be used. The substrate 797 may have flexibility.

Figure 18B:
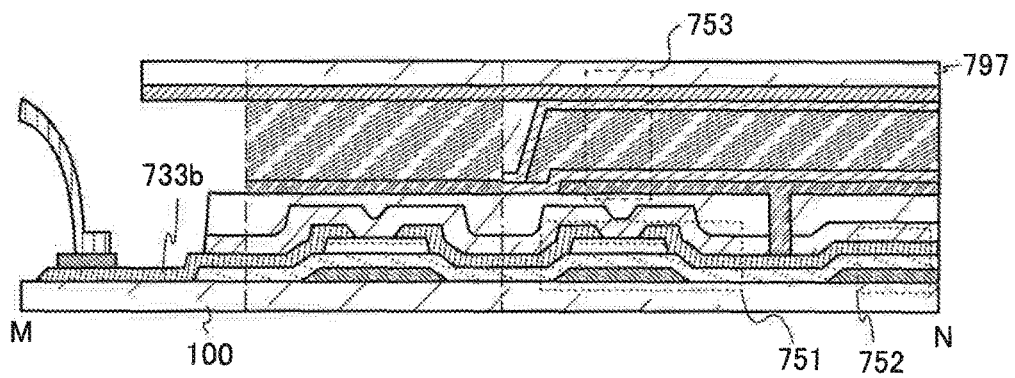
Figure 18C:
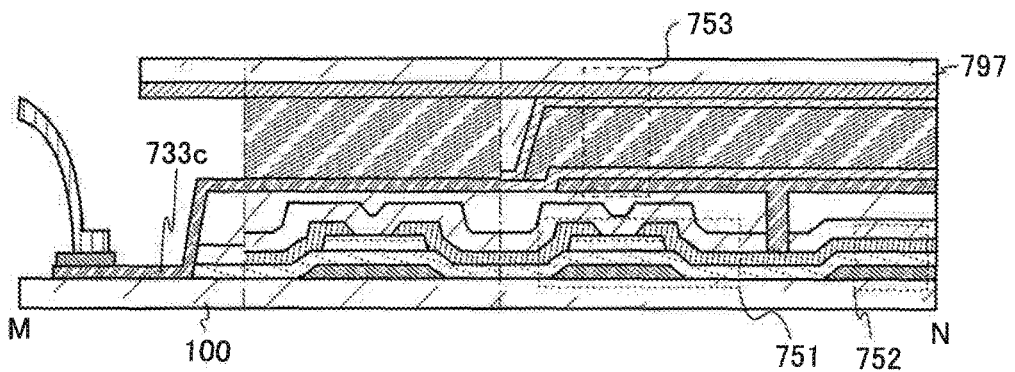

FIGS. 18B and 18C each illustrate an example of a cross section of a liquid crystal display device which is partly different from that in FIG. 18A. Specifically, the difference lies in a wiring connected to the FPC 732. In FIG. 18B, the wiring 733b is connected to the FPC 732 via the terminal 731. The wiring 733b is formed in the same layer as the source electrode 116a and the drain electrode 116b. In FIG. 18C, the wiring 733c is connected to the FPC 732 via the terminal 731. The wiring 733c is formed in the same layer as the electrode 791.

The transistor 751 connected to the liquid crystal element 753 has stable electrical characteristics. Thus, a liquid crystal display device having high display quality can be provided. Further, since the off-state current of the transistor 751 can be extremely low, a display device with low power consumption can be provided.

Operation modes of liquid crystal is described below, using examples. Driving methods of a liquid crystal of a liquid crystal display device include a vertical electric field method where voltage is applied perpendicular to a substrate and a horizontal electric field method where voltage is applied in parallel to a substrate.

First, FIGS. 19A1 and 19A2 are cross-sectional schematic views each illustrating a pixel structure of a liquid crystal display device of a TN mode.

A liquid crystal layer 3100 is held between a substrate 3101 and a substrate 3102 which are arranged so as to face each other. A polarizing plate 3103 is formed on the substrate 3101 side and a polarizing plate 3104 is formed on the substrate 3102 side. The absorption axis of the polarizing plate 3103 and the absorption axis of the polarizing plate 3104 are arranged in a cross-Nicol state.

Although not illustrated, a backlight and the like are provided outside the polarizing plate 3104. An electrode 3108 and an electrode 3109 are provided on the substrate 3101 and the substrate 3102, respectively. The electrode 3108 on the opposite side to the backlight, that is, on the viewing side, is formed to have a light-transmitting property.

In the case where a liquid crystal display device having such a structure is in a normally white mode, when voltage is applied between the electrode 3108 and the electrode 3109 (referred to as a vertical electric field method), liquid crystal molecules 3105 are aligned vertically as illustrated in FIG. 19A1. Thus, the light from the backlight cannot pass through the polarizing plate 3103, which leads to black display.

When no voltage is applied between the electrode 3108 and the electrode 3109, the liquid crystal molecules 3105 are aligned horizontally and twisted on a plane surface as illustrated in FIG. 19A2. As a result, light from the backlight can pass through the polarizing plate 3103, which leads to white display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

A known liquid crystal molecule may be used as a liquid crystal material for the TN mode.

FIGS. 19B1 and 19B2 are cross-sectional schematic views illustrating a pixel structure of a VA-mode liquid crystal display device. In the VA mode, the liquid crystal molecules 3105 are aligned such that they are perpendicular to the substrate when there is no electric field.

In a manner similar to that in FIGS. 19A1 and 19A2, the electrode 3108 and the electrode 3109 are provided on the substrate 3101 and the substrate 3102, respectively. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the electrode 3108 and the electrode 3109 (the vertical electric field method) in a liquid crystal display device having such a structure, the liquid crystal molecules 3105 are aligned horizontally as illustrated in FIG. 19B1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 19B2. As a result, light from the backlight which is polarized by the polarizing plate 3104 passes through a cell without being influenced by birefringence of the liquid crystal molecules 3105. Thus, the light from the backlight which is polarized cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

FIGS. 19C1 and 19C2 are cross-sectional schematic views each illustrating a pixel structure of a liquid crystal display device of an MVA mode. The MVA mode is a method in which one pixel is divided into a plurality of portions, and the portions have different alignment directions of the liquid crystal molecules 3105 and compensate the viewing angle dependencies with each other. As illustrated in FIG. 19C1, in the MVA mode, a protrusion 3158 whose cross section is a triangle is provided on the electrode 3108 and a protrusion 3159 whose cross section is a triangle is provided on the electrode 3109 for controlling alignment. Note that the other structures are similar to those of the VA mode.

When voltage is applied between the electrode 3108 and the electrode 3109 (the vertical electric field method), the liquid crystal molecules 3105 are aligned so that a long axis of the liquid crystal molecule 3105 is substantially vertical to surfaces of the protrusions 3158 and 3159 as illustrated in FIG. 19C1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 19C2. As a result, light from the backlight cannot pass through the polarizing plate 3103, which leads to black display. In addition, the gray scale can be expressed by adjusting the voltage applied between the electrode 3108 and the electrode 3109, In this manner, a predetermined image is displayed.

At this time, full color display can be performed by providing a coloring layer. The coloring layer can be provided on either the substrate 3101 side or on the substrate 3102 side.

Figure 22A:
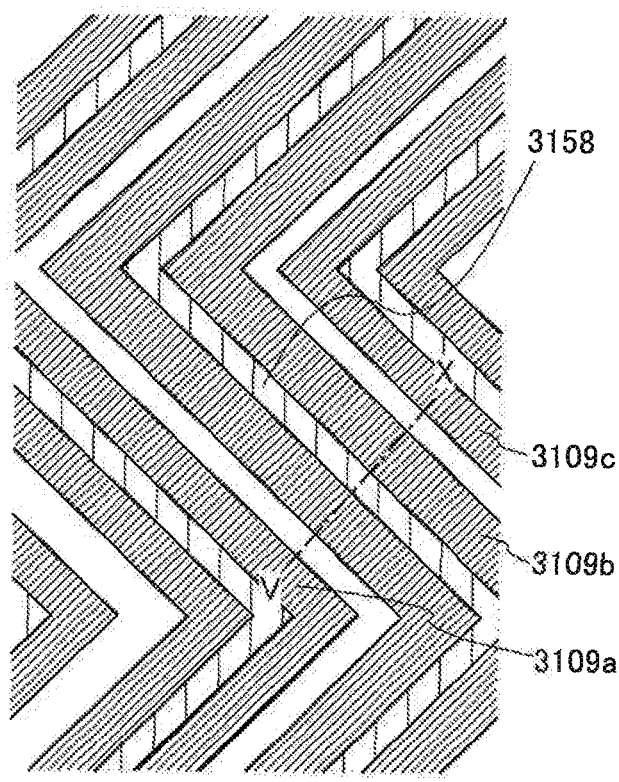
FIGS. 22A and 22B are a top view and a cross-sectional view illustrating an example of a pixel of a liquid crystal device of one embodiment of the present invention.
Figure 22B:
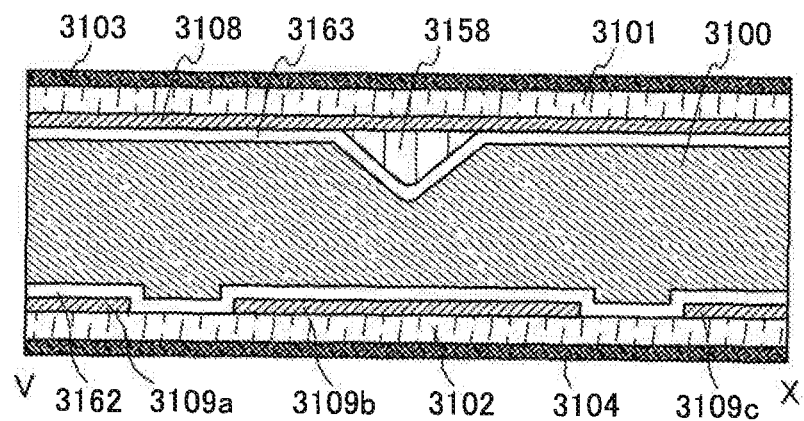

FIGS. 22A and 22B are a top view and a cross-sectional view, respectively, of another example of the MVA mode. As illustrated in FIG. 22A, an electrode 3109a, an electrode 3109b, and an electrode 3109c are each formed into a bent pattern like a dogleg-like shape (V-like shape). As illustrated in FIG. 22B, an insulating film 3162 and an insulating film 3163 which function as alignment films are formed over the electrodes 3109a, 3109b, and 3109c and over the electrode 3108, respectively. The protrusion 3158 is formed on the electrode 3108 so as to overlap with the electrode 3109b.

FIGS. 20A1 and 20A2 are cross-sectional schematic views each illustrating a pixel structure of an OCB-mode liquid crystal display device. In the OCB mode, the liquid crystal molecules 3105 in a liquid crystal layer are aligned so that they compensate the viewing angle dependence. This alignment is called a bend alignment.

As in FIGS. 19A1 to 19C2, the electrode 3108 is provided on the substrate 3101 and the electrode 3109 is provided on the substrate 3102. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the electrode 3108 and the electrode 3109 (the vertical electric field method) in a liquid crystal display device having such a structure, black display is performed. At this time, the liquid crystal molecules 3105 are aligned vertically as illustrated in FIG. 20A1. Thus, the polarized light from the backlight cannot pass through the polarizing plate 3103, which leads to black display.

When no voltage is applied between the electrode 3108 and the electrode 3109, the liquid crystal molecules 3105 exist in a bend alignment state as illustrated in FIG. 20A2. As a result, light from the backlight can pass through the polarizing plate 3103, which leads to white display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

In such an OCB mode, alignment of the liquid crystal molecules 3105 can compensate the viewing angle dependence. In addition, a contrast ratio can be increased by a pair of stacked layers including polarizers.

FIGS. 20B1 and 20B2 are cross-sectional schematic views illustrating pixel structures of an FLC-mode liquid crystal display device and an AFLC-mode liquid crystal display device.

As in FIGS. 19A1 to 19C2, the electrode 3108 is provided on the substrate 3101 and the electrode 3109 is provided on the substrate 3102. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

In the liquid crystal display device having such a structure, when voltage is applied between the electrode 3108 and the electrode 3109 (referred to as vertical electric field method), the liquid crystal molecules 3105 are aligned horizontally in a direction deviated from a rubbing direction. As a result, light from the backlight can pass through the polarizing plate 3103, which leads to white display.

When no voltage is applied between the electrode 3108 and the electrode 3109, the liquid crystal molecules 3105 are aligned horizontally along the rubbing direction as illustrated in FIG. 20B2. Thus, the polarized light from the backlight cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

A known material may be used for a liquid crystal material for an FLC mode or an AFLC mode.

FIGS. 2A1 and 21A2 are cross-sectional schematic views each illustrating a pixel structure of an IPS-mode liquid crystal display device. The IPS mode is a mode in which the liquid crystal molecules 3105 are rotated in a plane parallel to a substrate by horizontal electric field generated by the electrodes provided for only one substrate side.

The IPS mode is characterized in that liquid crystals are controlled by a pair of electrodes which are provided on one substrate. Thus, a pair of electrodes 3150 and 3151 are provided over the substrate 3102. The pair of electrodes 3150 and 3151 may each have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the pair of electrodes 3150 and 3151 in the liquid crystal display device having such a structure, the liquid crystal molecules 3105 are aligned along an electric flux line deviated from a rubbing direction as illustrated in FIG. 21A1. Thus, light from the backlight can pass through the polarizing plate 3103, which leads to white display.

As long as voltage is not applied between the pair of electrodes 3150 and 3151, the liquid crystal molecules 3105 are aligned horizontally along the rubbing direction, as illustrated in FIG. 21A2. As a result, light from the backlight cannot pass through the polarizing plate 3103, which leads to black display. In addition, the grayscale can be expressed by adjusting the voltage applied between the pair of electrodes 3150 and 3151. In this manner, a predetermined image is displayed.

At this time, full color display can be performed by providing a coloring layer. The coloring layer can be provided on either the substrate 3101 side or on the substrate 3102 side.

Figure 23A:
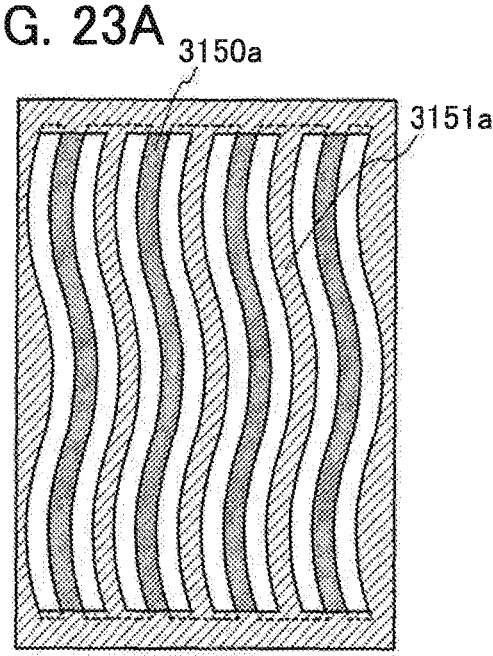
FIGS. 23A to 23C are top views each illustrating an example of a pixel of a liquid crystal device of one embodiment.
Figure 23B:
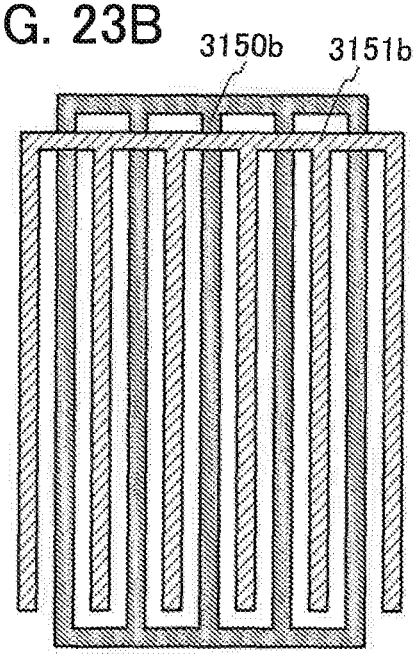
Figure 23C:
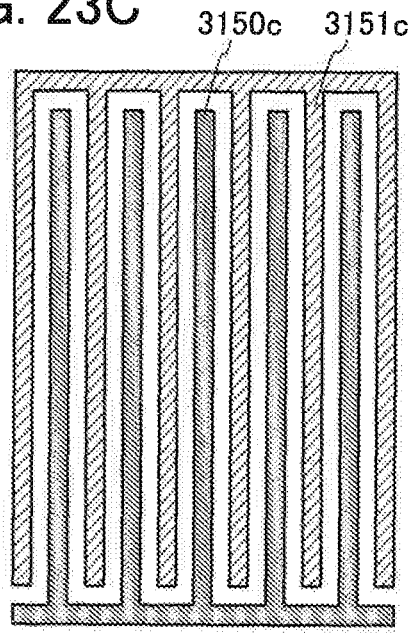

FIGS. 23A to 23C each illustrate an example of the pair of electrodes 3150 and 3151 that can be used in the IPS mode. As illustrated in top views of FIGS. 23A to 23C, the pair of electrodes 3150 and 3151 are alternatively formed. In FIG. 23A, electrodes 3150a and 3151a each have an undulating wave shape. In FIG. 23B, electrodes 3150b and 3151b each have a comb-like shape and partly overlap with each other. In FIG. 23C, electrodes 3150c and 3151c have a comb-like shape in which the electrodes are meshed with each other.

FIGS. 21B1 and 21B2 are cross-sectional schematic views each illustrating a pixel structure of an FFS-mode liquid crystal display device. The FFS mode is also a horizontal electric field method as in the IPS mode and has a structure in which the electrode 3151 is formed over the electrode 3150 with an insulating film provided therebetween as illustrated in FIGS. 21B1 and 21B2.

The pair of electrodes 3150 and 3151 may each have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the pair of electrodes 3150 and 3151 in a liquid crystal display device having such a structure, the liquid crystal molecules 3105 are aligned along an electric flux line deviated from a rubbing direction as illustrated in FIG. 21B1. Thus, light from the backlight can pass through the polarizing plate 3103, which leads to white display.

When no voltage is applied between the pair of electrodes 3150 and 3151, the liquid crystal molecules 3105 are aligned horizontally along the rubbing direction as illustrated in FIG. 21B2. As a result, light from the backlight cannot pass through the polarizing plate 3103, which leads to black display. In addition, the grayscale can be expressed by adjusting the voltage applied between the pair of electrodes 3150 and 3151. In this manner, a predetermined image is displayed.

At this time, full color display can be performed by providing a coloring layer. The coloring layer can be provided on either the substrate 3101 side or on the substrate 3102 side.

Figure 24A:
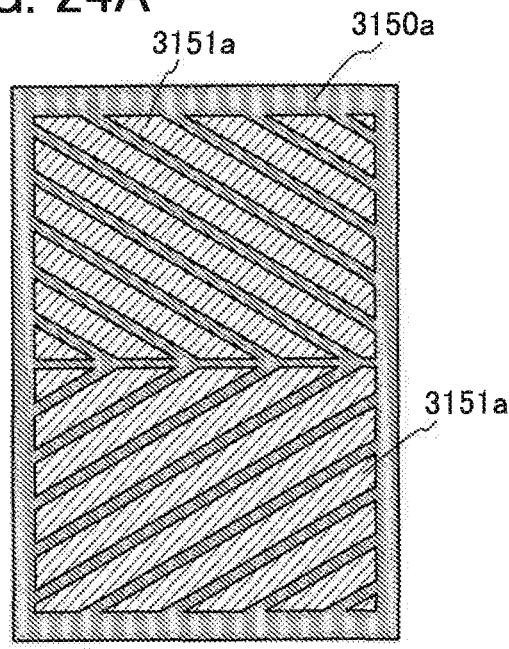
FIGS. 24A to 24C are top views each illustrating an example of a pixel of a liquid crystal device of one embodiment.
Figure 24B:
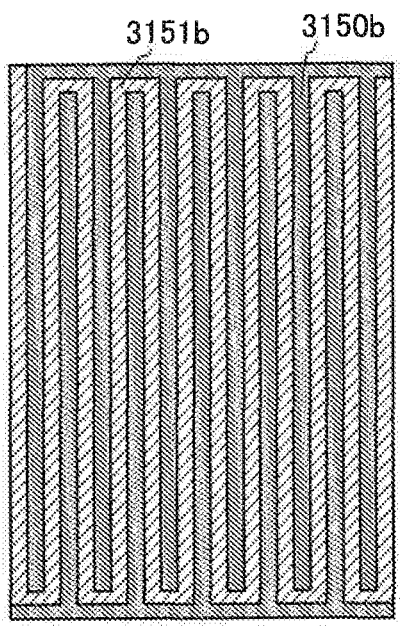
Figure 24C:
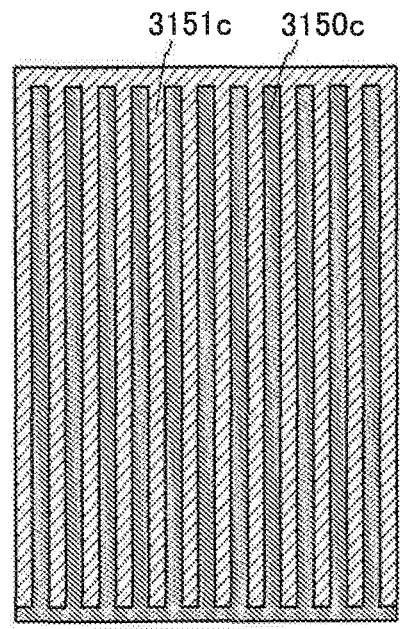

FIGS. 24A to 24C each show an example of the pair of electrodes 3150 and 3151 that can be used in the FFS mode. As illustrated in top views of FIGS. 24A to 24C, the electrodes 3151 are formed into various patterns over the electrodes 3150. In FIG. 24A, the electrode 3151a over the electrode 3150a has a bent dogleg-like shape (V-like shape). In FIG. 24B, the electrode 3151b over the electrode 3150b has a comb-like shape in which the electrodes are meshed with each other. In FIG. 24C, the electrode 3151c over the electrode 3150c has a comb-like shape.

A known liquid crystal molecule may be used for the IPS-mode liquid crystal display device and the FFS-mode liquid crystal display device.

Another operation mode such as a PVA mode, an ASM mode, or a TBA mode may be employed.

In the liquid crystal display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (field-sequential driving method) with the use of a plurality of light-emitting diodes (LEDs) for a backlight. A field-sequential driving method enables color display without using a coloring layer.

As a display method in the pixel portion, a progressive method, an interlace method, or the like is employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. However, one embodiment of the present invention is not limited to a color liquid crystal display device and can be applied to a monochrome liquid crystal display device.

<2-2. Microcomputer>

The transistors described above can be applied to a microcomputer used for a variety of electronic appliances.

A structure and operation of a fire alarm system that is an example of the electronic appliance using a microcomputer are described with reference to FIG. 25, FIG. 26, FIGS. 27A to 27C, and FIG. 28A.

The fire alarm in this specification refers to any system which raises an alarm over fire occurrence instantly and includes, for example, a residential fire alarm, an automatic fire alarm system, and a fire detector used for the automatic fire alarm system are included in its category.

Figure 25:
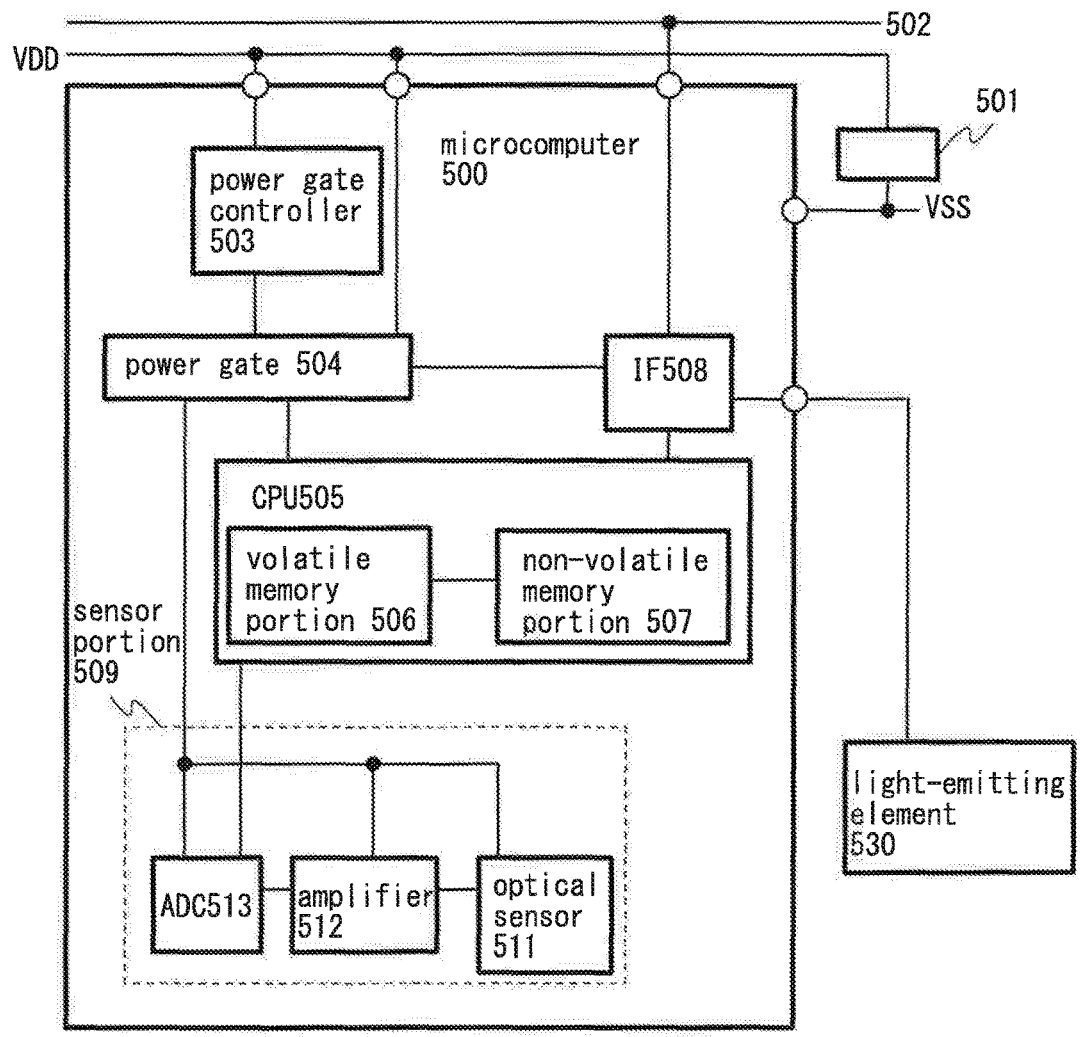
FIG. 25 is a block diagram illustrating a semiconductor device of one embodiment of the present invention.

An alarm system illustrated in FIG. 25 includes at least a microcomputer 500. The microcomputer 500 is provided inside the alarm system. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 via an interface 508. The interface 508 as well as the CPU 505 is electrically connected to the power gate 504. As a bus standard of the interface 508, for example, an I²C bus can be used. A light-emitting element 530 electrically connected to the power gate 504 via the interface 508 is provided in the alarm system.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm system operates in such a manner, whereby power consumption can be reduced as compared to the case where power is continuously supplied to the above structures.

In the case where a transistor is used as the power gate 504, it is preferable to use a transistor which has extremely low off-state current and is used for the nonvolatile memory portion 507, for example, any of the transistors each of which includes the multilayer film including the oxide semiconductor layer. With the use of such a transistor, leakage current can be reduced when supply of power is stopped by the power gate 504, so that power consumption can be reduced.

A direct-current power source 501 may be provided in the alarm system so that power is supplied from the direct-current power source 501 to the high potential power supply line VDD. An electrode of the direct-current power source 501 on the high potential side is electrically connected to the high potential power supply line VDD, and an electrode of the direct-current power source 501 on the low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case which includes an electrode electrically connected to the high potential power supply line VDD, an electrode electrically connected to the low potential power supply line VSS, and a housing which can hold the battery is provided in the housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measured value to the CPU 505. A physical quantity relating to an abnormal situation depends on the usage of the alarm system, and in an alarm system functioning as a fire alarm, a physical quantity relating to a fire is measured. Thus, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 26:
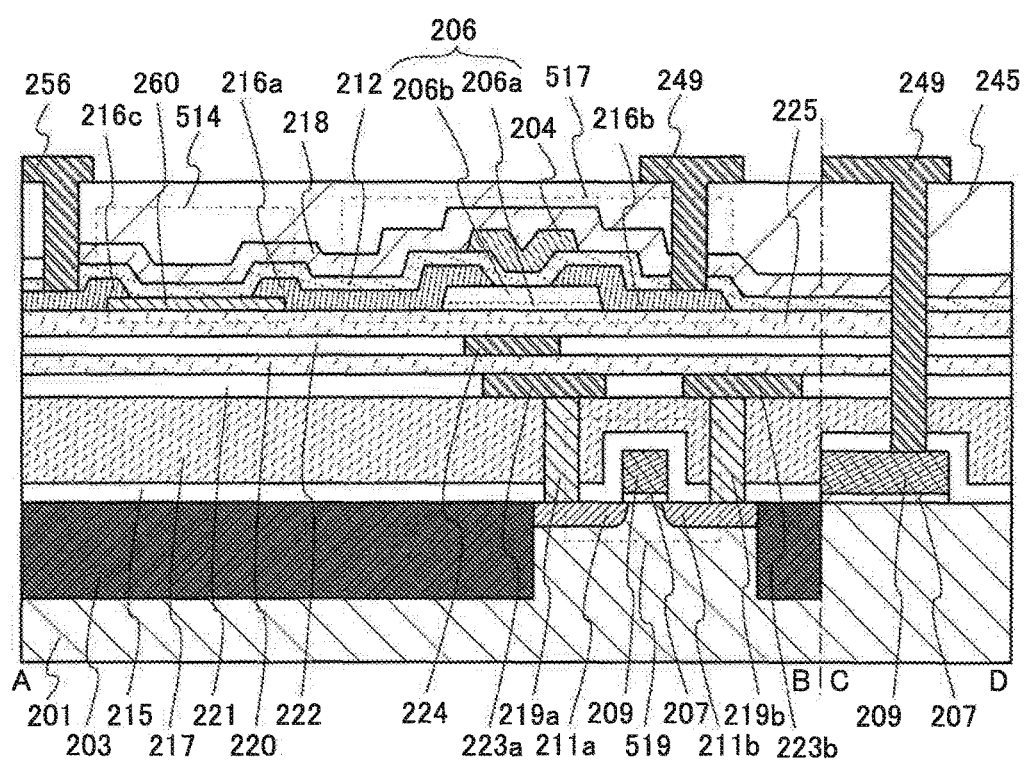
FIG. 26 is a cross-sectional view illustrating an example of a semiconductor device of one embodiment of the present invention.

FIG. 26 illustrates part of the cross section of the alarm system. An n-channel transistor 519 includes element isolation regions 203 in a p-type semiconductor substrate 201, a gate insulating film 207, a gate electrode 209, n-type impurity regions 211a and 211b, an insulating film 215, and an insulating film 217. The n-channel transistor 519 is formed using a semiconductor such as single crystal silicon, so that the n-channel transistor 519 can operate at high speed. Accordingly, a volatile memory portion of a CPU that can achieve high-speed access can be formed.

In addition, contact plugs 219a and 219b are formed in openings which are formed by partly etching the insulating films 215 and 217, and an insulating film 221 having groove portions is formed over the insulating film 217 and the contact plugs 219a and 219b. Wirings 223a and 223b are formed in the groove portions of the insulating film 221. An insulating film 220 is formed over the insulating film 221 and the wirings 223a and 223b by a sputtering method, a CVD method, or the like, and an insulating film 222 having a groove portion is formed over the insulating film 220. An electrode 224 is formed in the groove portion of the insulating film 222. The electrode 224 functions as a back gate electrode of a second transistor 517. The electrode 224 can control the threshold voltage of the second transistor 517.

Moreover, an insulating film 225 is formed over the insulating film 222 and the electrode 224 by a sputtering method, a CVD method, or the like.

The second transistor 517 and a photoelectric conversion element 514 are provided over the insulating film 225. The second transistor 517 includes the multilayer film 206 including the oxide layer 206a and the oxide semiconductor layer 206b, the source electrode 216a and the drain electrode 216b which are over and in contact with the multilayer film 206, the gate insulating film 212, the gate electrode 204, and the protective insulating film 218. Moreover, an insulating film 245 to cover the photoelectric conversion element 514 and the second transistor 517 is formed, and a wiring 249 in contact with the drain electrode 216b is formed over the insulating film 245. The wiring 249 functions as a node which electrically connects the drain electrode 216b of the second transistor 517 to the gate electrode 209 of the n-channel transistor 519.

The optical sensor 511 includes the photoelectric conversion element 514, a capacitor, a first transistor, the second transistor 517, a third transistor, and the n-channel transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the second transistor 517. The gate electrode of the second transistor 517 is supplied with an electric charge accumulation control signal Tx, and the other of the source electrode and the drain electrode thereof is electrically connected to one of a pair of electrodes of the capacitor, one of a source electrode and a drain electrode of the first transistor, and the gate electrode of the n-channel transistor 519 (hereinafter the node is referred to as a node FD in some cases). The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD. One of a source electrode and a drain electrode of the n-channel transistor 519 is electrically connected to one of a source electrode and a drain electrode of the third transistor and the amplifier 512. The other of the source electrode and the drain electrode of the n-channel transistor 519 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 519 or the like is sufficiently large, a structure without the capacitor may be employed.

Further, as each of the first transistor and the second transistor 517, the transistor with extremely low off-state current is preferably used. As the transistor with extremely low off-state current, any of the above transistors each of which includes the multilayer film including the oxide semiconductor layer is preferably used. With such a structure, the potential of the node FD can be held for a long time.

In the structure in FIG. 26, the photoelectric conversion element 514 is electrically connected to the second transistor 517 and is provided over the insulating film 225.

The photoelectric conversion element 514 includes a semiconductor layer 260 over the insulating film 225, and the source electrode 216*a* and an electrode 216*c* which are in contact with the top surface of the semiconductor layer 260. The source electrode 216*a* is an electrode functioning as the source electrode or the drain electrode of the second transistor 517 and electrically connects the photoelectric conversion element 514 to the second transistor 517.

Over the semiconductor layer 260, the source electrode 216*a*, and the electrode 216*c*, the gate insulating film 212, the protective insulating film 218, and the insulating film 245 are provided. Further, a wiring 256 is formed over the insulating film 245 and is in contact with the electrode 216*c* through an opening provided in the gate insulating film 212, the protective insulating film 218, and the insulating film 245.

The electrode 216*c* can be formed in steps similar to those of the source electrode 216*a* and the drain electrode 216*b*, and the wiring 256 can be formed in steps similar to those of the wiring 249.

As the semiconductor layer 260, a semiconductor layer which can perform photoelectric conversion is provided, and for example, silicon, germanium, or the like can be used. In the case of using silicon for the semiconductor layer 260, an optical sensor which senses visible light can be obtained. Further, there is a difference between silicon and germanium in wavelengths of absorbed electromagnetic waves. In the case of using germanium for the semiconductor layer 260, a sensor which senses infrared rays can be obtained.

In the above manner, the sensor portion 509 including the optical sensor 511 can be incorporated into the microcomputer 500, so that the number of components can be reduced and the housing of the alarm system can be reduced.

In the above fire alarm including an IC chip, the CPU 505 in which a plurality of circuits each including any of the above transistors are combined and mounted on one IC chip is used.

<2-2-1. CPU>

Figure 27A:
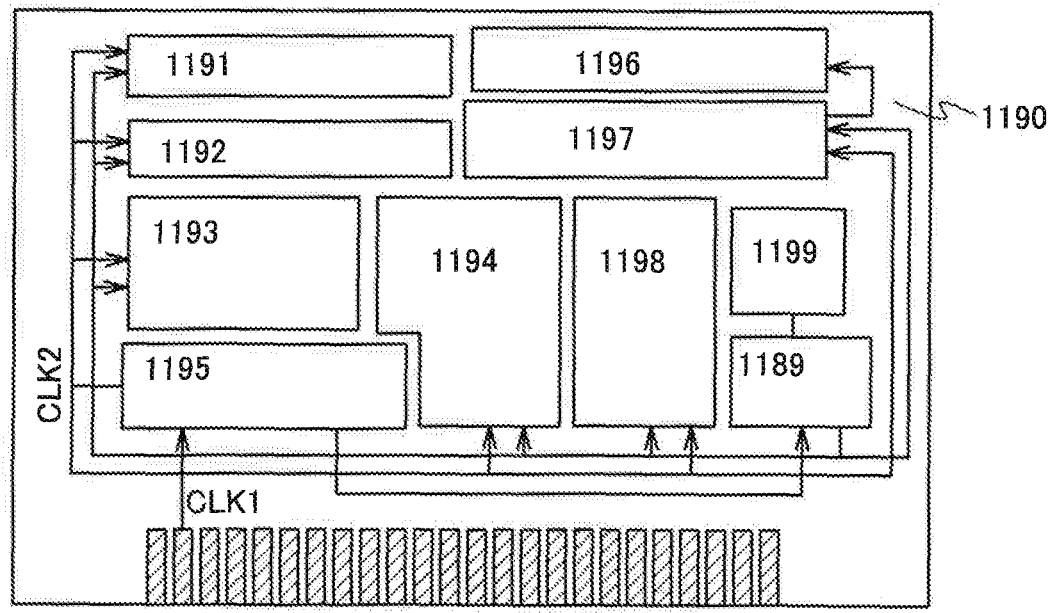
FIGS. 27A to 27C are block diagrams illustrating examples of CPUs of one embodiment of the present invention.
Figure 27B:
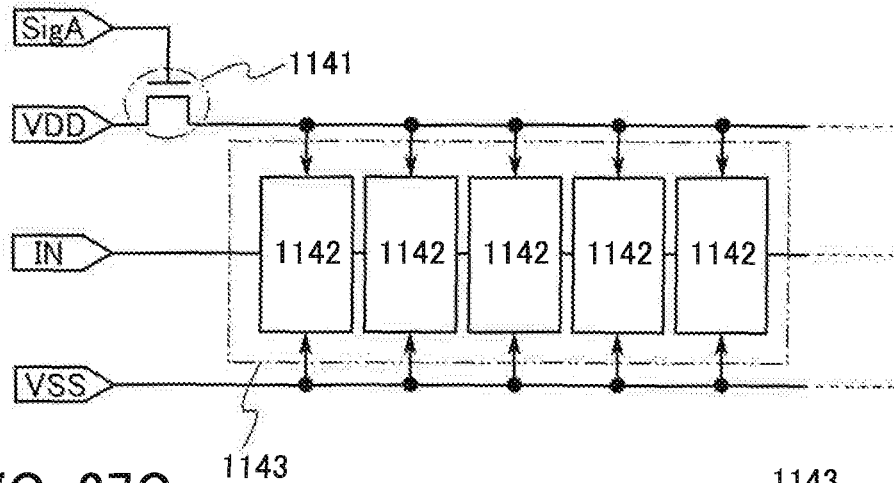
Figure 27C:
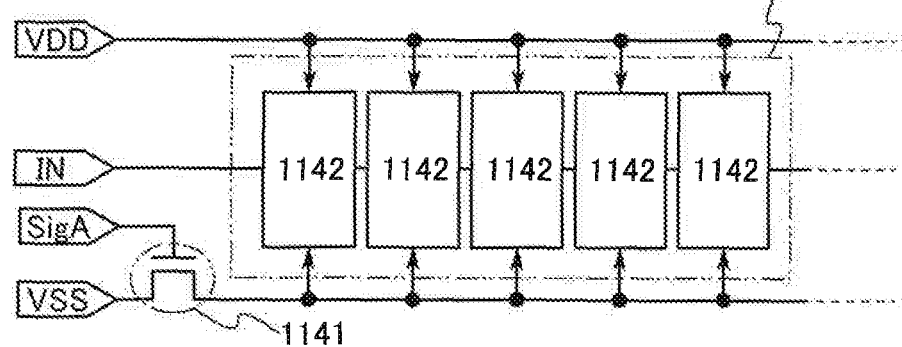

FIGS. 27A to 27C are block diagrams illustrating a specific structure of a CPU at east partly including any of the above transistors.

The CPU illustrated in FIG. 27A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over separate chips. Needless to say, the CPU in FIG. 27A is just an example of a simplified structure, and an actual. CPU may have a variety of structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from; to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 27A, a memory cell is provided in the register 1196. As the memory cell of the register 1196, the above transistor can be used.

In the CPU illustrated in FIG. 27A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 27B or FIG. 27C. Circuits illustrated in FIGS. 27B and 27C are described below.

FIGS. 27B and 27C each illustrate a memory device in which any of the above transistors is used as a switching element which controls supply of a power supply potential to a memory cell.

The memory device illustrated in FIG. 27B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In. FIG. 27B, the above transistors is used as the switching element 1141, and the switching of the transistor is controlled by a signal SigA supplied to a gate electrode layer thereof.

Note that FIG. 27B illustrates the structure in which the switching element 1141 includes only one transistor; however, one embodiment of the present invention is not limited thereto and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 27B, the switching element 1141 may control the supply of the low-level power supply potential VSS.

FIG. 27C illustrates an example of a memory device in which each of the memory cells 1142 included in the memory cell group 1143 is supplied with the low-level power supply potential VSS via the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<2-2-2. Installation Example>

Figure 28A:
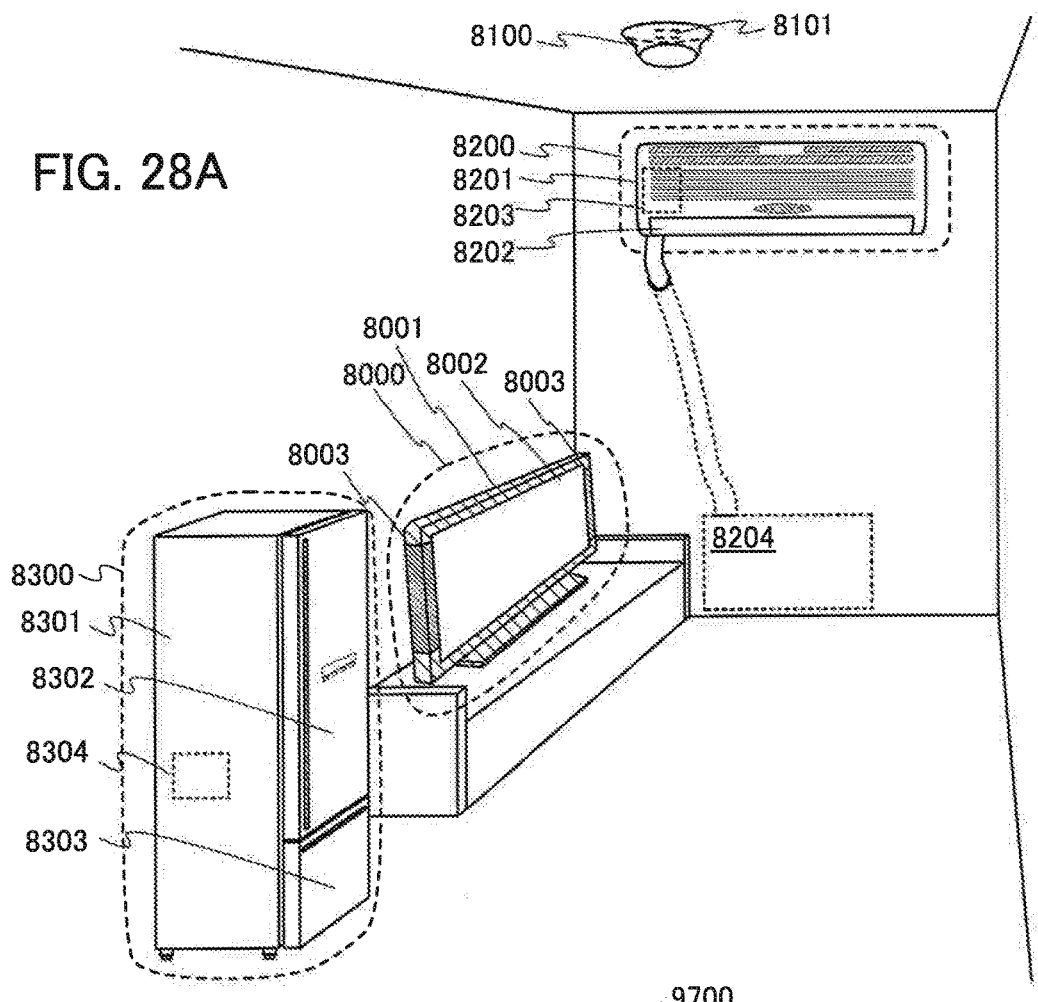
FIGS. 28A to 28C illustrate examples of electronic appliances of one embodiment of the present invention.

In a television set 8000 in FIG. 28A, a display portion 8002 is incorporated in a housing 8001. The display portion 8002 can display an image and a speaker portion 8003 can output sound. The above transistor can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

In addition, the television set 8000 may include a CPU for performing information communication or a memory. A CPU or a memory that uses any of the above transistors, the above memory device, or the above CPU consumes less power.

In FIG. 28A, an alarm system 8100 is a residential fire alarm, which includes a sensor portion and a microcomputer 8101. The microcomputer 8101 includes a CPU in which any of the above transistors is used.

In FIG. 28A, a CPU that uses any of the above transistors is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 28A, the CPU 8203 may be provided in the outdoor unit 8204. Alternatively, the CPU 8203 may be provided in both the indoor unit 8200 and the outdoor unit 8204. A CPU that uses any of the above transistors can save the power of the air conditioner.

In FIG. 28A, a CPU that uses any of the above transistors is included in an electric refrigerator-freezer 8300. Specifically, the electric refrigerator-freezer 8300 includes a housing 8301, a door for a refrigerator 8302, a door for a freezer 8303, a CPU 8304, and the like. In FIG. 28A, the CPU 8304 is provided in the housing 8301. A CPU that uses any of the above transistors can save the power of the electric refrigerator-freezer 8300.

Figure 28B:
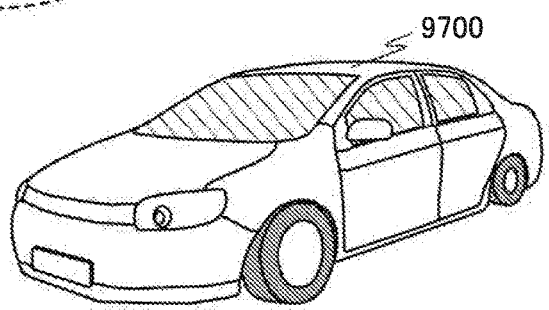
Figure 28C:
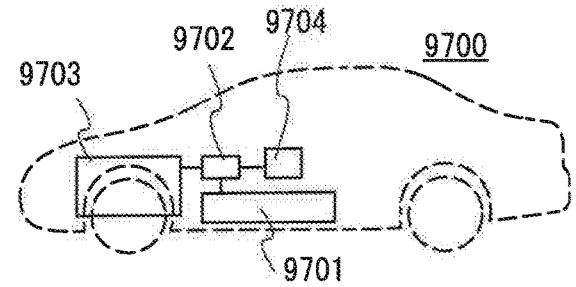

FIGS. 28B and 28C illustrate an example of an electric vehicle. The electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. A CPU that uses any of the above transistors can save the power of the electric vehicle 9700.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

EXAMPLE 1

In this example, a BGTC transistor was manufactured and the electrical characteristics thereof were measured.

Structures of transistors which are example samples and a comparative sample are described below. Note that FIG. 1B is referred to for the structures of the transistors. Here, only the difference between the example samples and the comparative sample is whether the oxide layer 106*b* is provided.

A square glass substrate with a size of 600 mm×720 mm was used as the substrate 100.

A 100-nm-thick tungsten film was used as the gate electrode 104. The tungsten film was formed by a sputtering method.

As the gate insulating film 112, a multilayer film including a 400-nm-thick silicon nitride layer and a 50-nm-thick silicon oxynitride layer over the silicon nitride layer was used. The silicon nitride layer and the silicon oxynitride layer were formed by a CVD method.

Next, the oxide semiconductor layers 106a and the oxide layers 106b in an example sample 1, an example sample 2, and an example sample 3 are described.

As the oxide semiconductor layer 106a, an oxide semiconductor layer formed by a sputtering method using an In—Ga—Zn-based oxide (the atomic ratio of In to Ga and Zn is 1:1:1) target was used. Note that the oxide semiconductor layer 106a was formed under the following conditions: a deposition gas in which an argon gas and an oxygen gas were mixed at a volume ratio of 1:1 was used, the pressure was 0.6 Pa, the substrate temperature was 170° C., and an AC power of 5 kw was applied. The thicknesses of the oxide semiconductor layers 106a in the example sample 1, the example sample 2, and the example sample 3 were 20 nm, 35 nm, and 50 nm, respectively.

As the oxide layer 106b, a 20-nm-thick oxide layer formed by a sputtering method using an In—Ga—Zn-based oxide (the atomic ratio of In to Ga and Zn is 1:3:2) target was used. Note that the oxide layer 106b was formed under the following conditions: a deposition gas in which an argon gas and an oxygen gas were mixed at a volume ratio of 9:1 was used, the pressure was 0.3 Pa, the substrate temperature was room temperature (about 25° C.), and an AC power of 5 kw was applied.

At this time, the energy gap of the oxide semiconductor layer 106a was larger than the energy gap of the oxide layer 106b by 0.45 eV. The electron affinity of the oxide semiconductor layer 106a was higher than the electron affinity of the oxide layer 106b by 0.15 eV.

Note that the comparative example had the same structure as the example samples 1, 2, and 3 except that the thickness of the oxide semiconductor layer 106a was 35 nm and the oxide layer 106b was not provided.

As the source electrode 116a and the drain electrode 116b, a multilayer film including a 50-nm-thick tungsten layer, a 400-nm-thick aluminum layer over the tungsten layer, and a 100-nm-thick titanium layer over the aluminum layer was used. Note that the tungsten layer, the aluminum layer, and the titanium layer were formed by a sputtering method.

As the protective insulating film 118, a multilayer film including a 450-nm-thick silicon oxynitride layer and a 100-nm-thick silicon nitride layer over the silicon oxynitride layer was used. The silicon oxynitride layer and the silicon nitride layer were formed by a CVD method.

The transistors were manufactured in the above manner.

Figure 29A:
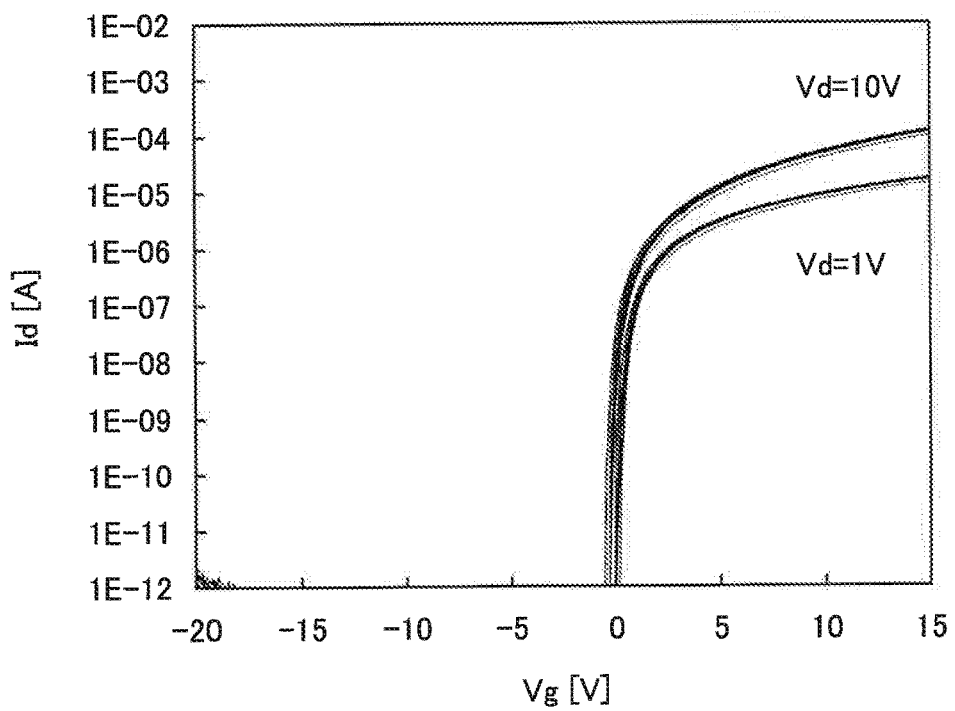
FIGS. 29A and 29B each show Vg-Id characteristics of a transistor.
Figure 29B:
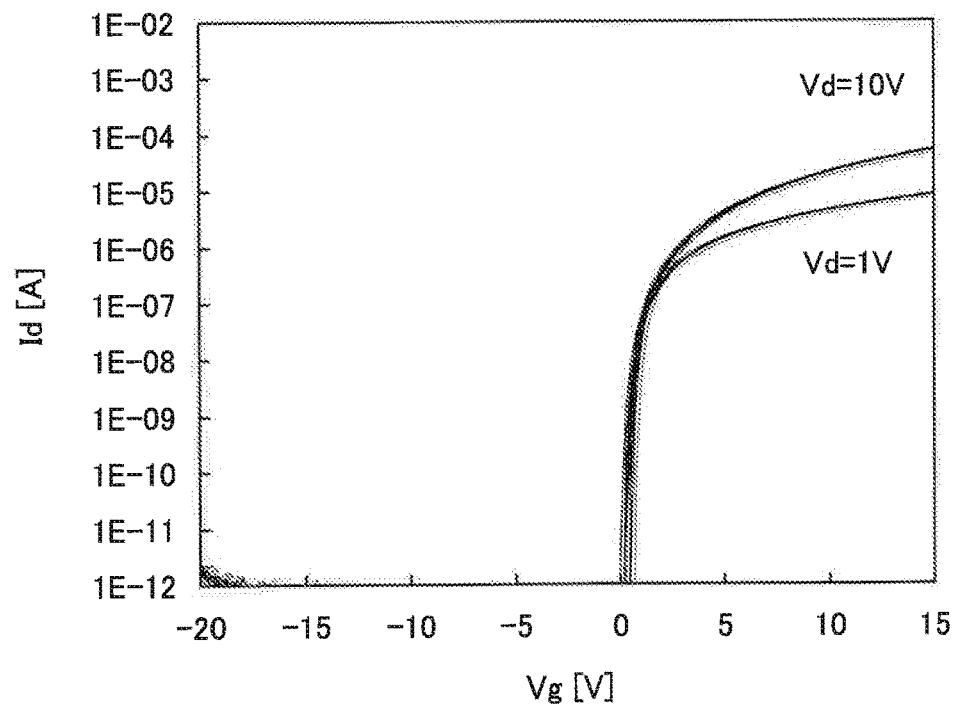
Figure 30A:
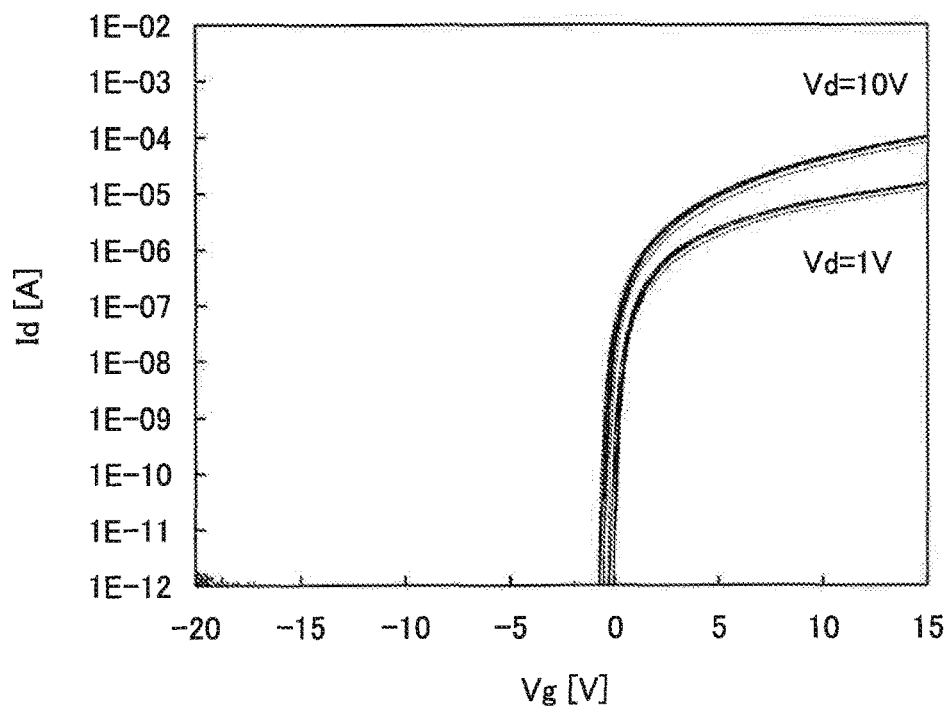
FIGS. 30A and 30B each show Vg-Id characteristics of a transistor.
Figure 30B:
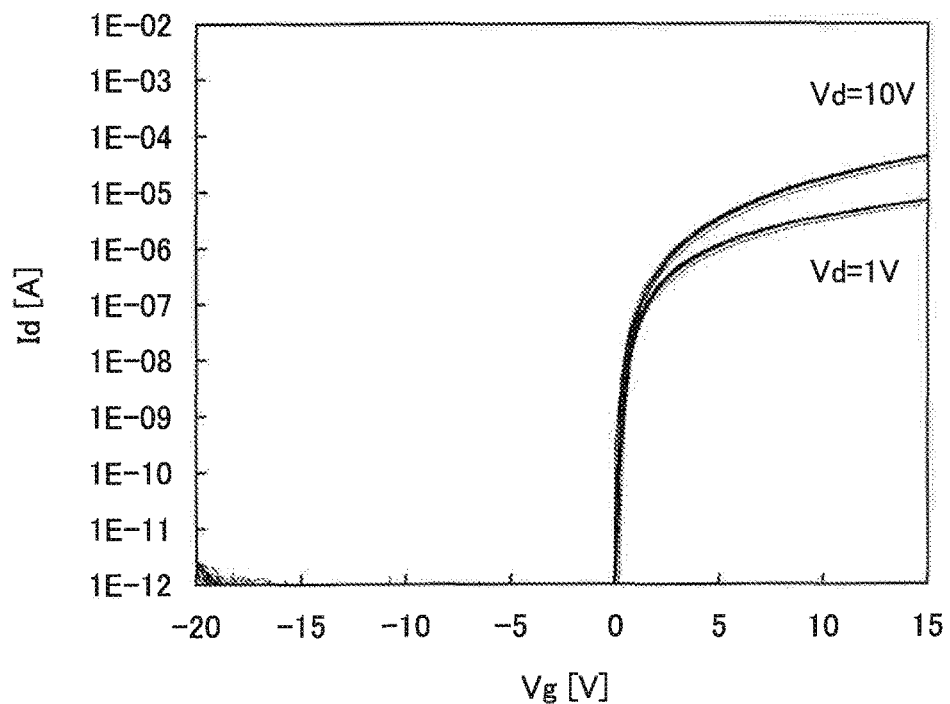
Figure 31A:
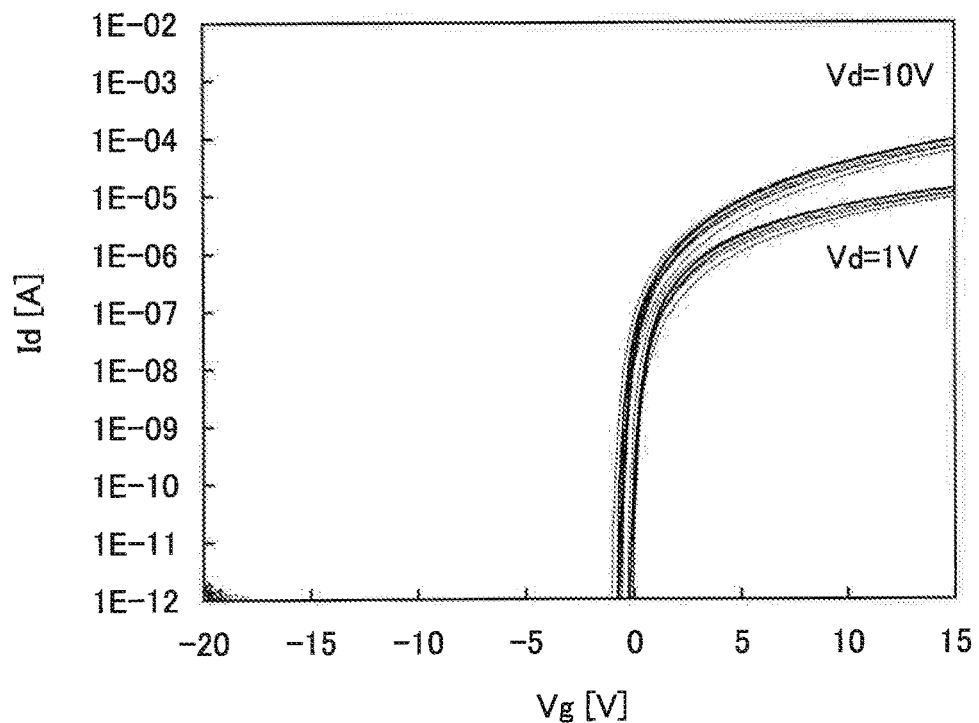
FIGS. 31A and 31B each show Vg-Id characteristics of a transistor.
Figure 31B:
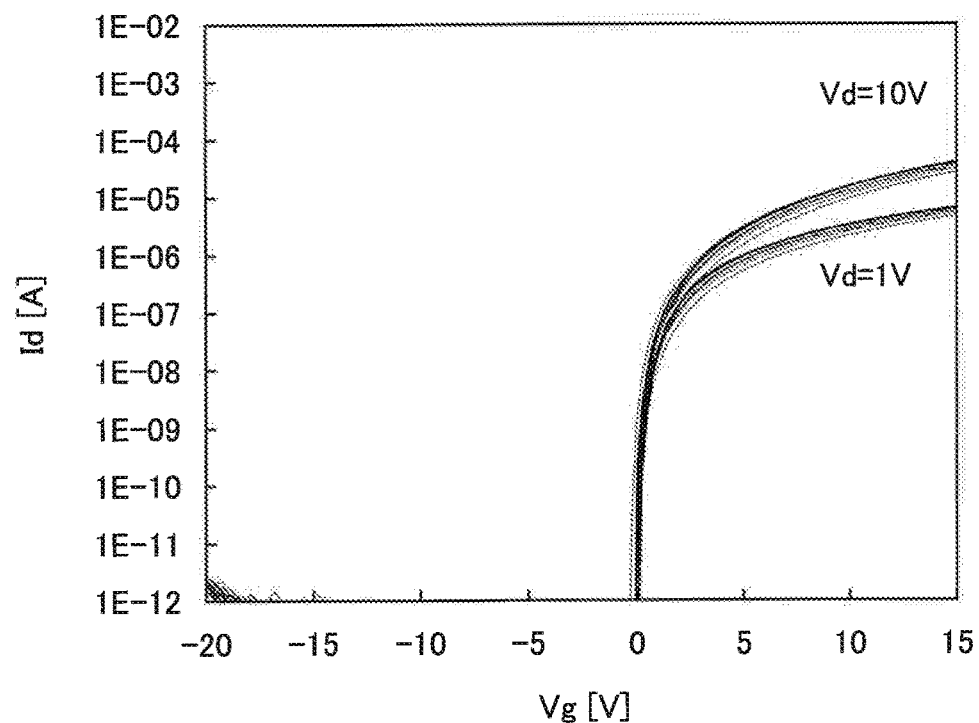
Figure 32A:
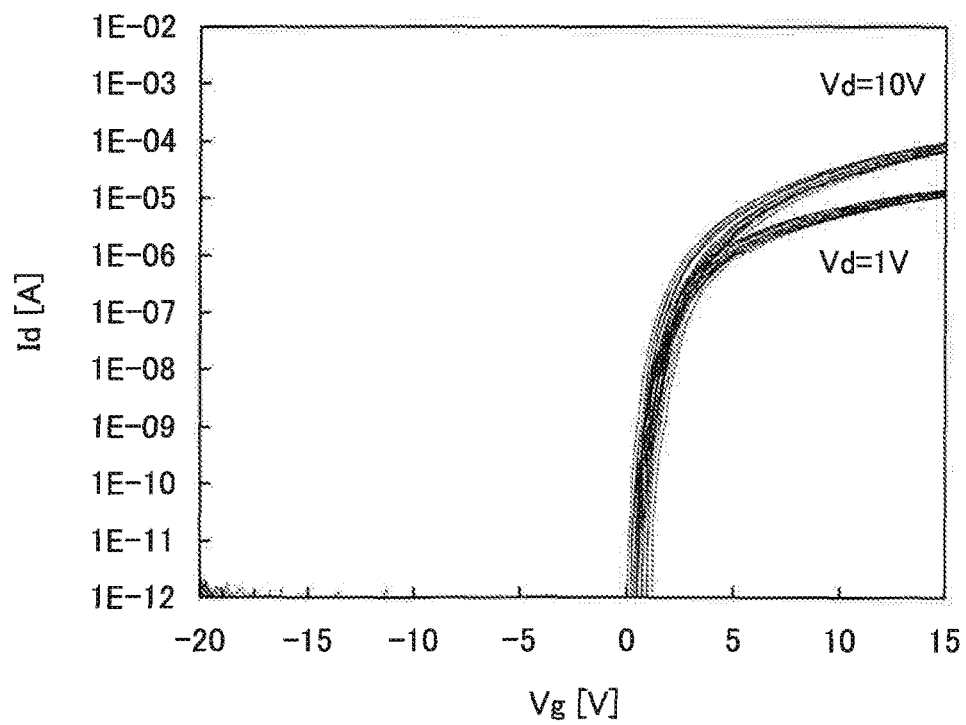
FIGS. 32A and 32B each show Vg-Id characteristics of a transistor.
Figure 32B:
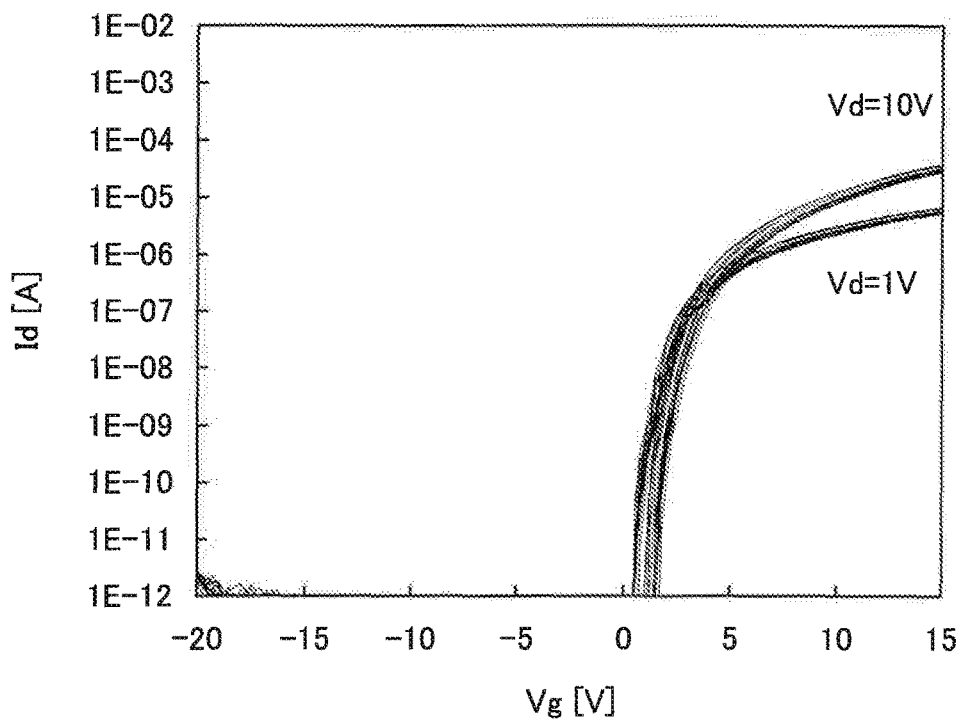

First, Vg-Id characteristics of the transistors were measured at 20 points of a surface of the substrate 100 and are shown together in each of FIGS. 29A, 29B, 30A, 30B, 31A, 31B, 32A, and 32B. Here, the drain current Id was measured under the conditions that the drain voltage was 1 V or 10 V and the gate voltage Vg was swept from −20 V to 15 V. FIG. 29A shows the Vg-Id characteristics of the transistor with a channel length L of 3 µm and a channel width W of 50 µm, which is one example sample 1; FIG. 29B shows the Vg-Id characteristics of the transistor with a channel length L of 6 µm and a channel width W of 50 µm, which is the other example sample 1. FIG. 30A shows the Vg-Id characteristics of the transistor with a channel length L of 3 µm and a channel width W of 50 µm, which is one example sample 2; FIG. 30B shows the Vg-Id characteristics of the transistor with a channel length L of 6 µm and a channel width W of 50 µm, which is the other example sample 2. FIG. 31A shows the Vg-Id characteristics of the transistor with a channel length L of 3 µm and a channel width W of 50 µm, which is one example sample 3; FIG. 31B shows the Vg-Id characteristics of the transistor with a channel length L of 6 µm and a channel width W of 50 µm, which is the other example sample 3. FIG. 32A shows the Vg-Id characteristics of the transistor with a channel length L of 3 µm and a channel width W of 50 µm, which is one comparative example sample; FIG. 32B shows the Vg-Id characteristics of the transistor with a channel length L of 6 µm and a channel width W of 50 µm, which is the other comparative example sample.

Note that the drain voltage refers to a potential difference between the source electrode and the drain electrode when the potential of the source electrode is used as a reference potential. The gate voltage refers to a potential difference between the source electrode and the gate electrode when the potential of the source electrode is used as a reference potential. The drain current refers to the value of current flowing between the source electrode and the drain electrode.

According to FIGS. 29A, 29B, 30A, 30B, 31A, 31B, 32A, and 32B, the example sample 1, the example sample 2, and the example sample 3 have smaller variations in threshold voltage than the comparative example sample. In addition, the example sample 1, the example sample 2, and the example sample 3 were each found to be a transistor having a small subthreshold swing value and favorable electrical characteristics.

Next, a positive gate BT test and a negative gate BT test were performed on each of the transistors which are the example sample 1, the example sample 2, the example sample 3, and the comparative example sample in a dark state and a light state. FIGS. 33A, 33B, 34A, 34B, 35A, 35B, 36A, 36B, 37A, 37B, 38A, 38B, 39A, 39B, 40A, and 40B show Vg-Id characteristics of the transistors which are the example sample 1, the example sample 2, the example sample 3, and the comparative example sample measured before and after the gate BT tests. The gate BT tests were performed on the transistors with a channel length L of 6 µm and a channel width W of 50 µm. The Vg-Id characteristics were measured by measurement of drain current Id under the conditions that the drain voltage was 5 V and the gate voltage was swept from −30 V to 30 V.

In the positive gate BT test, first, the substrate temperature was set to 80° C. and first measurement of Vg-Id characteristics was conducted. After that, the transistors were held for 2000 seconds at a gate voltage Vg of 30 V and a drain voltage Vd of 0 V, and then second measurement of Vg-Id characteristics was conducted.

In the negative gate BT test, first, the substrate temperature was set to 80° C. and first measurement of Vg-Id characteristics was conducted. After that, the transistors were held for 2000 seconds at a gate voltage Vg of −30 V and a drain voltage Vd of 0 V, and then second measurement of Vg-Id characteristics was conducted.

Figure 41:
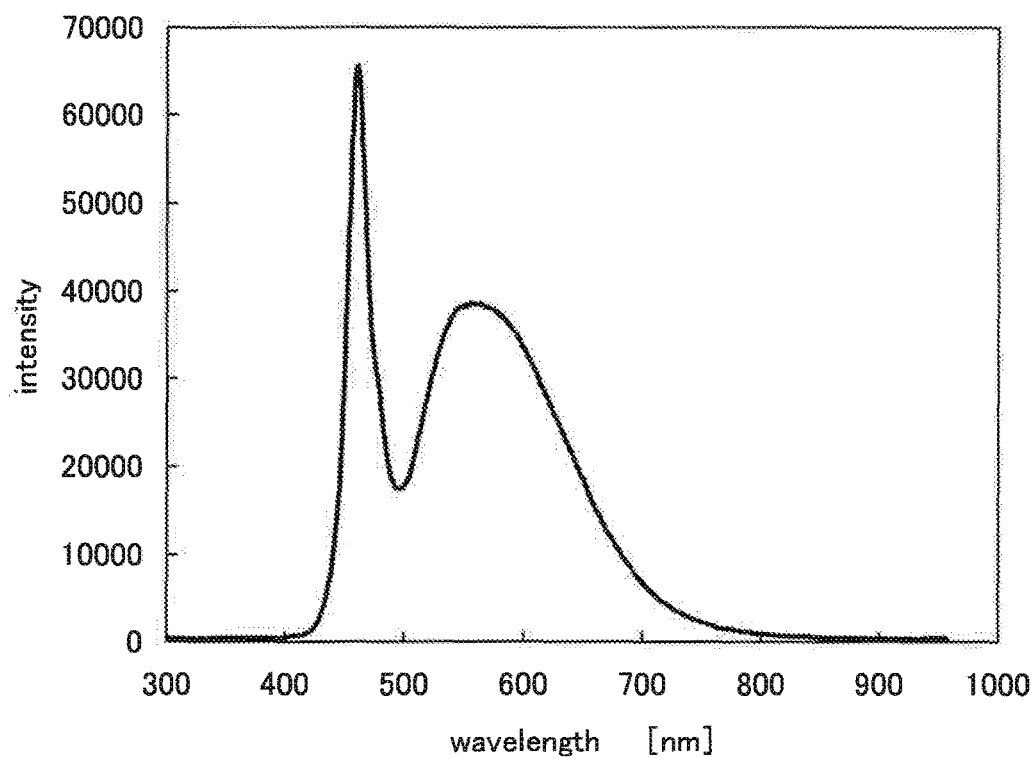
FIG. 41 shows a spectrum of a while LED used in gate BT tests in a light state.

In the dark state, positive or negative BT stress was applied to the gate electrode in a light-blocked state. In the light state, positive or negative BT stress was applied to the gate electrode while the transistor was irradiated with white LED light with 3000 lx. FIG. 41 shows an emission spectrum of the white LED light used in the gate BT test in the light state.

In FIGS. 33A, 33B, 34A, 34B, 35A, 35B, 36A, 36B, 37A, 37B, 38A, 38B, 39A, 39B, 40A, and 40B, the Vg-Id characteristics measured in the first measurement (before the gate BT test) are represented by dashed lines and the Vg-Id characteristics measured in the second measurement (after the gate BT test) are represented by solid lines.

Figure 33A:
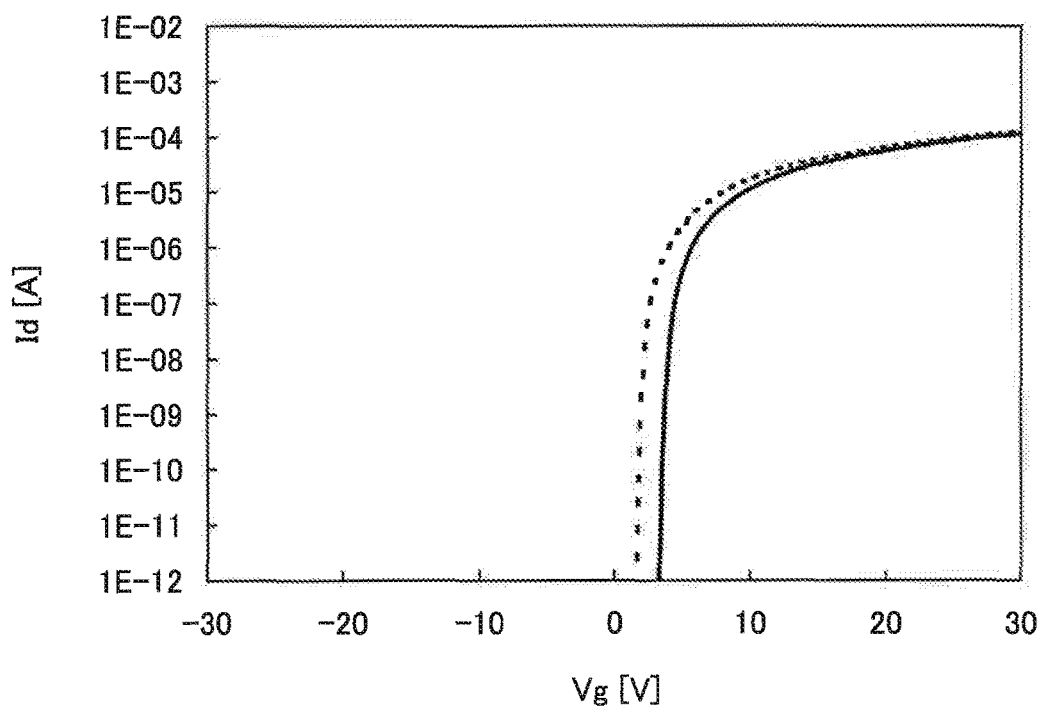
FIGS. 33A and 33B each show Vg-Id characteristics of a transistor measured before and after a gate BT test in a dark state.
Figure 33B:
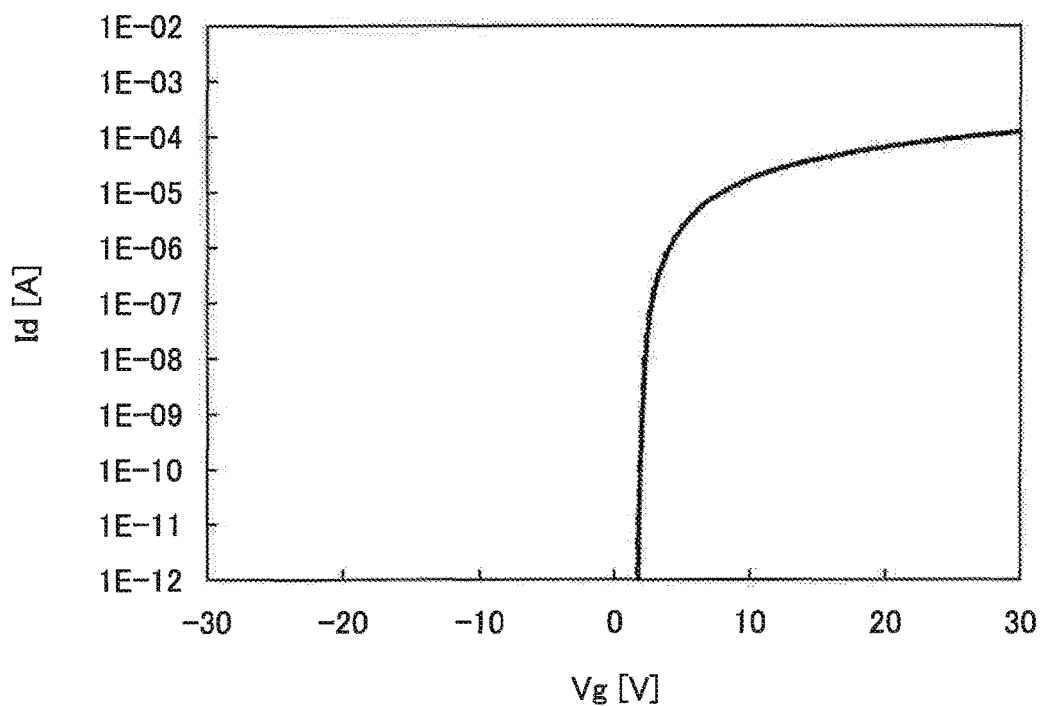
Figure 34A:
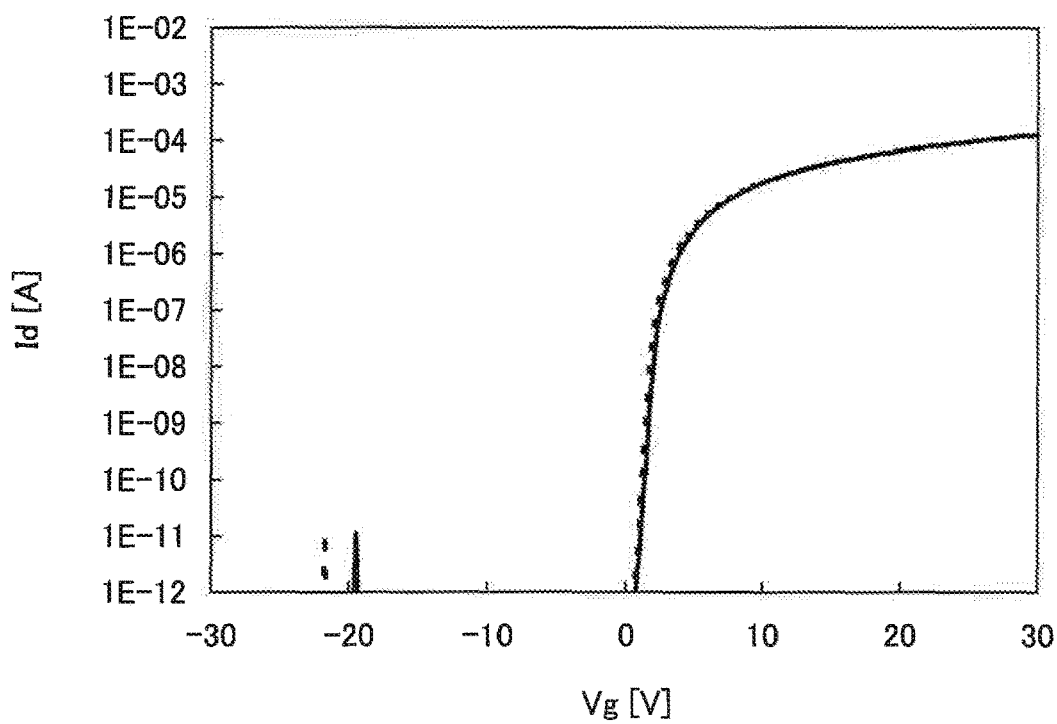
FIGS. 34A and 34B each show Vg-Id characteristics of a transistor measured before and after a gate BT test in a light state.
Figure 34B:
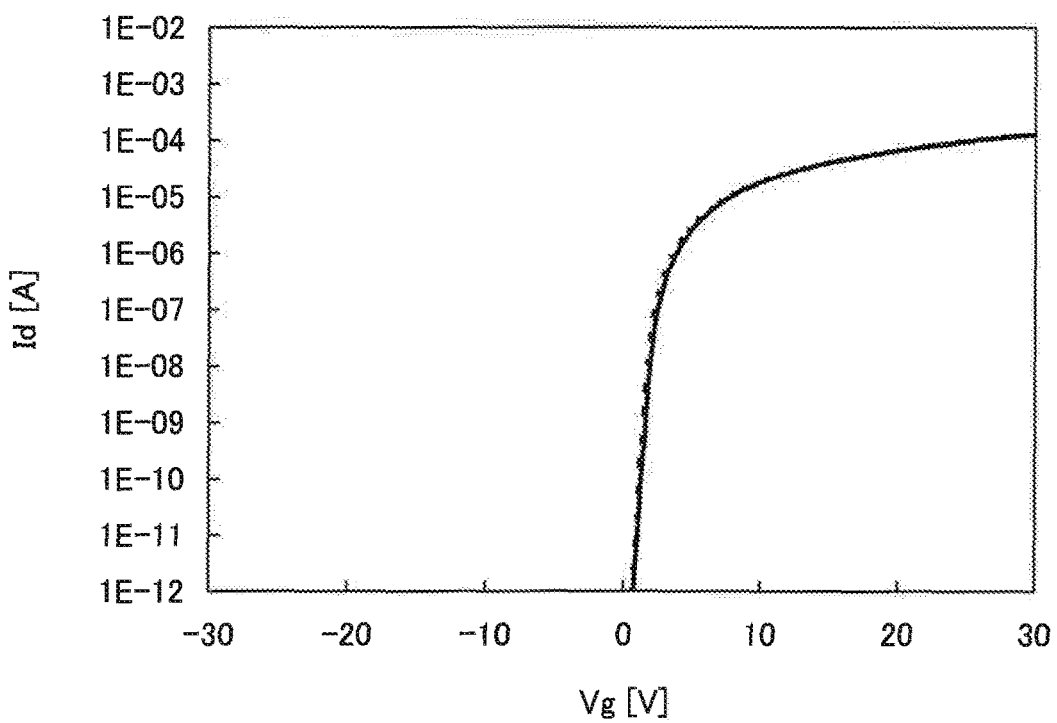
Figure 35A:
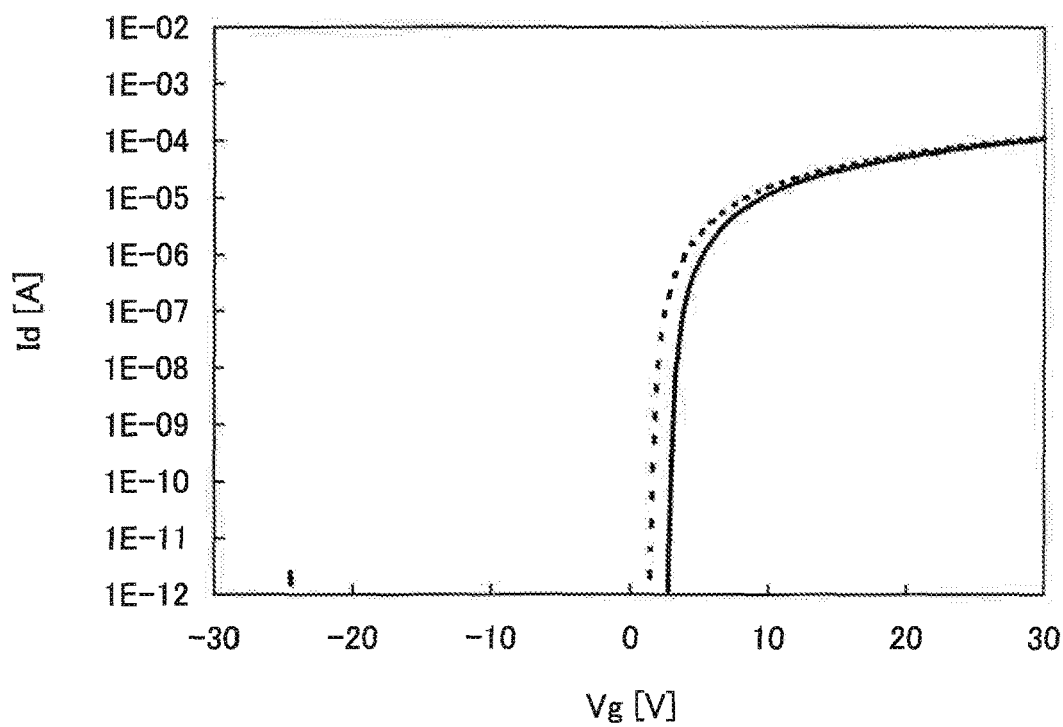
FIGS. 35A and 35B each show Vg-Id characteristics of a transistor measured before and after a gate BT test in a dark state, FIGS. 36A and 36B each show Vg-Id characteristics of a transistor measured before and after a gate BT test in a light state.
Figure 35B:
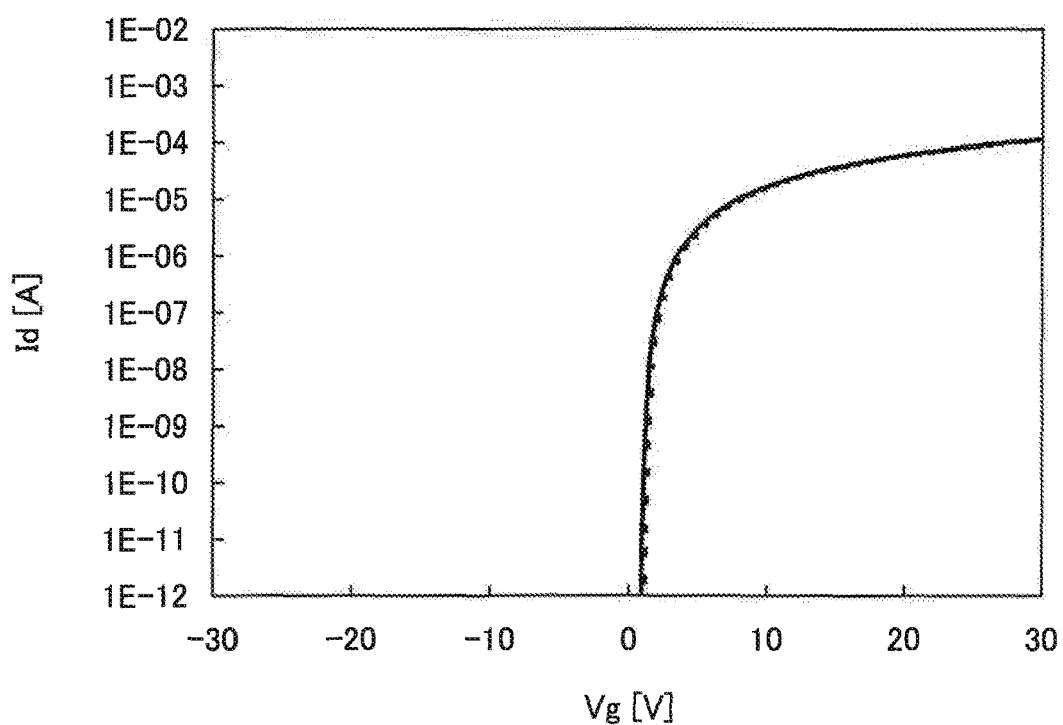
Figure 36A:
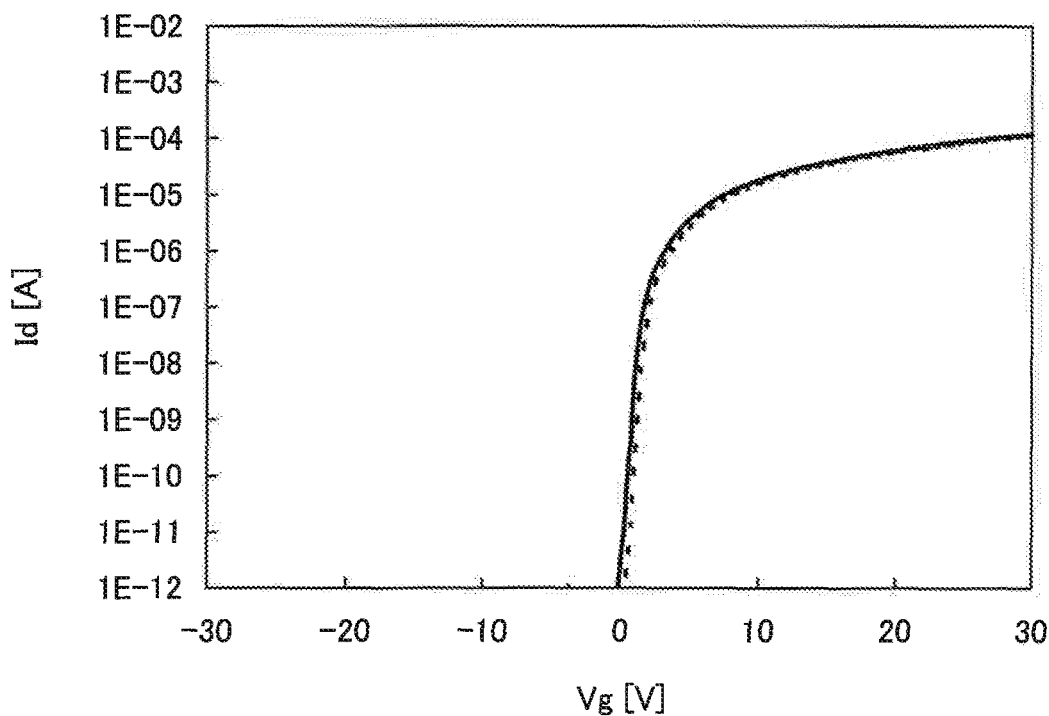
Figure 36B:
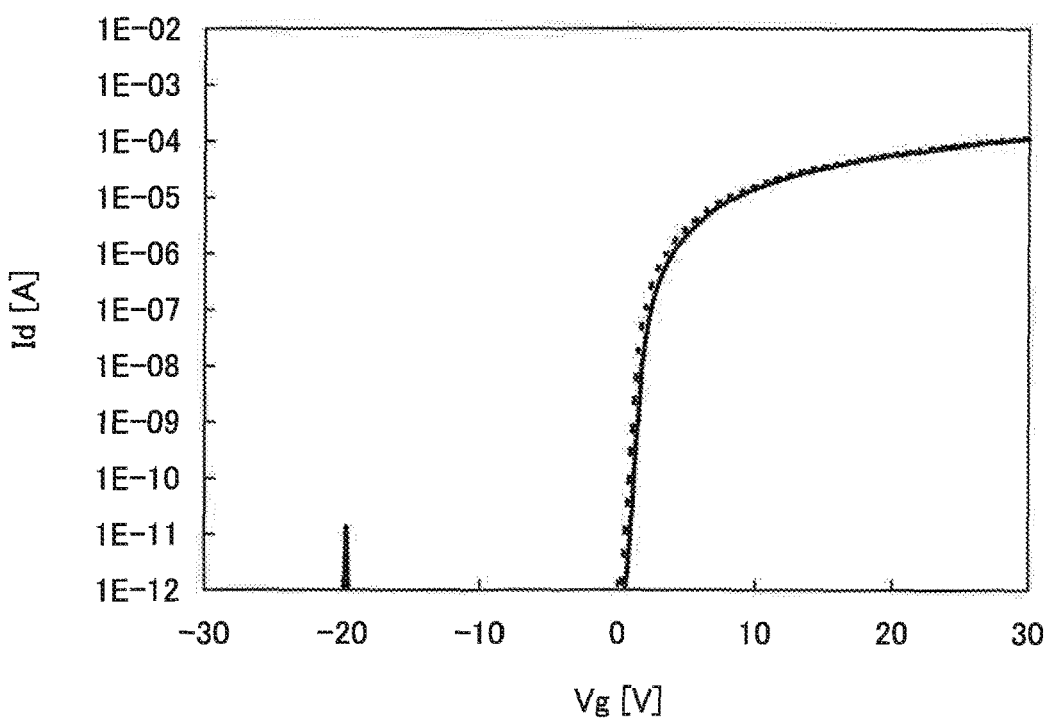
Figure 37A:
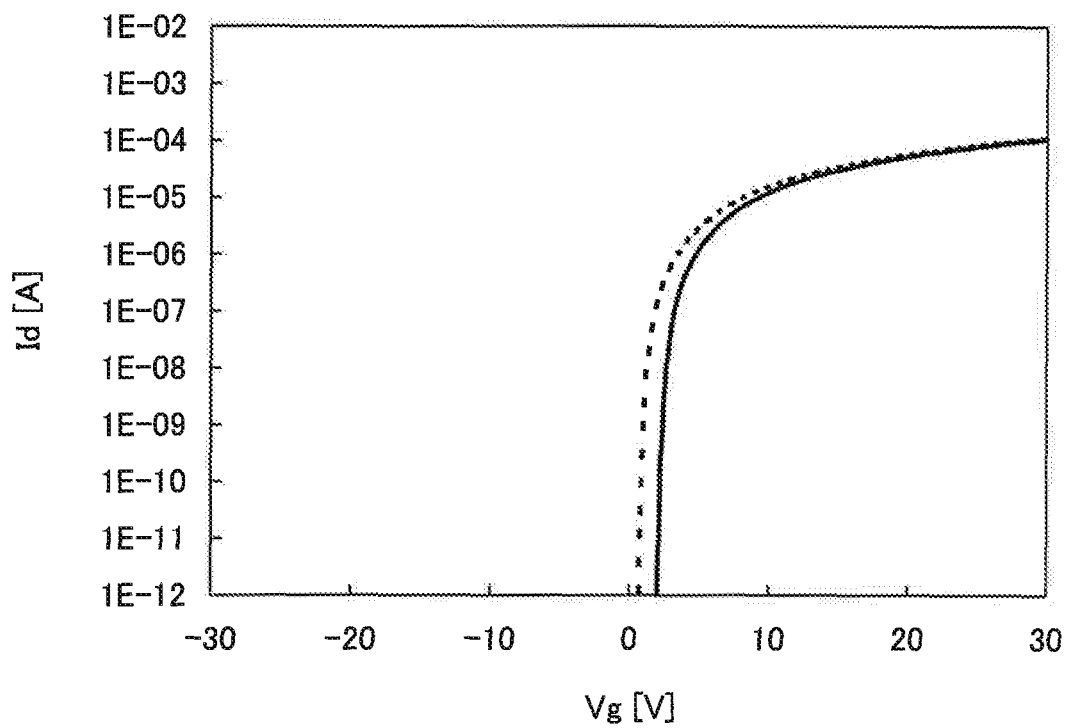
FIGS. 37A and 37B each show Vg-Id characteristics of a transistor measured before and after a gate BT test in a dark state.
Figure 37B:
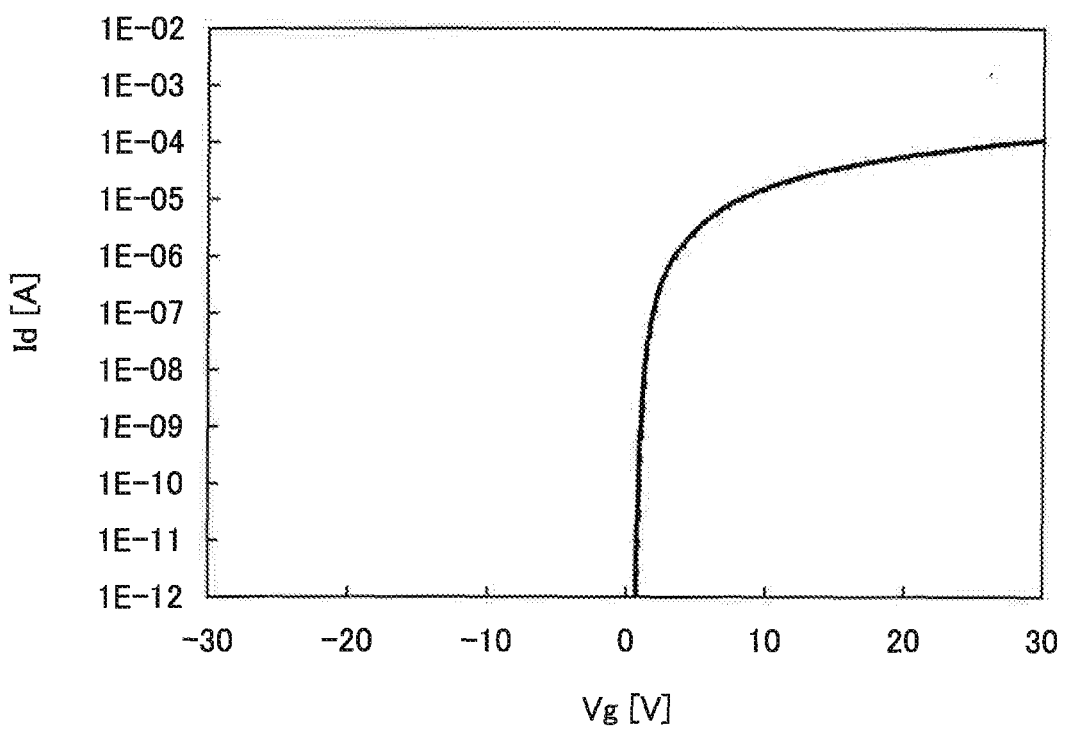
Figure 38A:
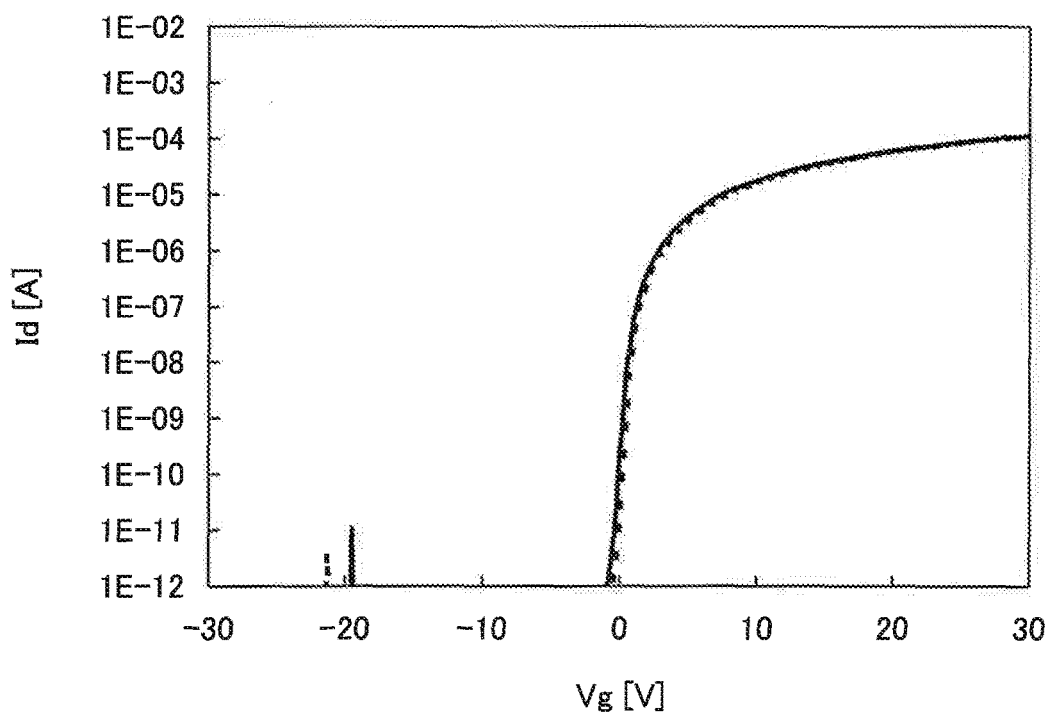
FIGS. 38A and 38B each show Vg-Id characteristics of transistors before and after a gate BT test in a light state.
Figure 38B:
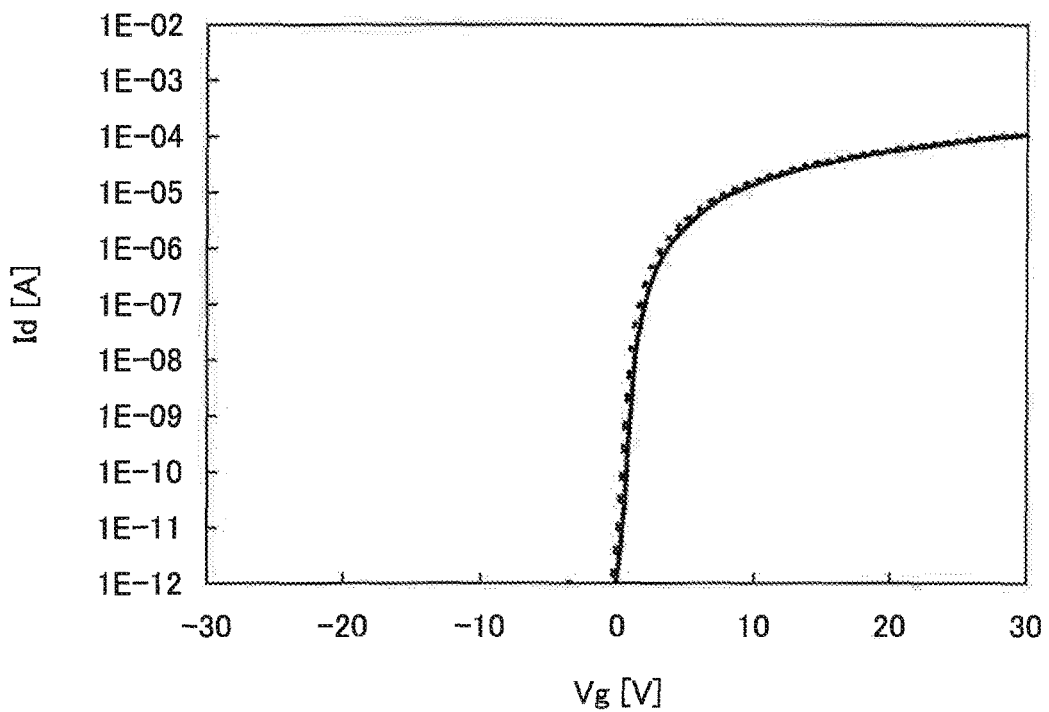
Figure 39A:
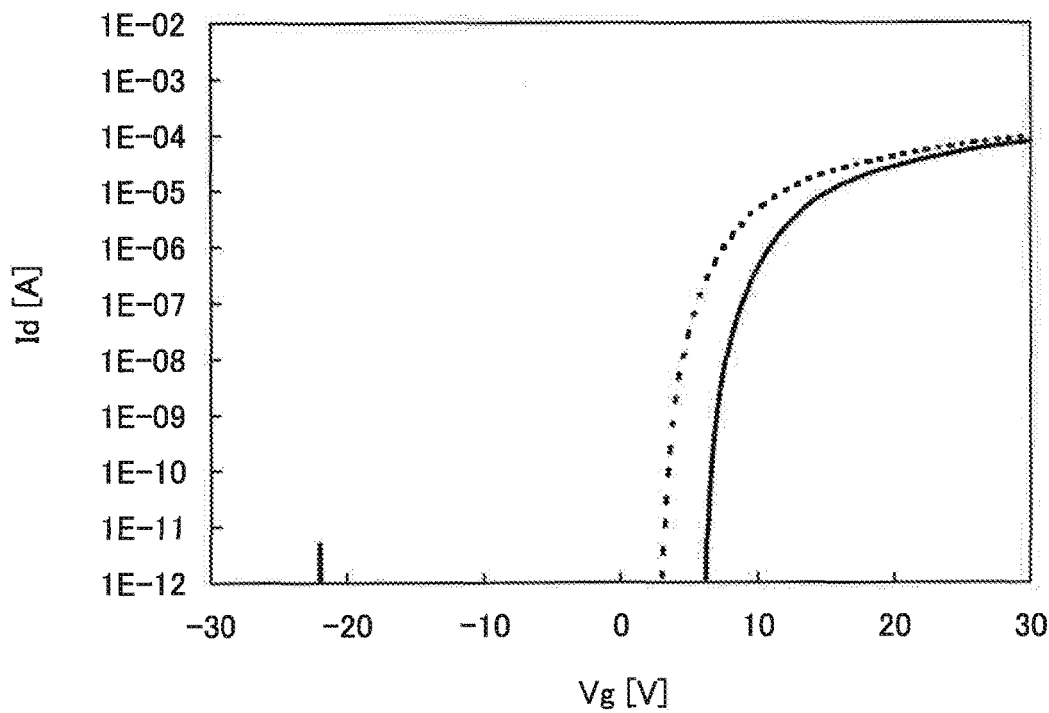
FIGS. 39A and 39B each show Vg-Id characteristics of a transistor measured before and after a gate BT test in a dark state.
Figure 39B:
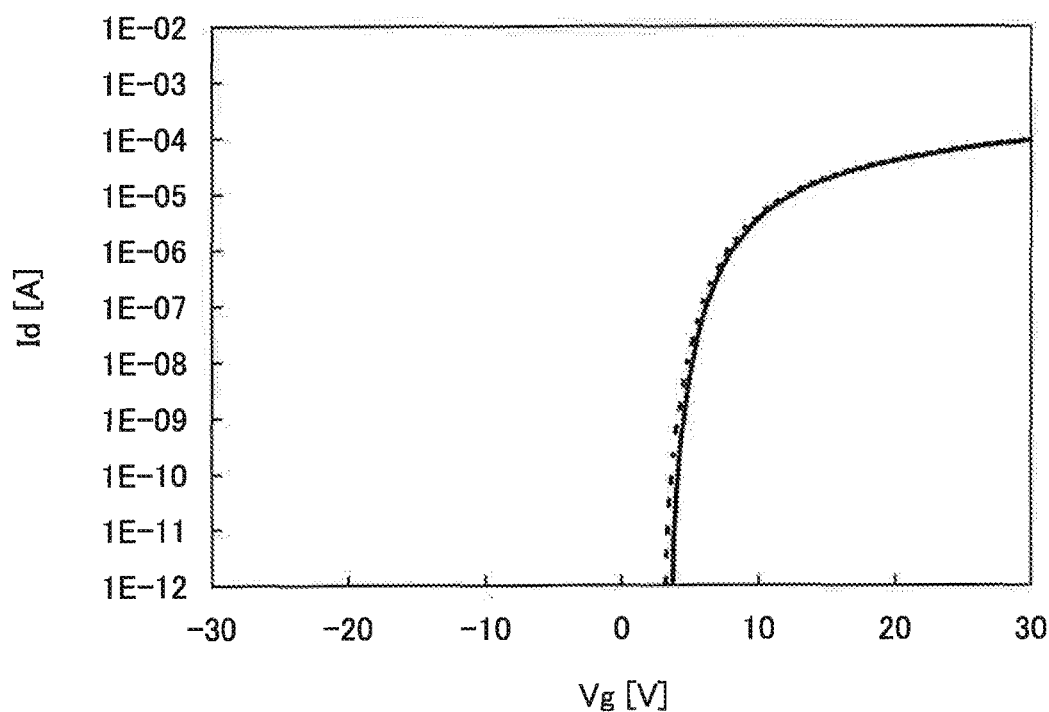
Figure 40A:
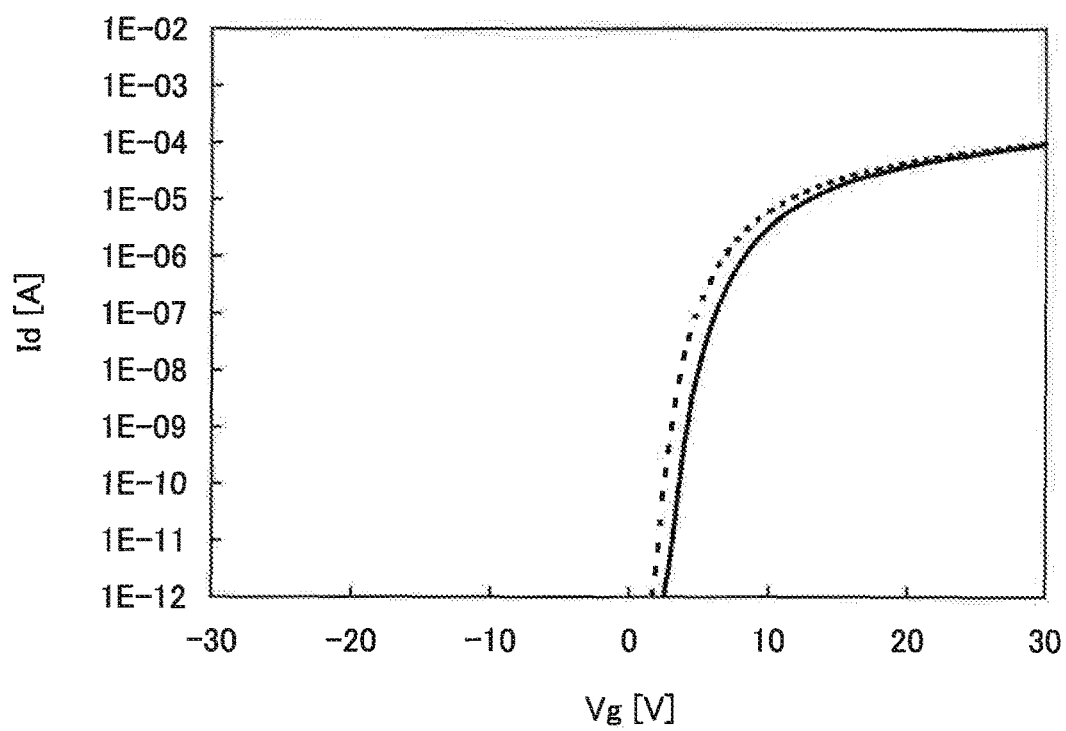
FIGS. 40A and 40B each show Vg-Id characteristics of a transistor measured before and after a gate BT test in a light state.
Figure 40B:
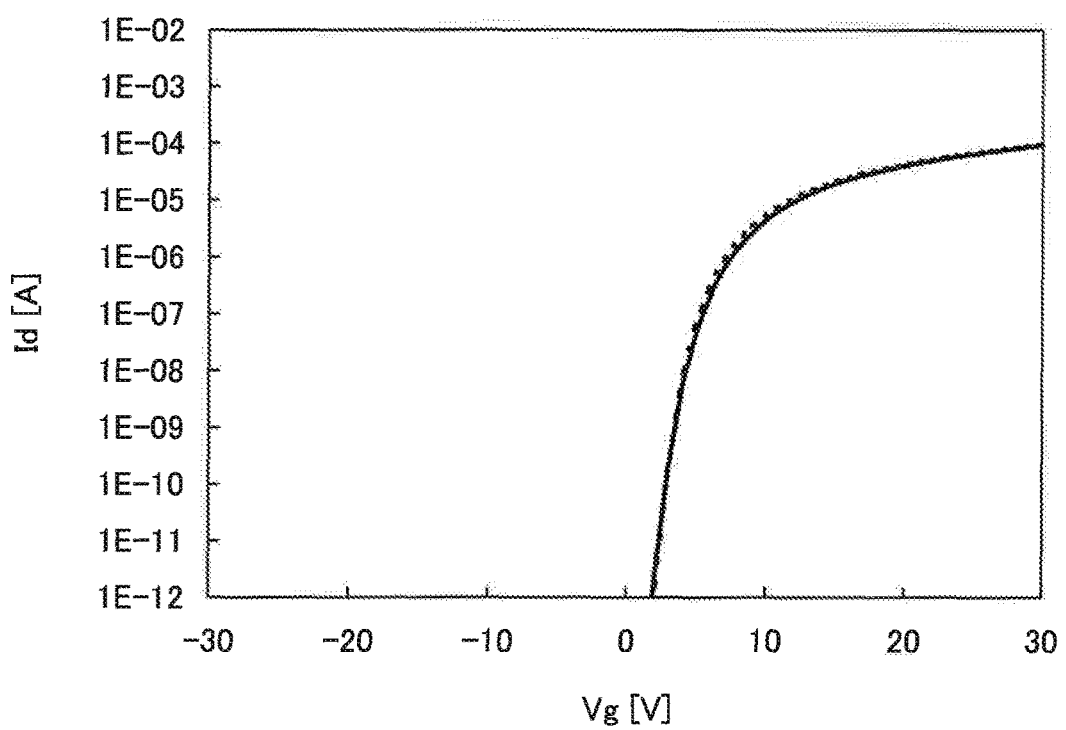

FIG. 33A shows the Vg-Id characteristics measured before and after the positive gate BT test performed on the example sample 1 in the dark state; FIG. 33B shows the Vg-Id characteristics measured before and after the negative gate BT test performed on the example sample 1 in the dark state. FIG. 34A shows the Vg-Id characteristics measured before and after the positive gate BT test performed on the example sample 1 in the light state; FIG. 34B shows the Vg-Id characteristics measured before and after the negative gate BT test performed on the example sample I in the light state. FIG. 35A shows the Vg-Id characteristics measured before and after the positive gate BT test performed on the example sample 2 in the dark state; FIG. 35B shows the Vg-Id characteristics measured before and after the negative gate BT test performed on the example sample 2 in the dark state. FIG. 36A shows the Vg-Id characteristics measured before and after the positive gate BT test performed on the example sample 2 in the light state; FIG. 36B shows the Vg-Id characteristics measured before and after the negative gate BT test performed on the example sample 2 in the light state. FIG. 37A shows the Vg-Id characteristics measured before and after the positive gate BT test performed on the example sample 3 in the dark state; FIG. 37B shows the Vg-Id characteristics measured before and after the negative gate BT test performed on the example sample 3 in the dark state. FIG. 38A shows the Vg-Id characteristics measured before and after the positive gate BT test performed on the example sample 3 in the light state; FIG. 38B shows the Vg-Id characteristics measured before and after the negative gate BT test performed on the example sample 3 in the light state. FIG. 39A shows the Vg-Id characteristics measured before and after the positive gate BT test performed on the comparative example sample in the dark state; FIG. 39B shows the Vg-Id characteristics measured before and after the negative gate BT test performed on the comparative example sample in the dark state. FIG. 40A shows the Vg-Id characteristics measured before and after the positive gate BT test performed on the comparative example sample in the light state; FIG. 40B shows the Vg-Id characteristics measured before and after the negative gate BT test performed on the comparative example sample in the light state.

Figure 42:
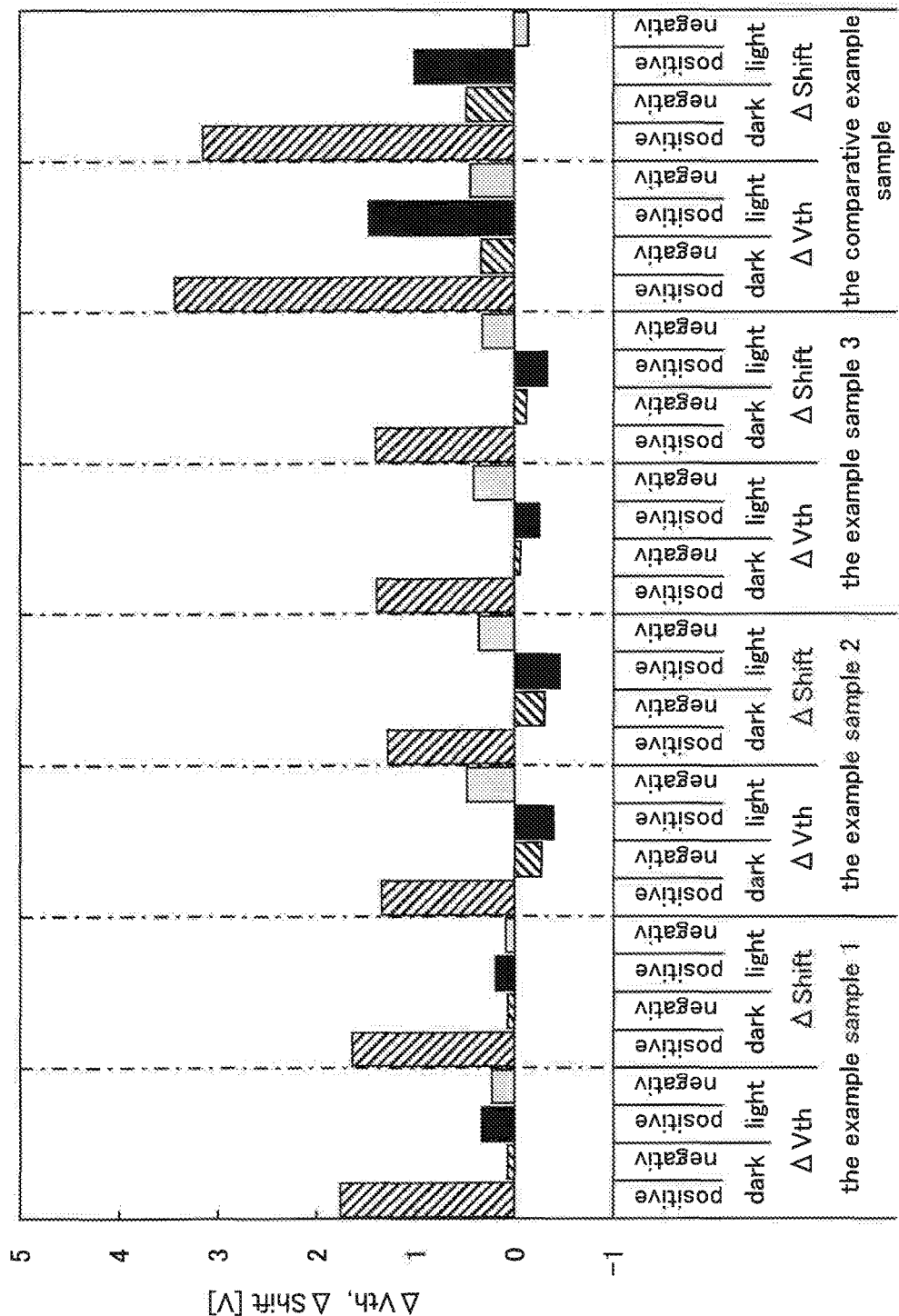
FIG. 42 shows the amount of change in Vg-Id characteristics of transistors measured before and after the gate BT tests.

FIG. 42 shows the amount of change in the threshold voltage ($\Delta$Vth) between before and after the gate BT test performed on each of the example sample 1, the example sample 2, the example sample 3, and the comparative example sample and the amount of change in the gate voltage Vg ($\Delta$Shift) at a drain current Id of $1\times10^{-12}$ A between before and after the gate BT test performed on each of the example sample 1, the example sample 2, the example sample 3, and the comparative example sample.

According to FIG. 42, the example sample 1, the example sample 2, and the example sample 3 each had a smaller amount of change in the threshold voltage between before and after the positive gate BT test and a smaller amount of change in the gate voltage Vg at a drain current Id of $1\times10^{-12}$A between before and after the positive gate BT test than the comparative example sample. In addition, the example sample 1, the example sample 2, and the example sample 3 each also had a small amount of change in the threshold voltage between before and after the negative gate BT test, and the example sample 1, the example sample 2, and the example sample 3 were found to be transistors having stable electrical characteristics.

This example demonstrates that an oxide layer having a large energy gap and a small electron affinity provided over an oxide semiconductor layer can reduce variations in electrical characteristics of a transistor in gate BT tests. Noticeable improvements were seen especially in the positive gate BT tests. Thus, an oxide layer having a large energy gap and a small electron affinity provided over an oxide semiconductor layer enables a transistor having stable electrical characteristics to be achieved.

EXPLANATION OF REFERENCE

70a: film formation chamber, 70b: film formation chamber, 71: atmosphere-side substrate supply chamber, 72a: load lock chamber, 72b: unload lock chamber, 73: transfer chamber, 73a: transfer chamber, 73b: transfer chamber, 74: cassette port, 75: substrate heating chamber, 76: substrate transfer robot, 80a: film formation chamber, 80b: film formation chamber, 80c: film formation chamber, 80d: film formation chamber, 81: atmosphere-side substrate supply chamber, 82: load/unload lock chamber, 83: transfer chamber, 84: cassette port, 85: substrate heating chamber, 86: substrate transfer robot, 87: target, 88: attachment protection plate, 89: glass substrate, 90: substrate stage, 92: substrate stage, 93: heating mechanism, 94: refiner, 95a: cryopump, 95b: cryopump, 95c: turbo molecular pump, 95d: cryopump, 95e: cryopump, 95f: cryopump, 96: vacuum pump, 96a: vacuum pump, 96b: vacuum pump, 96c: vacuum pump, 97: mass flow controller, 98: gas heating mechanism, 99: cryotrap, 100: substrate, 104: gate electrode, 106: multilayer film, 106a: oxide semiconductor layer, 106b: oxide layer, 106c: source region, 106d: drain region, 112: gate insulating film, 116a: source electrode, 116b: drain electrode, 118: protective insulating film, 118a: first silicon oxide layer, 118b: second silicon oxide layer, 118c: silicon nitride layer, 200: substrate, 201: semiconductor substrate, 202: base insulating film, 203: element isolation region, 204: gate electrode, 206: multilayer film, 206a: oxide layer, 206b: oxide semiconductor layer, 207: gate insulating film, 209: gate electrode, 211a: impurity region, 211b: impurity region, 212: gate insulating film, 215: insulating film, 216a: source electrode, 216b: drain electrode, 216c: electrode, 217: insulating film, 218: protective insulating film, 219a: contact plug, 219b: contact plug, 220: insulating film, 221: insulating film, 222: insulating film, 223a: wiring, 223b: wiring, 224: electrode, 225: insulating film, 245: insulating film, 249: wiring, 256: wiring, 260: semiconductor layer, 500: microcomputer, 501: direct-current power source, 502: bus line, 503: power gate controller, 504: power gate, 505: CPU, 506: volatile memory portion, 507: nonvolatile memory portion, 508: interface, 509: sensor portion, 511: optical sensor, 512: amplifier, 513: AD converter, 514: photoelectric conversion element, 517: transistor, 519: transistor, 530: light-emitting element, 700: substrate, 719: light-emitting element, 720: insulating film, 721: insulating film, 731: terminal, 732: FPC, 733a: wiring, 733b: wiring, 733c: wiring, 734: sealant, 735: driver circuit, 736: driver circuit, 737: pixel, 741: transistor, 742: capacitor, 743: switching element, 744: signal line, 750: pixel, 751: transistor, 752: capacitor, 753: liquid crystal element, 754: scan line, 755: signal line, 781: electrode, 782: light-emitting layer, 783: electrode, 784: partition, 785a: intermediate layer, 785b: intermediate layer, 785c: intermediate layer, 785d: intermediate layer, 786a: light-emitting layer, 786b: light-emitting layer, 786c: light-emitting layer, 791: electrode, 792: insulating film, 793: liquid crystal layer, 794: insulating film, 795: spacer, 796: electrode, 797: substrate, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197:

register controller, 1198: bus interface, 1199: ROM, 3100: liquid crystal layer, 3101: substrate, 3102: substrate, 3103: polarizing plate, 3104: polarizing plate, 3105: liquid crystal molecule, 3108: electrode, 3109: electrode, 3109*a*: electrode, 3109*b*: electrode, 3109*c*: electrode, 3150: electrode, 3150*a*: electrode, 3150*b*: electrode, 3150*c*: electrode, 3151: electrode, 3151*a*: electrode, 3151*b*: electrode, 3151*c*: electrode, 3158: protrusion, 3159: protrusion, 3162: insulating film, 3163: insulating film, 8000: television set, 8001: housing, 8002: display portion, 8003: speaker portion, 8100: alarm system, 8101: microcomputer, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric vehicle, 9701: secondary battery, 9702: control circuit, 9703: driving device, and 9704: processing unit.

This application is based on Japanese Patent Application serial no. 2012b-229597 filed with Japan Patent Office on Oct. 17, 2012, the entire contents of which arc hereby incorporated by reference.

The invention claimed is:
1. A semiconductor device comprising:
   a gate electrode;
   a gate insulating film over the gate electrode;
   a multilayer film over the gate insulating film, the multilayer film comprising an oxide layer and an oxide semiconductor layer;
   a source electrode in contact with a top surface of the oxide layer; and
   a drain electrode in contact with the top surface of the oxide layer,
   wherein the oxide layer comprises indium and a metal element,
   wherein the oxide semiconductor layer comprises indium and the metal element,
   wherein an absorption coefficient of the multilayer film measured from a constant photocurrent method is lower than $1\times10^{-3}$ cm$^{-1}$, and
   wherein the oxide layer has a larger energy gap than the oxide semiconductor layer.
2. The semiconductor device according to claim 1, wherein an atomic ratio of the metal element to indium of the oxide layer is 1.5 times or more as large as an atomic ratio of the metal element to indium of the oxide semiconductor layer.
3. The semiconductor device according to claim 1, wherein the energy of the bottom of the conduction band of the oxide layer is closer to the vacuum level than the energy of the bottom of the conduction band of the oxide semiconductor layer by greater than or equal to 0.05 eV and less than or equal to 2 eV.
4. The semiconductor device according to claim 1, wherein the oxide semiconductor layer and the oxide layer further comprise zinc.
5. The semiconductor device according to claim 1, wherein the metal element is one selected from the group consisting of aluminum, silicon, gallium, germanium, yttrium, zirconium, lanthanum, cerium, neodymium, and hafnium.
6. The semiconductor device according to claim 1,
   wherein thickness of the oxide semiconductor layer is greater than or equal to 3 nm and less than or equal to 200 nm, and
   wherein thickness of the oxide layer is greater than or equal to 3 nm and less than or equal to 50 nm.
7. The semiconductor device according to claim 1, wherein the source electrode and the drain electrode comprise copper.
8. The semiconductor device according to claim 1, wherein concentration of copper in the oxide semiconductor layer is lower than $1\times10^{19}$ atoms/cm$^3$.
9. The semiconductor device according to claim 1, wherein the gate insulating film comprises any one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.
10. The semiconductor device according to claim 1, wherein an average film density of the oxide layer is 5.75 g/cm$^3$ to 5.95 g/cm$^3$.
11. A semiconductor device comprising:
    a gate electrode;
    a gate insulating film over the gate electrode;
    a multilayer film over the gate insulating film, the multilayer film comprising an oxide layer and an oxide semiconductor layer;
    a source electrode in contact with a top surface of the oxide layer; and
    a drain electrode in contact with the top surface of the oxide layer,
    wherein the oxide layer comprises indium and a metal element,
    wherein the oxide semiconductor layer comprises indium and the metal element,
    wherein a mixed layer is formed in the multilayer film by moving oxygen between the oxide layer and the oxide semiconductor layer,
    wherein an atomic ratio of the metal element to indium of the oxide layer is 1.5 times or more as large as an atomic ratio of the metal element to indium of the oxide semiconductor layer,
    wherein an atomic ratio of the metal element to indium of the mixed layer is larger than the atomic ratio of the metal element to indium of the oxide semiconductor layer,
    wherein the atomic ratio of the metal element to indium of the mixed layer is smaller than the atomic ratio of the metal element to indium of the oxide layer, and
    wherein an absorption coefficient of the multilayer film measured from a constant photocurrent method is lower than $1\times10^{-3}$ cm$^{-1}$.
12. The semiconductor device according to claim 11, wherein the energy of the bottom of the conduction band of the oxide layer is closer to the vacuum level than the energy of the bottom of the conduction band of the oxide semiconductor layer by greater than or equal to 0.05 eV and less than or equal to 2 eV.
13. The semiconductor device according to claim 11, wherein the oxide semiconductor layer and the oxide layer further comprise indium and zinc.
14. The semiconductor device according to claim 11, wherein the metal element is one selected from the group consisting of aluminum, silicon, gallium, germanium, yttrium, zirconium, lanthanum, cerium, neodymium, and hafnium.
15. The semiconductor device according to claim 11,
    wherein thickness of the oxide semiconductor layer is greater than or equal to 3 nm and less than or equal to 200 nm, and
    wherein thickness of the oxide layer is greater than or equal to 3 nm and less than or equal to 50 nm.

16. The semiconductor device according to claim 11, wherein the source electrode and the drain electrode comprise copper.

17. The semiconductor device according to claim 11, wherein the oxide layer has a larger energy gap than the oxide semiconductor layer.

18. The semiconductor device according to claim 11, wherein concentration of copper in the oxide semiconductor layer is lower than $1 \times 10^{19}$ atoms/cm$^3$.

19. The semiconductor device according to claim 11, wherein the gate insulating film comprises any one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

20. The semiconductor device according to claim 11, wherein the atomic ratio of the metal element to indium of the mixed layer gradually changes in the mixed layer.

21. The semiconductor device according to claim 11, wherein an average film density of the oxide layer is 5.75 g/cm$^3$ to 5.95 g/cm$^3$.

* * * * *